United States Patent
Nguyen et al.

(10) Patent No.: US 10,751,951 B1
(45) Date of Patent: Aug. 25, 2020

(54) 3-D PRINTED MATERIALS, STRUCTURES AND PROCESSES

(71) Applicants: Tai Dung Nguyen, Fremont, CA (US); Tue Nguyen, Fremont, CA (US)

(72) Inventors: Tai Dung Nguyen, Fremont, CA (US); Tue Nguyen, Fremont, CA (US)

( * ) Notice: Subject to any disclaimer, the term of this patent is extended or adjusted under 35 U.S.C. 154(b) by 1459 days.

(21) Appl. No.: 14/537,920

(22) Filed: Nov. 11, 2014

Related U.S. Application Data

(60) Provisional application No. 61/902,767, filed on Nov. 11, 2013, provisional application No. 62/014,700, filed on Jun. 20, 2014.

(51) Int. Cl.
| | | |
|---|---|---|
| *B33Y 10/00* | (2015.01) | |
| *B29C 64/10* | (2017.01) | |
| *B29C 64/182* | (2017.01) | |
| *B29C 64/393* | (2017.01) | |
| *B81C 3/00* | (2006.01) | |
| *B29C 67/00* | (2017.01) | |

(52) U.S. Cl.
CPC .......... *B29C 67/0081* (2013.01); *B29C 64/10* (2017.08); *B29C 64/182* (2017.08); *B29C 64/393* (2017.08); *B33Y 10/00* (2014.12); *B81C 3/00* (2013.01); *B81C 2201/01* (2013.01)

(58) Field of Classification Search
None
See application file for complete search history.

(56) References Cited

U.S. PATENT DOCUMENTS

| | | | | |
|---|---|---|---|---|
| 5,460,758 | A * | 10/1995 | Langer | G03F 7/0037 118/429 |
| 5,818,005 | A * | 10/1998 | Pratt | B23H 1/04 219/69.15 |
| 5,824,250 | A * | 10/1998 | Whalen | C04B 35/622 264/219 |
| 2002/0084545 | A1* | 7/2002 | Doi | B29C 45/34 264/102 |
| 2003/0186042 | A1* | 10/2003 | Dunlap | B29C 39/24 428/304.4 |
| 2005/0177261 | A1* | 8/2005 | Durbin | A61C 13/0004 700/98 |
| 2008/0169585 | A1* | 7/2008 | Zinniel | B29C 71/0009 264/401 |
| 2011/0123794 | A1* | 5/2011 | Hiller | B29C 67/0059 428/221 |

* cited by examiner

*Primary Examiner* — Jeffrey M Wollschlager
*Assistant Examiner* — Armand Melendez
(74) *Attorney, Agent, or Firm* — Tue Nguyen

(57) ABSTRACT

Molds including 3D printed components can be used to cast objects. A model of the object can be separated into multiple components, with each component not having non-printable overhang structures, thus allowing the components to be directly printed without support structures. Shell models and shell molds, e.g., molds with hollow interior, can be used for cost effectiveness. The surface of the printed object can be smoothened, for example, by solvent vapor (such as acetone for plastic), by sanding, or by a smooth coating. The object can be combinatorially cast.

16 Claims, 48 Drawing Sheets

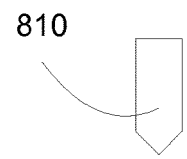
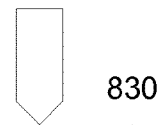
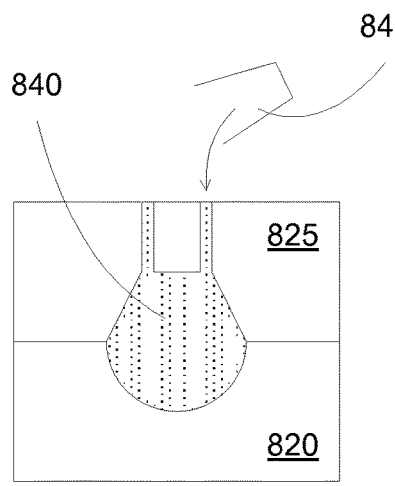
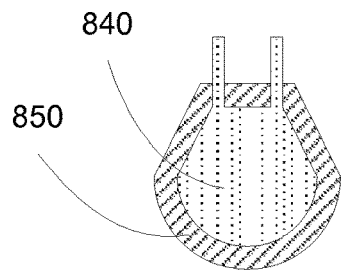
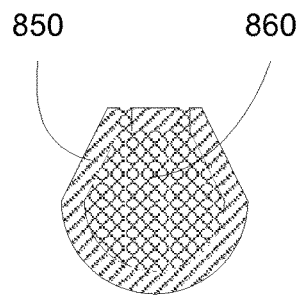
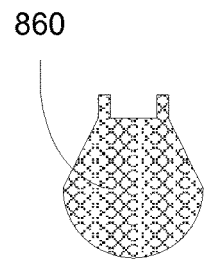
*Fig. 8A*  *Fig. 8B*  *Fig. 8C*  *Fig. 8D*  *Fig. 8E*  *Fig. 8F*

Printing a porous structure, wherein the porous structure comprises interconnect branches
2200

FIG. 22A

Printing a porous structure, wherein the porous structure has one or more outer solid walls, wherein the porous structure comprises interconnect branches
2210

Fig. 22B

Printing a porous structure, wherein the porous structure is surrounded by all sides by outer solid wall, wherein the porous structure comprises interconnect branches
2220

Fig. 22C

Printing a porous structure, wherein the porous structure is surrounded by all sides by outer solid wall, wherein the porous structure comprises interconnect branches
2230

Pumping gas from the porous structure to create vacuum in the porous structure
2240

Sealing the pump port to create a porous structure having inside vacuum
2250

Fig. 22D

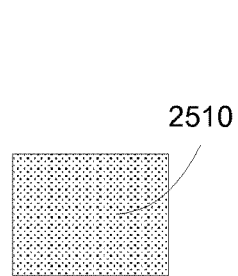
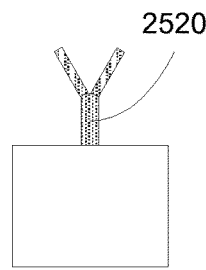
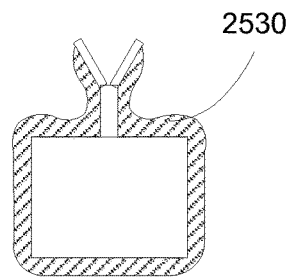
FIG. 25A  FIG. 25B  FIG. 25C
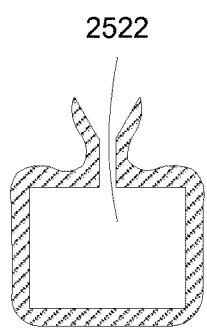
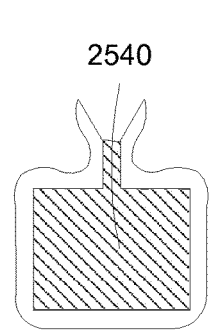
FIG. 25D  FIG. 25E
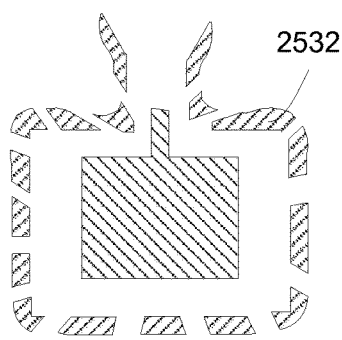
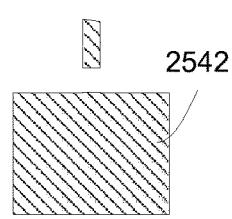
FIG. 25F  FIG. 25G

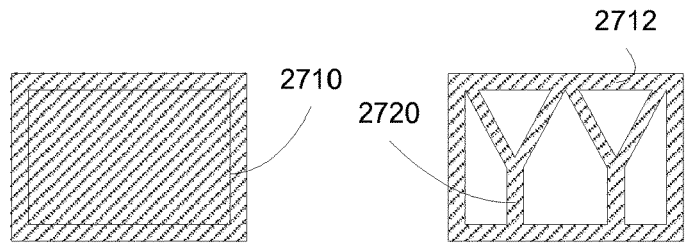

FIG. 27A  FIG. 27B

Generating a shell model of an object, wherein the shell model comprises shell walls, wherein the model comprises close cavities, wherein the model optionally comprises support structures
2780

FIG. 27C

3D printing a model, wherein the model comprises shell walls, wherein the model comprises close cavities, wherein the model optionally comprises support structures
2790

Casting a part using the shell model
2791

FIG. 27D

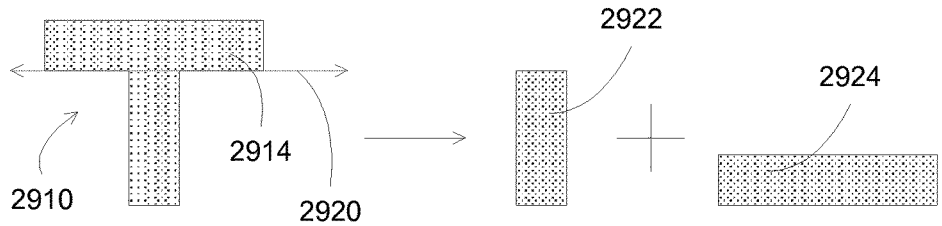

Generating a model of an object, wherein the model comprises multiple components, wherein the multiple components are configured to be 3D printed without support structures
2980

Splitting a first model of an object into multiple components, wherein the multiple components are configured to be 3D printed without support structures, or wherein the multiple components does not comprise protrusions having slant angles that prevent 3D printing without support structures
2990

↓

3D printing the multiple components
2991

↓

Assembling the multiple components into a second model of the object
2992

↓

Casting a part using the second model
2993

FIG. 29C

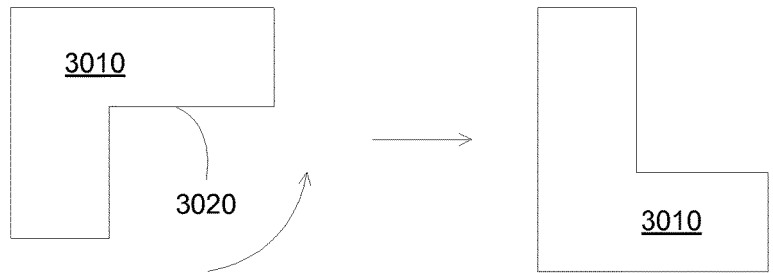
FIG. 30A
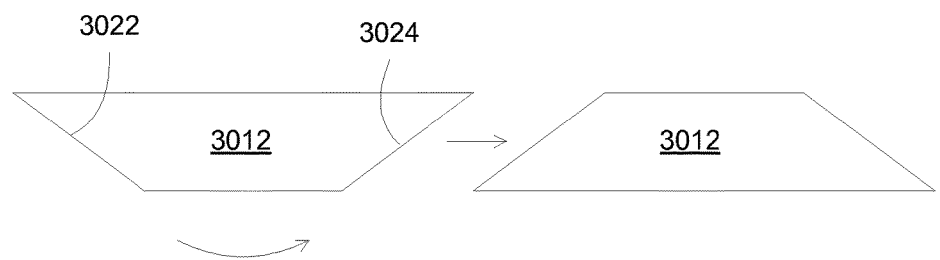
FIG. 30B
Rotating a model to reduce or minimize overhang features
3090
FIG. 30C

Rotating the model to reduce or minimize overhang features
3190

Optionally separate the model along a horizontal plane
3191

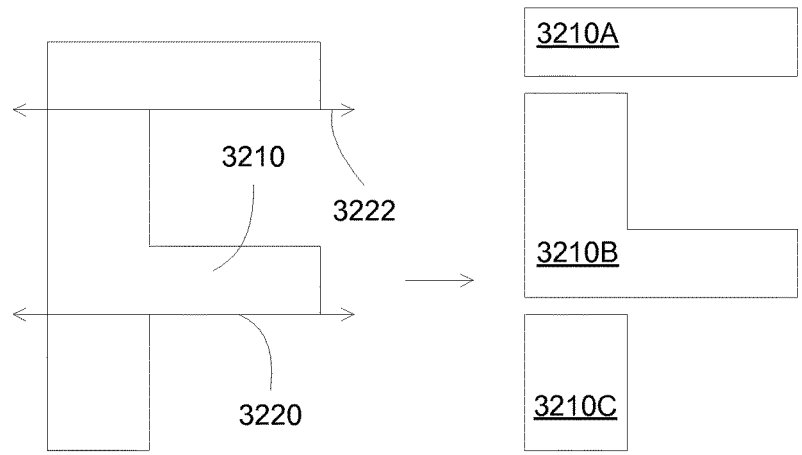
FIG. 32A
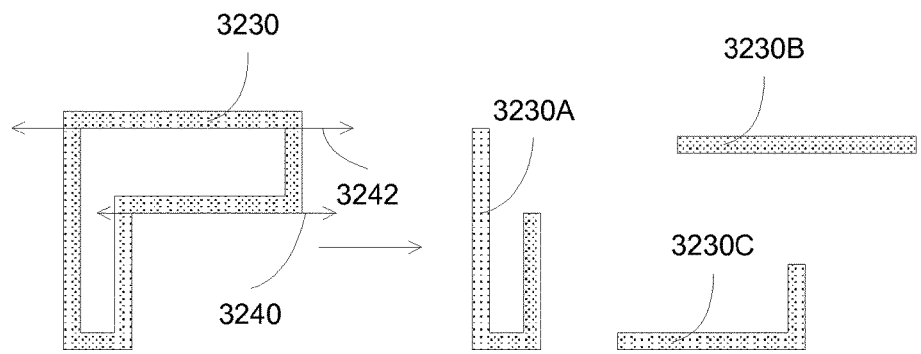
FIG. 32B
Separating the model into multiple components, wherein at least a first component has no overhang feature
3290
FIG. 32C

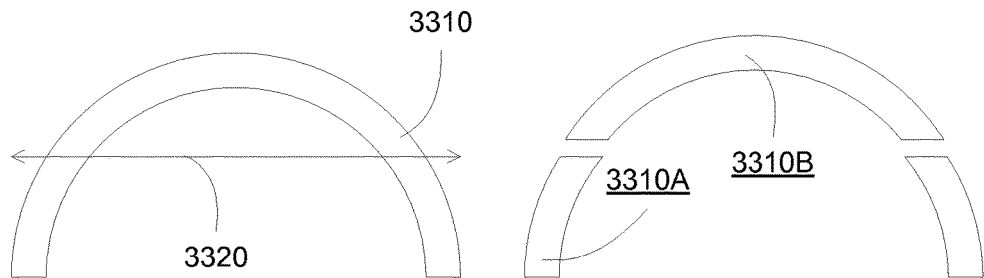
*FIG. 33A*
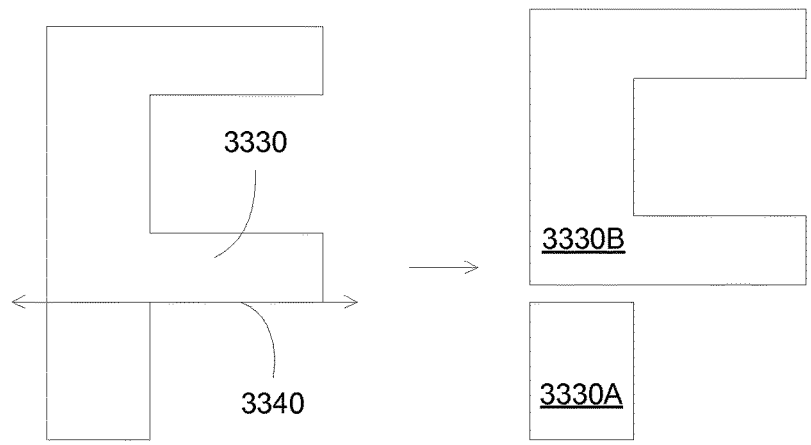
*FIG. 33B*
| Separating the model into multiple components, wherein a first component has no overhang feature, wherein a second component has an overhang feature 3390 |
|---|
*FIG. 33C*

Separating the model into multiple components, wherein a first component has no overhang feature, wherein a second component has an overhang feature
3490

Rotating the second component to reduce or minimize overhang features
3491

Separating the model into multiple components, wherein a first component has no overhang feature, wherein a second component has an overhang feature
3590

Rotating the second component to reduce or minimize overhang features
3591

Optionally separating the model along a horizontal plane
3592

Separating the model into multiple components, wherein a first component has no overhang feature, wherein a second component has an overhang feature, wherein the separation is performed on a range of cut angles
3690

Rotating the second component to reduce or minimize overhang features
3691

Optionally selecting a cut angle to reduce or minimize overhang features
3692

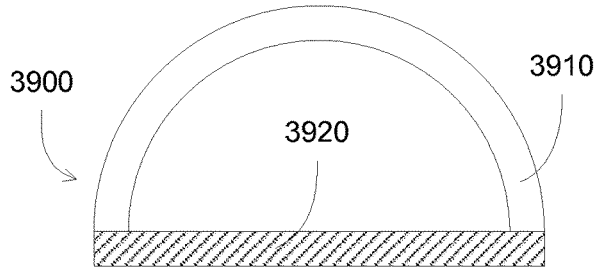

FIG. 39A

```
Separating the model into multiple components, wherein a
first component is configured for 3D printing, wherein a
second component is configured for non-3D printing
                         3980
```

FIG. 39B

```
          3D printing a first component of a model
                          3990
                            ↓
Assembling the first component with a second component,
        wherein the second component is not 3D printed
                          3991
                            ↓
     Casting an object using the assembled components
                          3992
```

FIG. 39C

Forming mating structures on two components, wherein the mating structures are configured to provide alignment for the two components when assembled together
4100

FIG. 41A

Providing two components of a model, wherein the two components are configured to be assembled together, wherein the two components each comprises a surface facing each other when assembled
4120

Forming mating structures on the two components, wherein the mating structures are disposed on the surface, wherein the mating structures are configured to provide alignment for the two components
4130

3D printing the two components with the mating structures
4140

FIG. 41B

Adding materials to end portions of two adjacent components to increase a contact surface between the two adjacent components
4400

FIG. 44A

Adding materials to end portions of two adjacent components to increase a contact surface between the two adjacent components
4420

Forming mating structures on the contact surface of the two adjacent components
4430

FIG. 44B

Providing two components of a model, wherein the two components are configured to be assembled together, wherein the two components each comprises a surface facing each other when assembled
4450

Adding materials to end portions of the two adjacent components to increase a contact surface between the two adjacent components for allowing forming mating structures
4460

3D printing the two components with the increase contact surface and the mating structures
4470

FIG. 44C

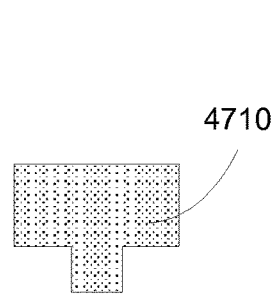
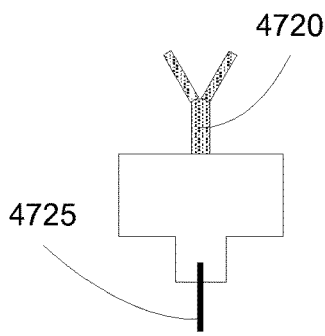
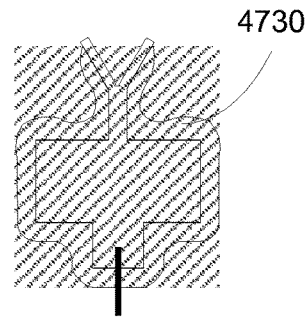
FIG. 47A    FIG. 47B    FIG. 47C
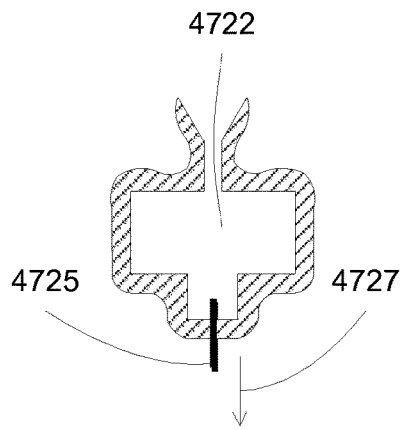
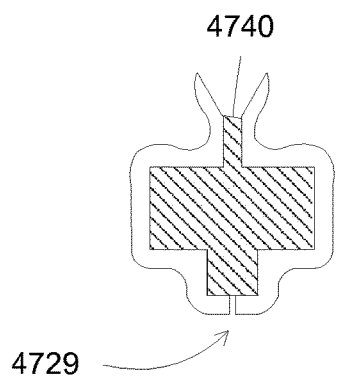
FIG. 47D    FIG. 47E
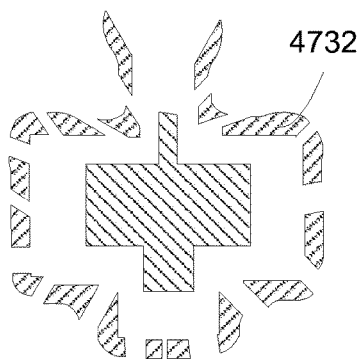
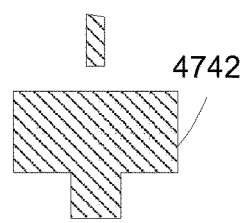
FIG. 47F    FIG. 47G

3-D PRINTED MATERIALS, STRUCTURES AND PROCESSES

The present application claims priority from U.S. Provisional Patent Application Ser. No. 61/902,767, filed on Nov. 11, 2013 entitled: "3-D printed materials, structures and processes" and U.S. Provisional Patent Application Ser. No. 62/014,700, filed on Jun. 20, 2014, entitled: "Methods and systems for 3D printing" all of which are incorporated herein by reference.

BACKGROUND

3-D printing technology can build structures layer by layer, adding materials where needed. Thus 3-D printing process is called an additive process, and can produce structures that cannot be fabricated by a subtraction process. Similar to subtraction processes, 3-D printing process is a customized process, meaning each part is individually printed and can be individually modified. Thus a mass production of 3-D printed objects can be time consuming and costly.

There is a need for improving 3-D printed materials, structures, and processes.

SUMMARY OF THE DESCRIPTION

In some embodiments, the present invention discloses methods and systems for 3D printing. Sacrificial materials can be used in support structures. Print nozzles with different sizes of orifice can offer trade off between high resolution and faster throughput. A flexible platform can reduce support components.

In some embodiments, the present invention discloses methods and systems for casting objects after being 3D printed. A shell image of the object can be printed, and then reinforced with a hardenable material to form a mold. The casting process can use a dissolvable coating material, which can be dissolved in a chemical liquid after the object is cast. Objects having porous walls can be printed to obtain high thermal insulating property. Shell models and shell molds, e.g., molds with hollow interior, can be used for cost effectiveness. A model of the object can be separated into multiple components with each component allowing direct 3D printing. The surface of the printed object can be smoothened, for example, by solvent vapor (such as acetone for plastic), by sanding, or by a smooth coating. The object can be combinatorially cast.

BRIEF DESCRIPTION OF THE DRAWINGS

FIGS. 8A-8F illustrate a casting process using printed negative mold according to some embodiments.

FIGS. 22A-22D illustrate flow charts for 3-D printing porous structures according to some embodiments.

FIGS. 25A-25G illustrate an investment casting process using a 3D printed mold according to some embodiments.

FIGS. 27A-27D illustrate shell representations according to some embodiments.

FIGS. 29A-29C illustrate model separation processes according to some embodiments.

FIGS. 30A-30C illustrate examples of object rotations according to some embodiments.

FIGS. 32A-32C illustrate examples of object separations according to some embodiments.

FIGS. 33A-33C illustrate examples of object separations according to some embodiments.

FIGS. 39A-39C illustrate models and casting processes for multiple components according to some embodiments.

FIGS. 41A-41B illustrate flow charts for mating processes of multiple component models or objects according to some embodiments.

FIGS. 44A-44C illustrate flow charts for assembling multiple components according to some embodiments.

FIGS. 47A-47G illustrate an investment casting process using a 3D printed mold according to some embodiments.

DETAILED DESCRIPTION OF THE EMBODIMENTS

In some embodiments, the present invention discloses methods and systems for building structures having overhang. A sacrificial layer can be formed as a support for the overhang of the printed structure. The sacrificial layer can be removed after completion.

In some embodiments, the sacrificial layer can be removed by a thermal process. For example, the material of the sacrificial layer can have a lower melting or a lower softening or reflow temperature as compared to the structure material. A thermal process can be used to remove the sacrificial layer after the structure is printed.

In some embodiments, the structure materials can include metal, such as aluminum, steel or stainless steel. The sacrificial materials can include polymer or plastic. The structure materials can include high temperature polymer or plastic. The sacrificial materials can include polymer or plastic having lower melting temperature. The structure materials can include polymer or plastic. The sacrificial materials can include wax.

In some embodiments, the sacrificial layer can be removed by a chemical process. For example, the material of the sacrificial layer can be dissolved in a solvent. The material can be soluble in the solvent. The material can include particles bonded by a glue, which can be dissolved in the solvent. A wet process can be used to remove the sacrificial layer after the structure is printed.

In some embodiments, the structure materials can include non-soluble materials such as metal or polymer or plastic. The sacrificial materials can include particles bonded by a water-soluble glue or by a solvent-soluble glue. The sacrificial materials can include sodium chloride containing materials, which can be soluble in water.

In some embodiments, the 3-D printer can have two nozzles. A first nozzle is configured to deliver, e.g., print, the structure material. A second nozzle is configured to print the sacrificial material. The nozzles are printing in parallel or in sequence, with the sacrificial layer can serve as a foundation to print an overhang feature of the printed structure. The nozzles can be independently controlled.

In some embodiments, the sacrificial layer can form solid layer, e.g., filling the space otherwise not occupy by the structure layer. Alternatively, the sacrificial layer can be selective, e.g., printed only in needed support locations. For example, the sacrificial layer can have acceptable overhang configurations, e.g., the overhang structures that supported by the 3-D printing process. Alternatively, the sacrificial layer can be porous, e.g., having interconnects to form the support without filling all the space. The sacrificial material can include materials that can be dissolved in a chemical liquid, such as salt-based core dissolvable in water, or plaster (e.g., calcium sulfate) dissolvable in low base solution such as sodium bicarbonate solution.

Figure 1A:
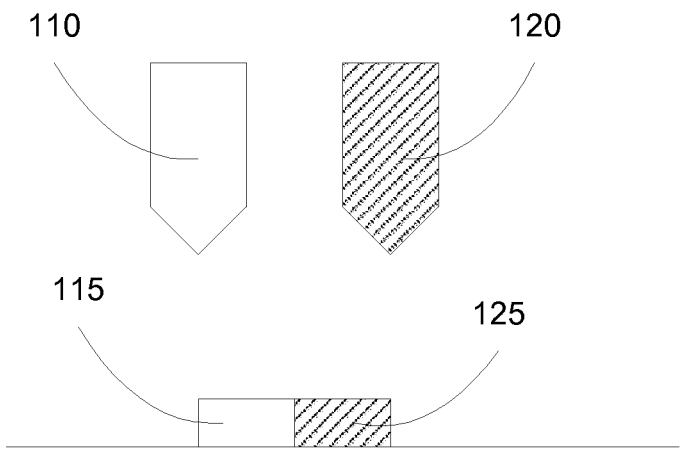
FIGS. 1A-1C illustrate a 3-D printing process with sacrificial layer according to some embodiments.
Figure 1B:
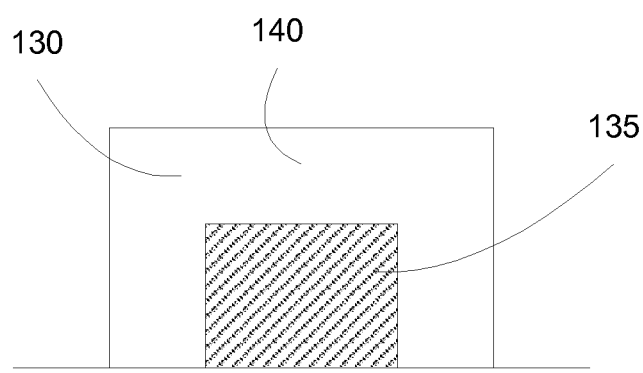
Figure 1C:
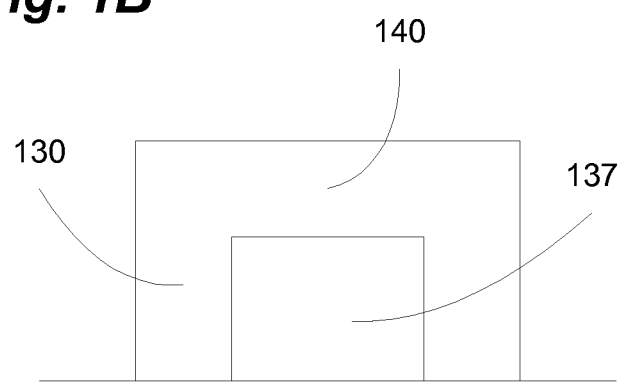

FIGS. 1A-1C illustrate a 3-D printing process with sacrificial layer according to some embodiments. In FIG. 1A, a 3-D printer can include nozzle 110 and nozzle 120. Nozzle 110 can be configured to print material 115, such as a permanent material for the printed structure. Nozzle 120 can be configured to print material 125, such as a sacrificial material, for providing support to the printed structure, such as support for overhang features of the printed structure. Other components of the 3-D printer can be included, such as linear x-y table, z-table movement, and controller for guiding the nozzles.

FIG. 1B shows a structure printed by nozzles 110 and 120. Permanent material 130 can form the printed structure having an overhang 140. Sacrificial material 135 can be printed under the overhang to provide support for the overhang. FIG. 1C shows the printed structure after the sacrificial material is removed. Overhang 140 can be disposed on void area 137, which can be difficult to print without the sacrificial layer 135.

Figure 2A:
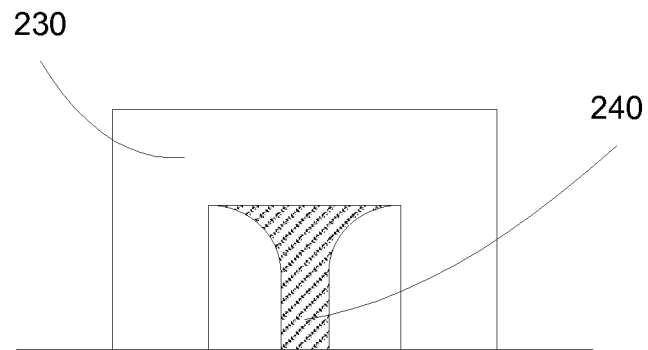
FIGS. 2A-2B illustrate alternative sacrificial layer configurations according to some embodiments.
Figure 2B:
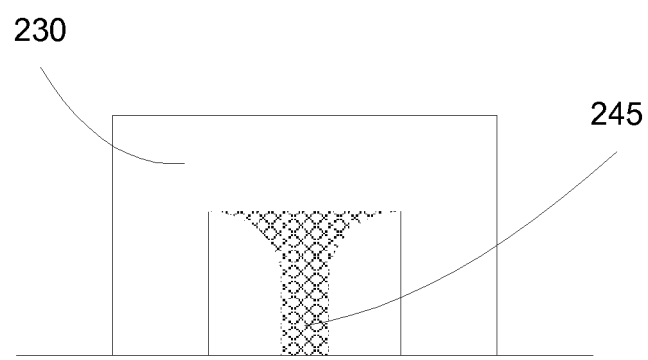

FIGS. 2A-2B illustrate alternative sacrificial layer configurations according to some embodiments. In FIG. 2A, flared out support column 240 can be used to provide support for the overhang 230, instead of a solid support. In FIG. 2B, porous support column 245 can be used. Alternatively, porous solid support can also be used.

Figure 3A:
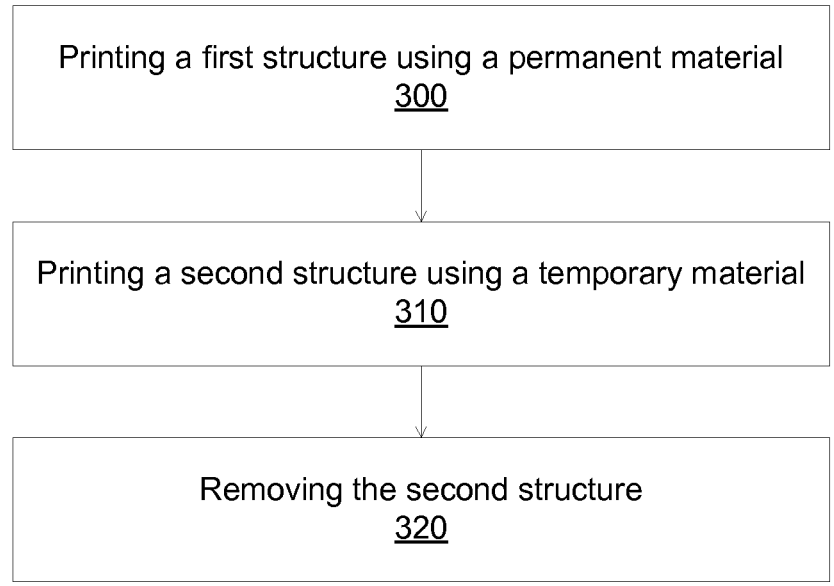
FIGS. 3A-3B illustrate flow charts for 3-D printing process with sacrificial layer according to some embodiments.
Figure 3B:
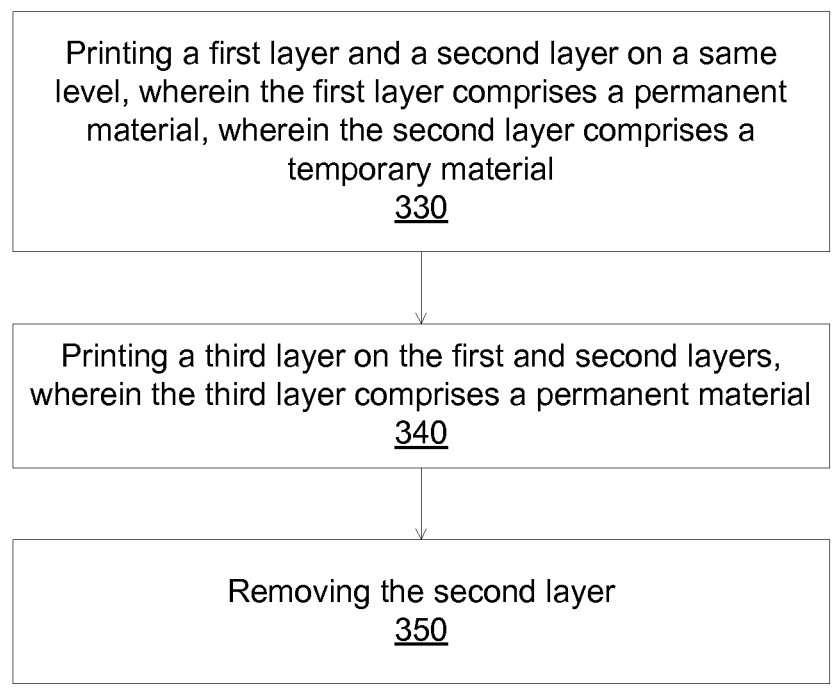

FIGS. 3A-3B illustrate flow charts for 3-D printing process with sacrificial layer according to some embodiments. In FIG. 3A, operation 300 prints a first structure using a permanent material. A first nozzle can be used to print the first structure. Operation 310 prints a second structure using a temporary material. A second nozzle can be used to print the second structure. The second structure can be printed before or after the first structure. Alternatively, a portion of the first structure is printed first, then the second structure is printed, and finally the second portion of the first structure is printed over the second structure. Operation 320 removes the second structure.

In FIG. 3B, operation 330 prints a first layer and a second layer on a same level. The first layer can include a permanent material. The second layer can include a temporary material. Operation 340 prints a third layer on the first and second layers. The third layer can include the permanent material. Operation 350 removes the second layer.

In some embodiments, the present invention discloses methods and systems for printing with higher throughput. Nozzles with different printing speeds, printing rates or printing dimensions can be provided to optimize the printing process. For example, fine features of the printed structure can be printed with a fine nozzle at a lower speed to print with accuracy and details. Coarse features can be printed with a larger nozzle at higher speed for higher throughput without affecting the quality of the printed structure. In addition, sacrificial features can also be printed with a large nozzle at high speed.

In some embodiments, the coarse nozzle can print material lines with larger dimensions than the fine nozzle. Multiple fine layers can be printed with the fine nozzle before a coarse layer that is printed with a coarse nozzle. The nozzles can perform the printing process in parallel or in sequence, based on an optimization of a processor coordinate the movements and printing of the nozzles.

In some embodiments, the fine and coarse nozzles can be used to print the same material, e.g., the materials used in the printed structure. Alternatively, the fine and coarse nozzles can be used to print different materials, for example, the fine nozzle can be used to print the structure material and the coarse nozzle can be used to print the sacrificial material. Other configurations can be used, such as a fine or coarse nozzle for printing structure material and another fine or coarse nozzle for printing sacrificial material. Multiple fine or multiple coarse nozzles can also be used.

In some embodiments, a printer system can include at least two nozzles, such as a fine nozzle and a coarse nozzle, which can be configured for different printing configurations. For example, the fine nozzle can be configured to print patterns having fine details or higher resolution, while the coarse nozzle can be configured to print patterns having lower resolution with higher throughput. The fine nozzle can be configured to print permanent materials while the coarse nozzle can be configured to print sacrificial materials. The printer system can have two nozzles integrated together, thus there can be minimum precision loss between the two nozzles.

The sacrificial materials include materials that can be selectively removed without affecting the structure materials. The removal can include a thermal removal process, a chemical removal process, or any other removal processes.

Figure 4A:
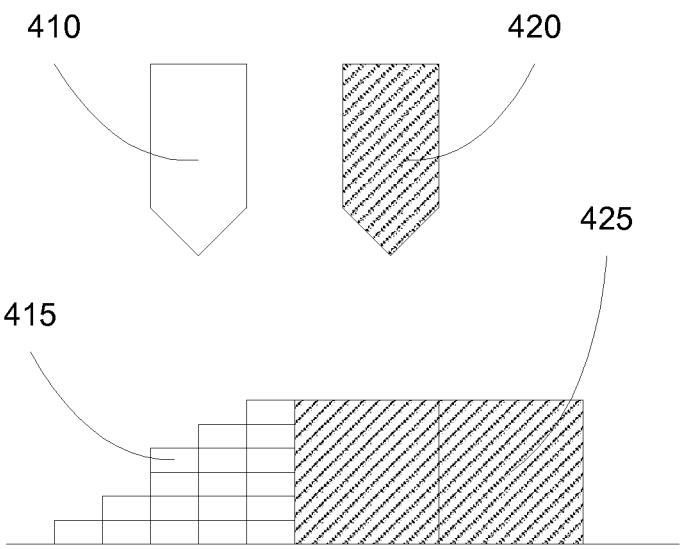
FIGS. 4A-4C illustrate a 3-D printing process with fine and coarse nozzles according to some embodiments.
Figure 4B:
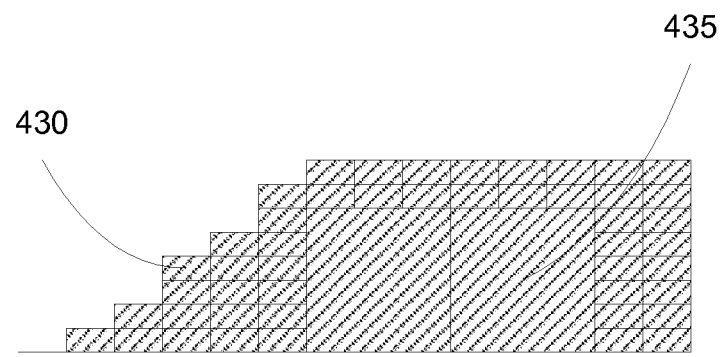
Figure 4C:
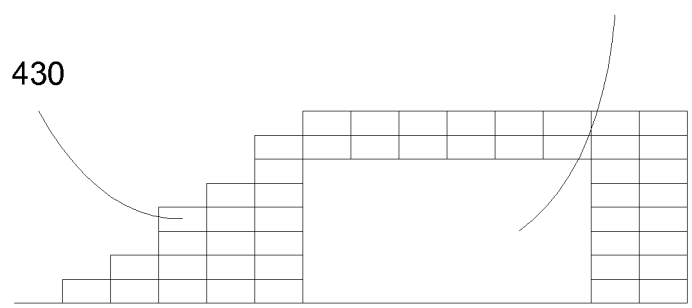

FIGS. 4A-4C illustrate a 3-D printing process with fine and coarse nozzles according to some embodiments. FIG. 4A shows a configuration of multiple fine layers for a single coarse layer. A fine nozzle 410 can be used to print fine layers 415. A coarse nozzle 420 can be used to print coarse layers 425. FIG. 4B shows a configuration for fine and coarse nozzles printing a structure material. The fine layers 430 can cover the coarse layers 435. FIG. 4C shows a configuration for a fine nozzle printing a structure material and a coarse nozzle for printing a sacrificial material. After printing the fine layers 430 on the coarse layers 435, the coarse layer can be removed, leaving void space 437.

Figure 5A:
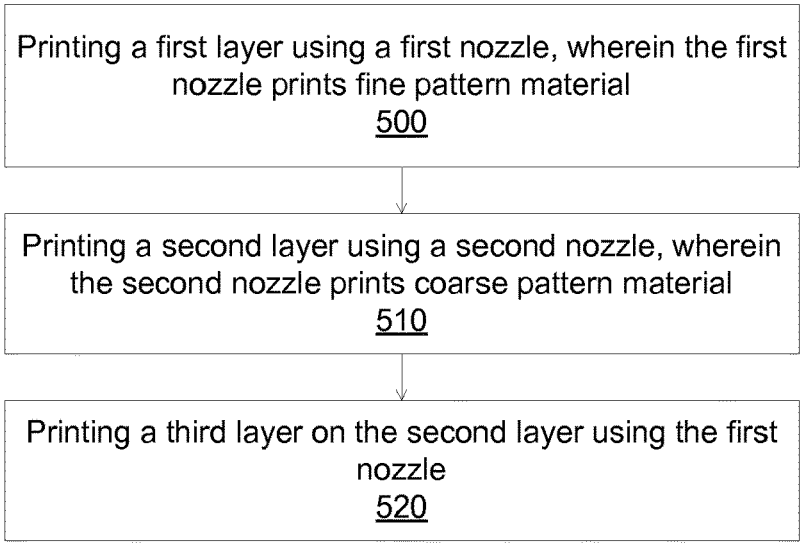
FIGS. 5A-5B illustrate flow charts for 3-D printing process with fine and coarse nozzles according to some embodiments.
Figure 5B:
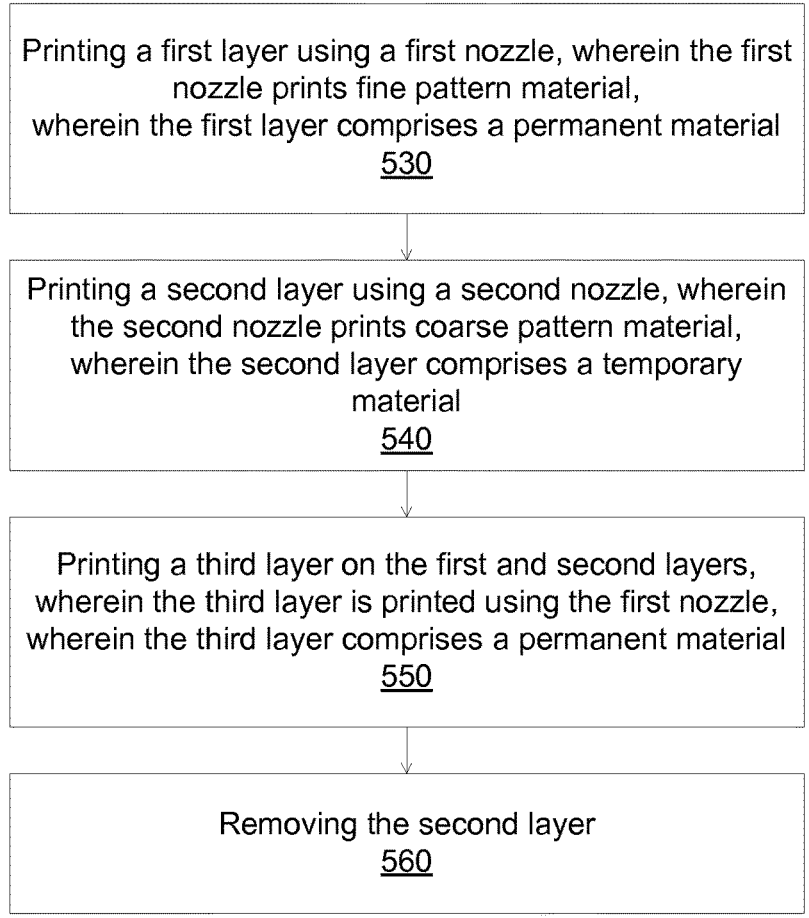

FIGS. 5A-5B illustrate flow charts for 3-D printing process with fine and coarse nozzles according to some embodiments. In FIG. 5A, operation 500 prints a first layer using a first nozzle, wherein the first nozzle prints fine pattern material. Operation 510 prints a second layer using a second nozzle, wherein the second nozzle prints coarse pattern material. Operation 520 prints a third layer on the second layer using the first nozzle.

In FIG. 5B, operation 530 prints a first layer using a first nozzle, wherein the first nozzle prints fine pattern material, wherein the first layer comprises a permanent material. Operation 540 prints a second layer using a second nozzle, wherein the second nozzle prints coarse pattern material, wherein the second layer comprises a temporary material. Operation 550 prints a third layer on the first and second layers, wherein the third layer is printed using the first nozzle, wherein the third layer comprises a permanent material. Operation 560 removes the second layer.

In some embodiments, the present invention discloses methods and systems for printing with less material and higher throughput. The support platform can be raised selectively in areas that an overhang is needed. For example, to print an overhang feature connected to a column, the column can be printed, and the portion of the platform under the overhang feature is raised to allow the printer to print the overhang feature on the raised portion of the platform.

In some embodiments, the platform can include a tile configuration, with each tile is independently controlled, e.g., raised, to support the overhang features. The raised platform can have the accuracy of a printed layer, or can be raised after multiple layers being printed. A controller can be used to control the movements of the platform tiles, in coordination with the printed nozzles.

Figure 6A:
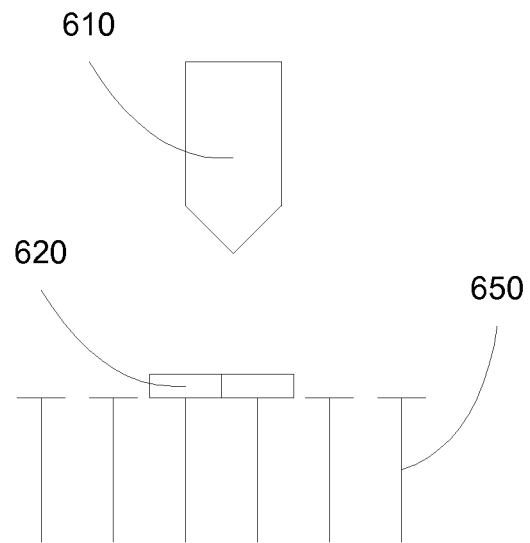
FIGS. 6A-6C illustrate a 3-D printing process with raised platform according to some embodiments.
Figure 6B:
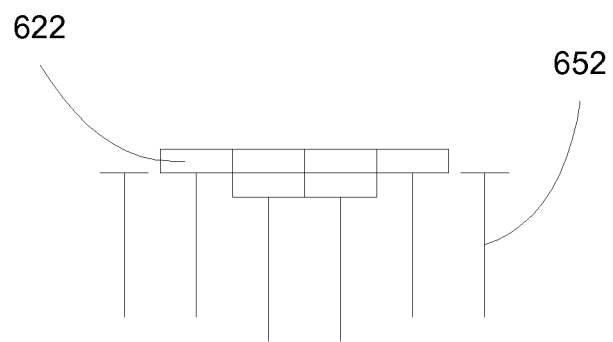
Figure 6C:
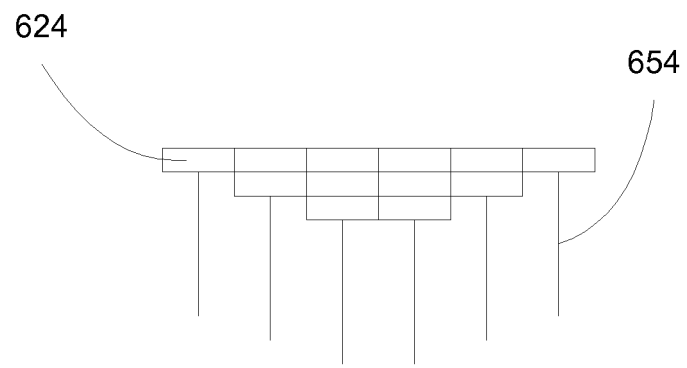

FIGS. 6A-6C illustrate a 3-D printing process with raised platform according to some embodiments. In FIG. 6A, a nozzle 610 of a printer can be used to print a layer 620 on a multiple portion platform 650. In FIG. 6B, a portion of the platform 652 can be raised to present a level surface. The nozzle can continue printing layer 622 on both layers 620 and on the raised portion of the platform. In FIG. 6C, a portion of the platform 654 can be raised to present a level surface. The nozzle can continue printing layer 624 on layers 620/622 and on the raised portion of the platform. Minimum printing materials can be used with faster printing speed.

Figure 7A:
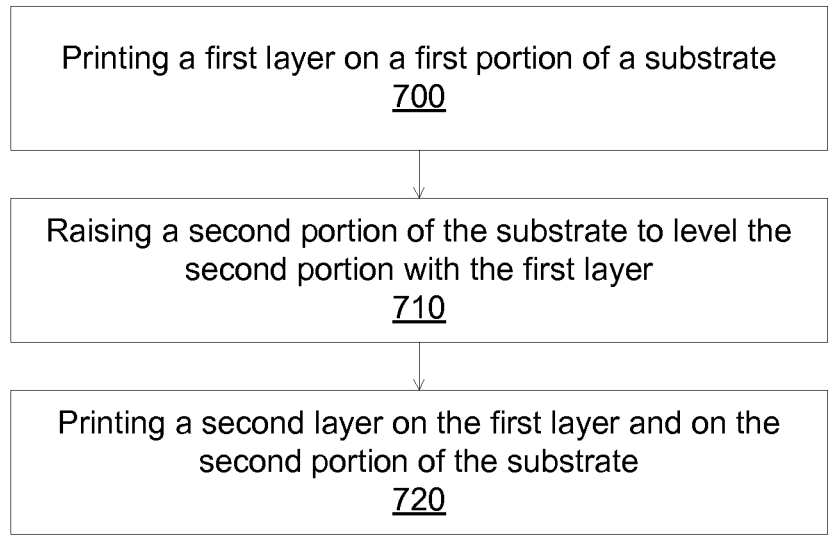
FIGS. 7A-7B illustrate flow charts for 3-D printing process with raised platform according to some embodiments.
Figure 7B:
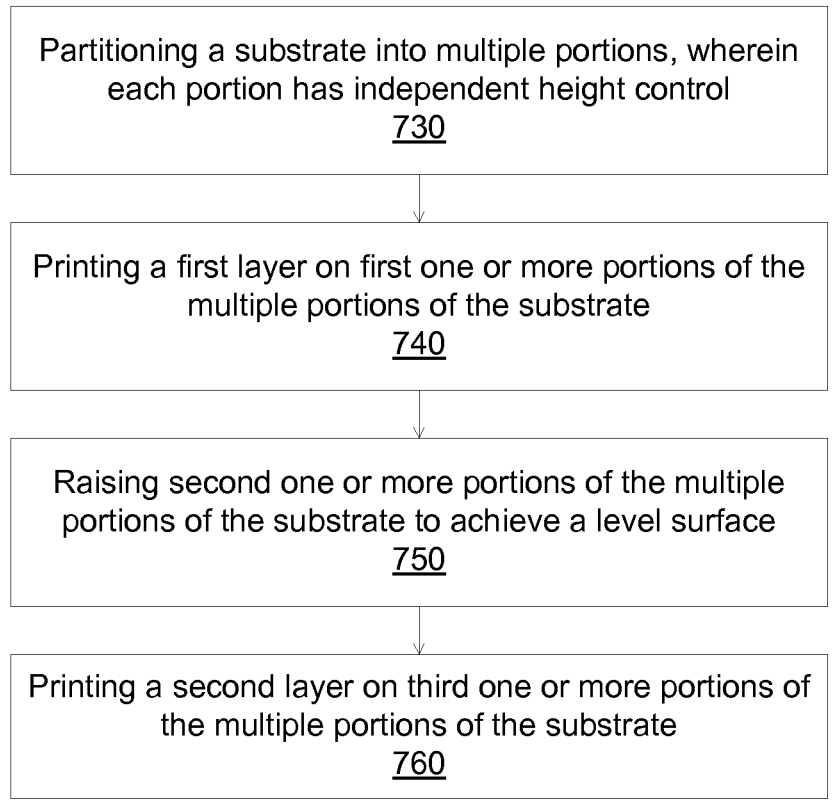

FIGS. 7A-7B illustrate flow charts for 3-D printing process with raised platform according to some embodiments. In FIG. 7A, operation 700 prints a first layer on a first portion of a substrate. Operation 710 raises a second portion of the substrate to level the second portion with the first layer. Operation 720 prints a second layer on the first layer and on the second portion of the substrate.

In FIG. 7B, operation 730 partitions a substrate into multiple portions, wherein each portion has independent height control. Operation 740 prints a first layer on first one or more portions of the multiple portions of the substrate. Operation 750 raises second one or more portions of the multiple portions of the substrate to achieve a level surface. Operation 760 prints a second layer on third one or more portions of the multiple portions of the substrate.

In some embodiments, the present invention discloses methods and systems for prototyping or mass production using 3-D printing technology. A mold can be printed, and then used for casting one or multiple identical parts. Double casting process can be used to produce cast objects that have higher melting temperature than the printed molds. The mold can be a solid mold, e.g., a mold that is completed formed by 3D printing. In contrast, a shell mold can include only a shell of the mold, e.g., a thin sheet of material that conforms to the surface of the object. For example, a positive shell mold can show an image of the object from the outside looking in, and have a hollow middle.

A negative image of the object can be first printed. The negative image can be used as a mold, and an image of the object can be formed from the printed mold. The object image can be cast to form a second negative mold of the object. The second negative mold is again cast, for example, with a metal or an alloy, to form a final image of the object. The second negative mold can have materials with high melting temperature than the first negative mold, for example, to produce high melting temperature objects.

For example, a plastic mold can be printed, which contains a negative image of the object. The plastic mold can include mold features, such as openings for pouring casting materials and openings for pressure or air released. The plastic mold can be configured to account for shrinkage when cooling down. The plastic mold can be configured for the first and second casting processes.

A temporary image of the object can be cast from the plastic mold. The materials for the temporary image can have lower melting temperature than the plastic mold, such as wax.

A negative mold of the temporary image can be cast from the temporary image. The material of the negative mold can have high melting temperature, for example, higher than the melting temperature of metals of alloys so that metal or alloy casting can be performed. For example, the negative mold can include plaster, sand, or a mixture of plaster and sand. Other materials can be used. Techniques for enhance the casting process can be added, for example, a lost wax process, or a salt-based core process.

The negative mold can be used for casting, for example, to form metal-containing casted object. The negative mold can be destroyed during the removal of the casted object.

The printed negative mold, e.g., the plastic mold, can be re-used, e.g., multiple wax images of the object can be prepared. Each wax image can be used to produce a metal-containing casted object. Thus mass production of high melting temperature components can be casted using 3-D plastic printing technology to produce negative molds.

FIGS. 8A-8F illustrate a casting process using printed negative mold according to some embodiments. In FIG. 8A, a nozzle 810 can print a first portion 820 of a negative mold of the object. In FIG. 8B, nozzle 810 can print a second portion 825. Inlets and outlets 830 can be added to allow pouring of casting material.

In FIG. 8C, the two portions 820 and 825 are assembled to form a negative mold of the object. Sacrificial material, such as wax 845, can be poured to the mold to form a wax casting 840 of the object. In FIG. 8D, the wax casting 840 is casted again, for example, by a plaster-containing material, a sand-containing material, or a salt-based material. A negative mold 850 can surround the wax object 840. The wax object can be removed, for example, by heating the mold 850.

In FIG. 8E, final material, such as a metal-containing material, can be poured to the mold 850, to form image 860. In FIG. 8F, the mold is removed, for example, by breaking or by dissolving in a chemical. The final object 860 can be obtained, casted to the final material. The negative mold 820 and 825 can be used again to form other cast objects 840, which can produce other final objects 860. Thus a mass production of final objects 860, e.g., objects having high melting temperatures than the materials used for 3-D printing, can be produced using 3-D printing technology with low melting temperature materials, such as plastic or polymers.

Figure 9:
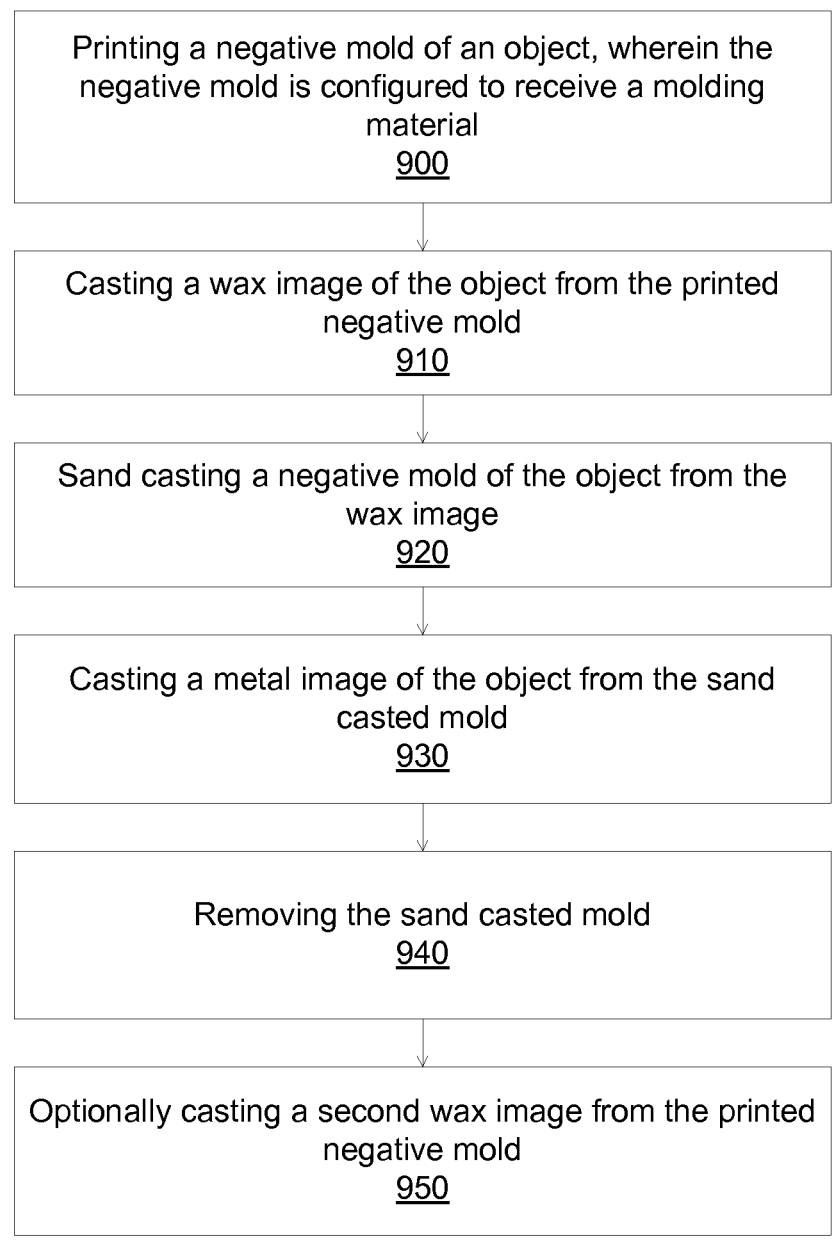
FIG. 9 illustrates a flow chart for a casting process using printed negative mold according to some embodiments.

FIG. 9 illustrates a flow chart for a casting process using printed negative mold according to some embodiments. Operation 900 prints a negative mold of an object, wherein the negative mold is configured to receive a molding material. There can be multiple portions, which can be assembled together to form a complete printed negative mold. The printed material can include plastic such as PLA or ABS, or can include other materials such as ceramic (e.g., a ceramic paste or powder can be printed and then annealed). Operation 910 casts an image of the object from the printed negative mold. The object can include materials having lower melting temperature than that of the printed negative mold. For example, a wax or plastic material can be used. Operation 920 casts a negative mold of the object from the wax image. The negative mold can include a coating surrounding the object. For example, sand, plaster, or a mixture of sand and plaster can be used in the casting process. Operation 930 casts a metal image of the object from the cast mold. For example, metals or alloys can pour in the sand/plaster mold. Operation 940 removes the cast mold, e.g., the sand/plaster mold can be broken. Operation 950 optionally casts a second image from the printed negative mold. The process can continue to form, for example, a second metal object, from the second image.

A positive image of the object can be first printed. The positive image can be used as a mold, and a negative image of the object can be formed from the printed mold. The negative image can be cast to form a negative mold of the negative image. The negative mold is again casted, for example, with a metal or an alloy, to form a final negative image of the object. The final negative image can have materials with high melting temperature than the first negative image, for example, to produce high melting temperature objects. The final negative image can be used for casting metal or alloy containing objects.

For example, a plastic image of the object can be printed, which contains a positive image of the object. The plastic image can include mold features, such as openings for pouring casting materials and openings for pressure or air released. The plastic image can be configured to account for shrinkage when cooling down. The plastic image can be configured for the first and second casting processes.

A temporary negative mold of the object can be casted from the plastic image. The materials for the temporary negative mold can have lower melting temperature than the plastic image, such as wax.

A negative mold of the temporary negative mold can be casted from the temporary negative mold. The material of the negative mold can have high melting temperature, for example, higher than the melting temperature of metals of alloys so that metal or alloy casting can be performed. For example, the negative mold can include plaster, sand, or a mixture of plaster and sand. Other materials can be used. Techniques for enhance the casting process can be added, for example, a lost wax process, or a salt-based core process.

The negative mold can be used for casting, for example, to form metal-containing casted negative mold of the object. The negative mold can be destroyed during the removal of the casted negative mold.

The casted negative mold can be used for casting objects. The casted negative mold, e.g., the metal or alloy containing casted negative mold of the object, can be re-used, e.g., multiple objects can be produced from the mold. Thus mass production of high melting temperature components can be casted using 3-D plastic printing technology to produce a metal containing negative mold, which then can be used to produce casted objects.

Figure 10A:
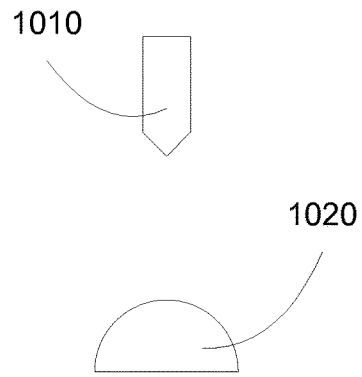
FIGS. 10A-10F illustrate a casting process using printed positive mold according to some embodiments.
Figure 10B:
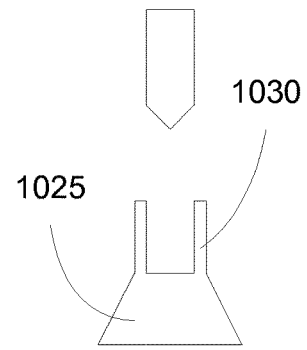

FIGS. 10A-10F illustrate a casting process using printed positive mold according to some embodiments. In FIG. 10A, a nozzle 1010 can print a first portion 1020 of a mold of the object. In FIG. 10B, nozzle 1010 can print a second portion 1025. Inlets and outlets 1030 can be added to allow pouring of cast material. The first and second portions can be assembled to form a complete positive image of the object.

Figure 10C:
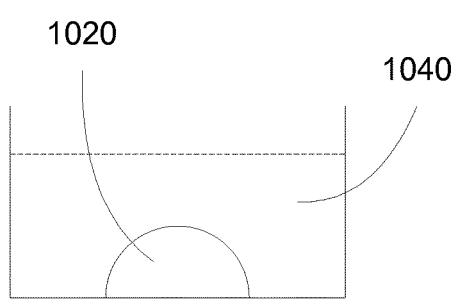
Figure 10D:
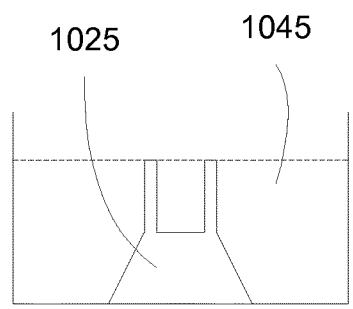

In FIG. 10C, a negative mold 1040 of the first portion 1020 can be made, for example, by pouring a cast material, such as rubber, plastic or wax. In FIG. 10D, a negative mold 1045 of the second portion 1025 can be made, for example, by pouring a cast material, such as rubber, plastic or wax. Alternatively, a ceramic cast material can be used. For example, a ceramic slurry, paste or powder can be applied to the first and second portions, separately to allow for interface surfaces. The ceramic material can be sintered at a high temperature.

Figure 10E:
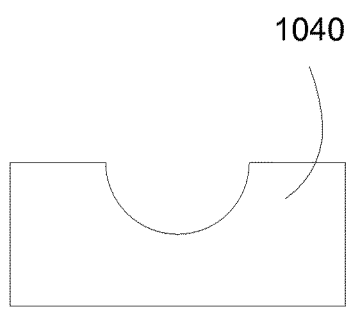
Figure 10F:
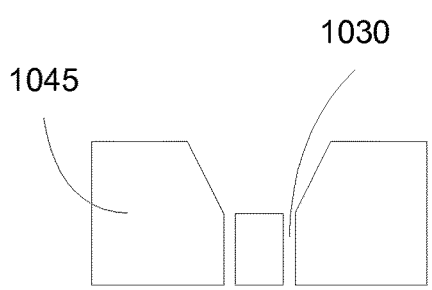

In FIG. 10E, the printed portion 1020 is removed, leaving the negative mold 1040 of the object. The negative mold 1040 can be made of a plastic or wax material. In FIG. 10F, the printed portion 1025 is removed, leaving the negative mold 1045 of the object with inlets and outlets 1030. The negative mold 1045 can be made of a plastic or wax material. The negative mold 1440 and 1445 can also include a ceramic material, formed as mentioned above. The printed portions 1020 and 1025 can be automatically removed during the sintering process of the ceramic material.

The negative molds 1040 and 1045 can be used to for casting metal image of the molds. For example, the negative molds 1040 and 1045 can be made of wax. After coating the molds, separately, with plaster or sand, a coating can be formed. The wax can be removed. Metal containing materials can be poured to the cast molds, and two separate negative metal molds can be formed from the wax images.

The negative metal molds can be used to cast the object, using any final materials such as metal or plastic.

Figure 11:
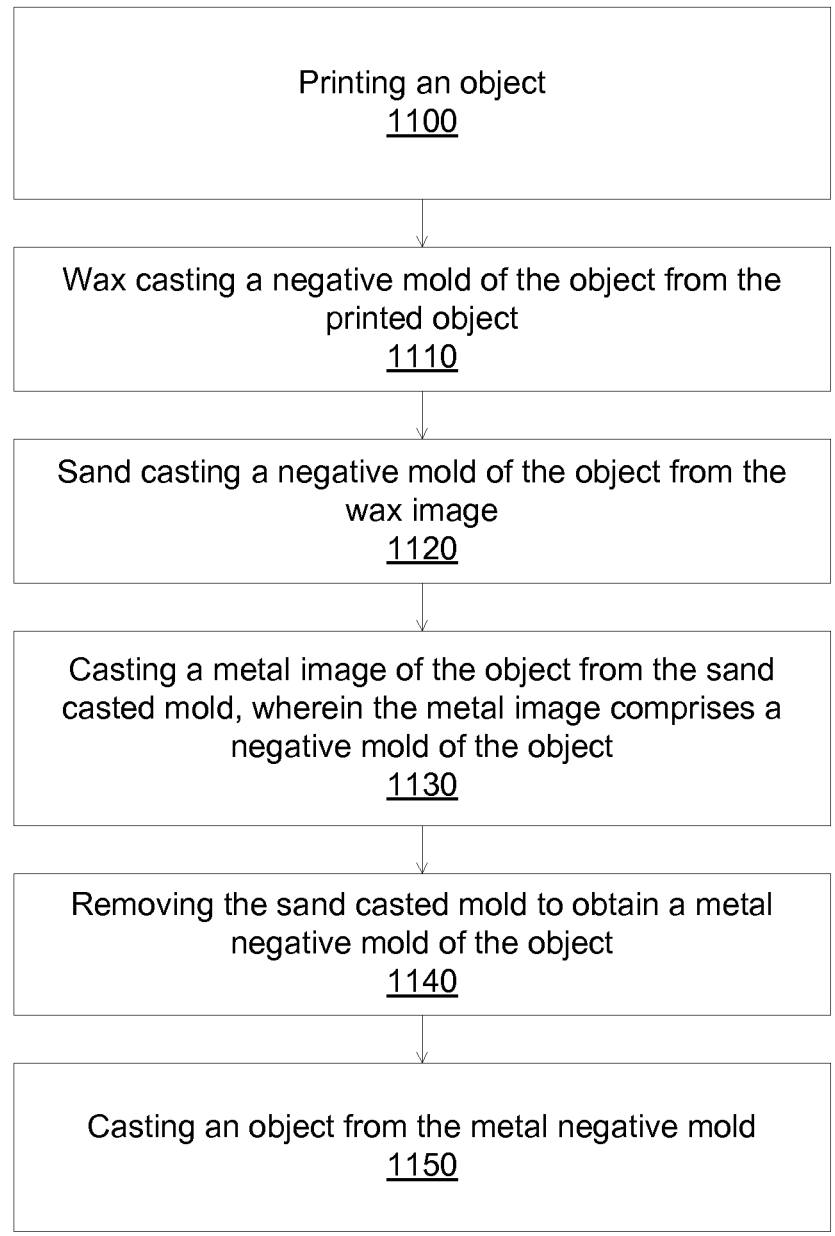
FIG. 11 illustrates a flow chart for a casting process using printed positive mold according to some embodiments.

FIG. 11 illustrates a flow chart for a casting process using printed positive mold according to some embodiments. Operation 1100 prints an object. Operation 1110 casts a negative mold of the object from the printed object. The negative mold can include a wax material. The cast process can include using a non-solid material, such as a fluid, paste or slurry material, which can conform to the external surface of the object. The non-solid material can be processed to be solidified, such as leaving at room temperature for being solidified (such as plastic compounds or rubber compounds), or heating at high temperature (such as ceramic sintering process). Operation 1120 casts a negative mold of the object from the wax image. Operation 1130 casts a metal image of the object from the cast mold, wherein the metal image comprises a negative mold of the object. Operation 1140 removes the cast mold to obtain a metal negative mold of the object. Operation 1150 casts an object from the metal negative mold.

In some embodiments, the printed images from a 3-D printer can include a shell image of the object. A full image can be formed by filling in the shell, for example, by pouring compatible material to the printed image to form a solid image. The shell can have interlocked features at the interface with the poured in material, for example, to secure the two materials together. The interlocked features can also allow component separation, for example, between a solid shell and a rubber filled in.

For example, to print a positive image of an object, e.g., an image that looks like the object but having features that are accounted for future casting processes so that the positive image can re-produce the exact image of the object, only the outer shell of the object is printed, with the object core hollow. To print a negative image of the object, e.g., an image that contains features so that a positive image of the object can be produced from the negative image, only the outer shell of the object is printed, e.g., the outer shell that matches the outer surface of the object, after accounted for features of future casting processes.

The shell image can be filled with plastic or rubber materials to produce a solid image. For positive image, the filling material can be poured to the inside surfaces of the shell image, e.g., the inside of the object. After pouring, a solid positive image can be formed. For negative image, the filling material can be poured to the outside surface of the shell image, e.g., the outside of the object. After pouring, a solid negative image can be formed.

The composite positive or negative image, e.g., solid poured material and shell image, can be used for casting objects, similar to the above processes using solid 3-D printed images. The thin shell image can reduce material cost and printed time.

The composite image can be optimized for casting, for example, rubber pouring can be used to increase flexibility for the mold. Further, a portion of the image can have shell printed and a portion of the image can have solid printed. For example, an object can have solid mold requirements for a portion of the object surface. This surface portion can be printed to form solid image. Other portions can be printed to form shell image.

In some embodiments, the printed images from a 3-D printer can include a shell image of the object. The shell image can include a portion of a negative image and a portion of a positive image of the object. A full image can be formed by filling in the shell, for example, by pouring compatible material to the printed image to form a solid image. The shell can have interlocked features at the interface with the poured in material, for example, to secure the two materials together. The shell can be coated with a releasable layer at the interface with the poured in material, for example, to easily separate the two materials.

The negative image portion of the shell can be embedded to the filled-in material. Interlocked features can be incorporated in this portion of the shell. The positive image portion of the shell can be removed, to expose the filled-in material, e.g., forming a negative image portion by the filled-in material. Releasable coating can be incorporated in this portion of the shell. Thus a negative image can be produced, with a portion of the image surface covered by the shell and a portion of the image surface covered by the filled-in material.

The positive image portion of the shell can be embedded to the filled-in material. Interlocked features can be incorporated in this portion of the shell. The negative image portion of the shell can be removed, to expose the filled-in material, e.g., forming a positive image portion by the filled-in material. Releasable coating can be incorporated in this portion of the shell. Thus a positive image can be produced, with a portion of the image surface covered by the shell and a portion of the image surface covered by the filled-in material.

FIGS. 12A-12F illustrate a casting process using printed shell mold according to some embodiments. This process shows a negative mold resulted from the 3-D printing process together with the poured in technique. Processes for positive mold are similar.

Figure 12A:
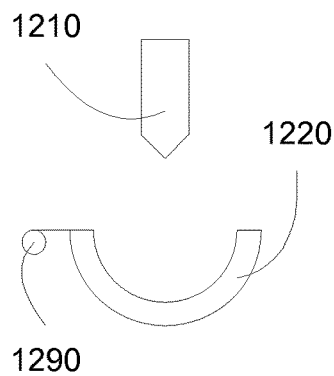
FIGS. 12A-12F illustrate a casting process using printed shell mold according to some embodiments.
Figure 12B:
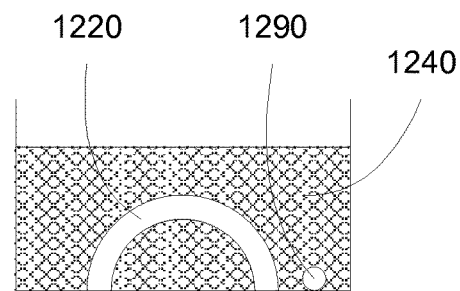

In FIG. 12A, a nozzle 1210 can print a first shell portion 1220 of a mold of the object. A connecting feature 1290 can be included, for example, to couple different portions of the shell images. The nozzle can also print other portions, with inlets and outlets to allow pouring of casting material. In FIG. 12B, another casting material 1240 can be poured on the outer surface of the shell portion 1220. The casting material 1240 and the shell 1220 can form a portion of the negative image of the object.

Figure 12C:
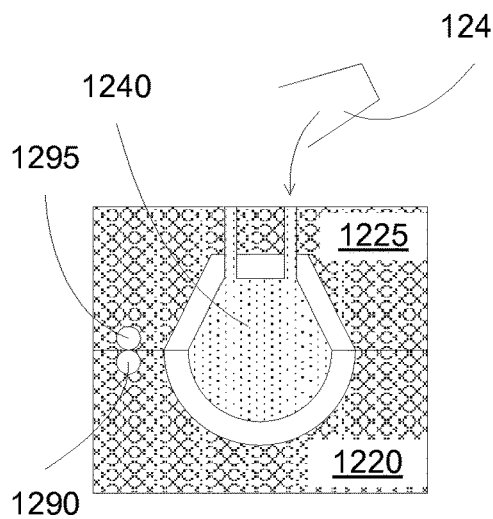
Figure 12D:
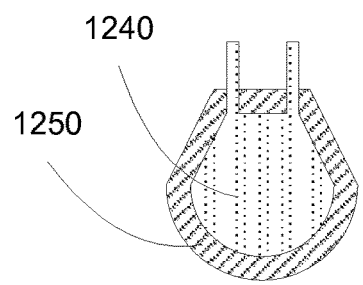

In FIG. 12C, the two portions 1220 and 1225 are assembled to form a negative mold of the object, with connecting features 1290 and 1295. Sacrificial material, such as wax 1245, can be poured to the mold to form a wax casting 1240 of the object. In FIG. 12D, the wax casting 1240 is cast again, for example, by a plaster-containing material, a sand-containing material, or a salt-based material. A negative mold 1250 can surround the wax object 1240. The wax object can be removed, for example, by heating the mold 1250.

Figure 12E:
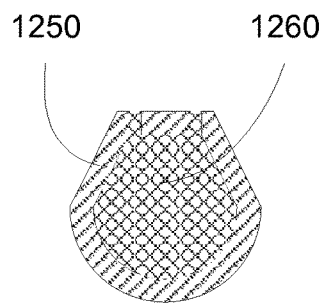
Figure 12F:
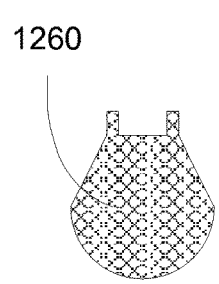

In FIG. 12E, final material, such as a metal-containing material, can be poured to the mold 1250, to form image 1260. In FIG. 12F, the mold is removed, for example, by breaking or by dissolving in a chemical. The final object 1260 can be obtained, casted to the final material.

Figure 13A:
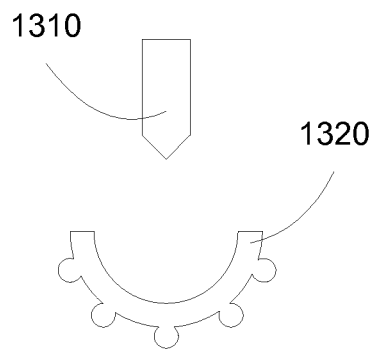
FIGS. 13A-13C illustrate a casting process using printed shell mold having interlocked features according to some embodiments.
Figure 13B:
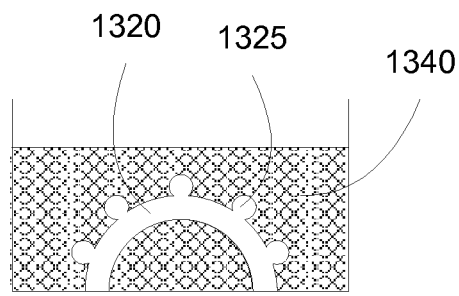
Figure 13C:
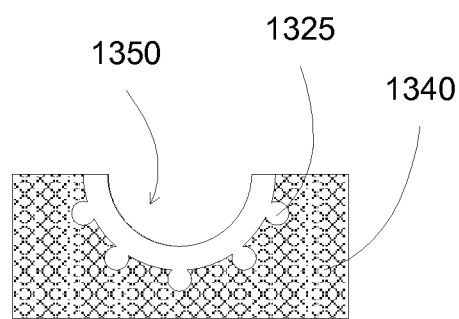

FIGS. 13A-13C illustrate a casting process using printed shell mold having interlocked features according to some embodiments. This process shows a negative mold resulted from the 3-D printing process together with the poured in technique. Processes for positive mold are similar.

In FIG. 13A, a nozzle 1310 can print a first shell portion 1320 of a negative mold of the object. Interlocked features 1325 can also be printed. The nozzle can also print other portions, with inlets and outlets to allow pouring of casting material. In FIG. 13B, another casting material 1340 can be poured on the outer surface of the shell portion 1320. The casting material 1340 and the shell 1320 can form a portion of the negative image of the object. The interlocked features 1325 can secure the casting material 1340 and the shell 1320. Permanent attachment can be achieved, for example, with similar material between the casting material 1340 and the shell 1320. Temporary attachment can be achieved, for example, by using rubber for the casting material 1340. The rubber material can allow some flexibility, which can allow peeling the casting material 1340 from the shell 1320.

In FIG. 13C, a composite negative mold is formed, having the printed shell 1320 coupled with a poured casting material 1340. Inner volume 1350 of the negative mold corresponds to the image of the object.

Figure 14A:
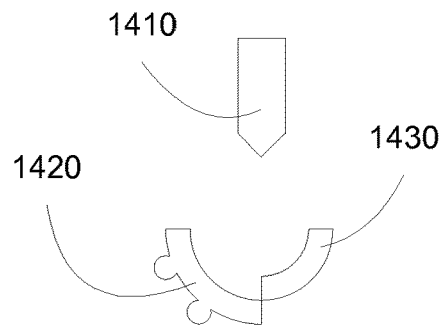
FIGS. 14A-14C illustrate a casting process using printed shell mold having positive and negative portions according to some embodiments.
Figure 14B:
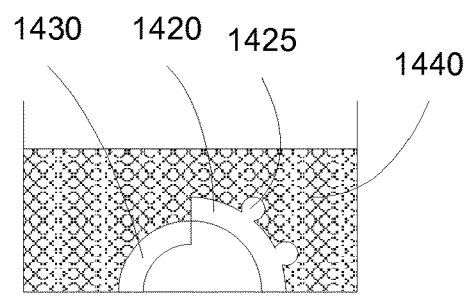
Figure 14C:
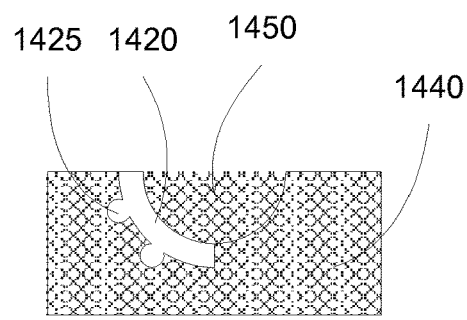

FIGS. 14A-14C illustrate a casting process using printed shell mold having positive and negative portions according to some embodiments. This process shows a negative mold resulted from the 3-D printing process together with the poured in technique. Processes for positive mold are similar.

In FIG. 14A, a nozzle 1410 can print a first shell portion 1420 of a negative mold of the object. Interlocked features 1425 can also be printed. The inner surface of the first shell corresponds to the outer surface of the object. The nozzle can also print a second shell portion 1430 of a positive mold of the object. The outer surface of the second shell corresponds to the outer surface of the object. The two portions can be placed side by side, or can be placed far apart. The nozzle can also print other portions, with inlets and outlets to allow pouring of casting material.

In FIG. 14B, another casting material 1440 can be poured on the outer surface of the shell portion 1420. The casting material 1440 and the shell 1420 can form a portion of the negative image of the object. The interlocked features 1425 can secure the casting material 1440 and the shell 1420. A release coating can be coated on the second portion 1430 before pouring the casting material 1440. Thus the second portion 1430 can be removed from the casting material 1440.

In FIG. 14C, a composite negative mold is formed, having a printed shell 1420 coupled with a poured casting material 1440. A portion of the negative mold is formed with the casting material 1440, due to the removal of the second shell 1430. The inner volume 1450 of the negative mold corresponds to the image of the object.

Figure 15:
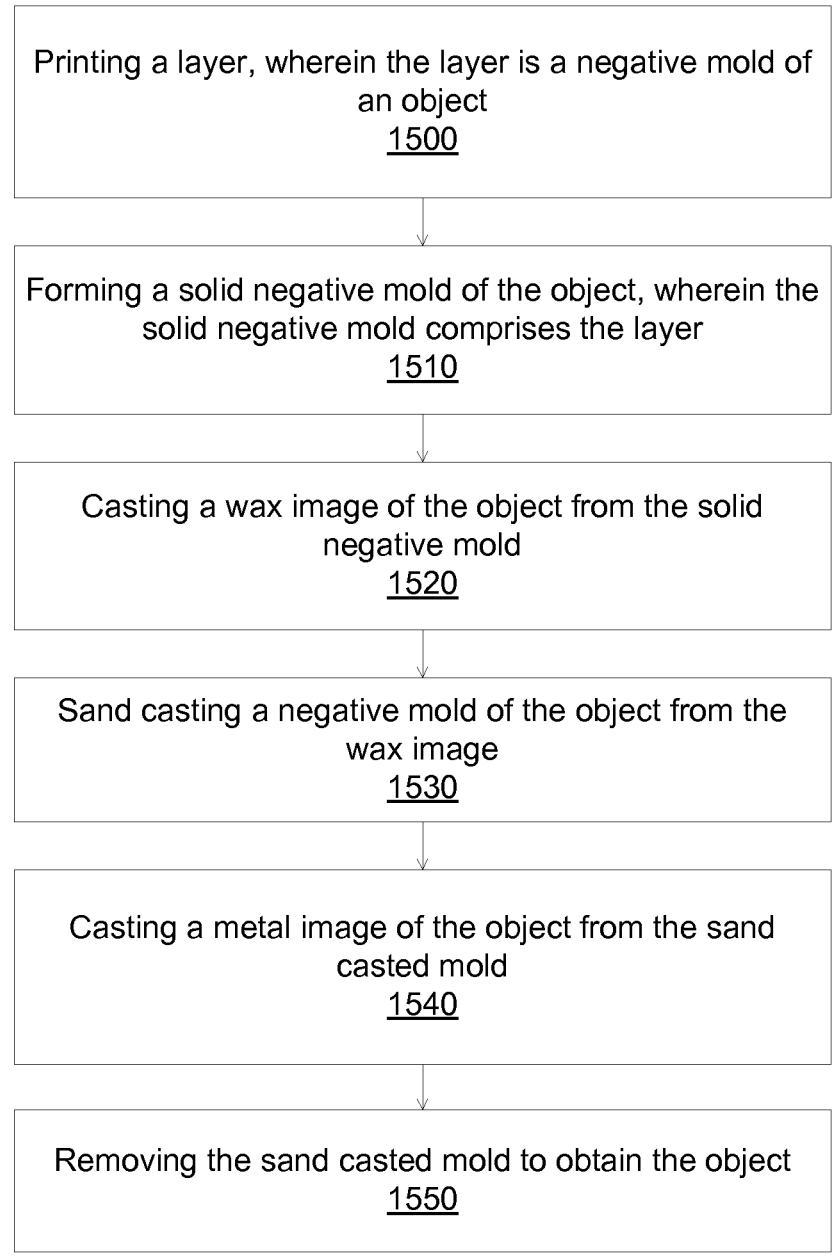
FIG. 15 illustrates a flow chart for a casting process using printed shell mold according to some embodiments.

FIG. 15 illustrates a flow chart for a casting process using printed shell mold according to some embodiments. This process shows a negative mold resulted from the 3-D printing process together with the poured in technique. Processes for positive mold are similar. Operation 1500 prints a layer, wherein the layer is a negative mold of an object. Operation 1510 forms a solid negative mold of the object, wherein the solid negative mold comprises the layer. Operation 1520 casts a wax image of the object from the solid negative mold. Operation 1530 sand casts a negative mold of the object from the wax image. Operation 1540 casts a metal image of the object from the sand casted mold. Operation 1550 removes the sand casted mold to obtain the object. Variations of the above processes can be used, such as using plaster casting and/or salt based casting instead of sand casting.

In some embodiments, the present invention discloses a disposable casting process using a printed image. This process can be used to cast complicated geometry objects, such as objects that have features that can prevent a mold from being released. The material used for the mold can include materials that can be dissolved in a chemical liquid, such as salt-based core dissolvable in water, or plaster (e.g., calcium sulfate) dissolvable in low base solution such as sodium bicarbonate solution. The printed image can be used to form a mold, surrounding the printed image. The image is then removed from the mold, for example, by melting. A final material can be poured into the mold, filling the space left by the image. The mold is then dissolved, leaving the object casted from the final material.

In some embodiments, the disposable casting process is similar to a lost wax casting process, using disposable materials as a mold for casting features that are hard to be casted with permanent mold.

In some embodiments, a wax image of an object can be printed. The wax image can resemble the object, with the addition of features that can compensate for future process steps, such as larger to account for cooling shrinkage, or inlet or outlet for pouring cast materials. In some embodiments, a porous object can be printed. The porous object can contain interconnect lines, leaving void spaces.

A removable or dissolvable mold is formed surrounding the printed image. The materials used for the mold can include plaster based materials (dissolvable in sodium bicarbonate solution, or any slightly base liquid), salt based materials (dissolvable in water), or any materials that can be dissolved in a chemical liquid.

The object is then removed from the mold, for example, by heating the mold to melt the wax. New materials, such as a metal-containing material, can be poured into the space left by the wax. After harden, the mold can be removed by dissolving in a suitable chemical liquid. The disposable casting process can produce metal object with features that cannot be casted by solid mold. The disposable casting process can produce objects, e.g., working objects, or molds, e.g., objects used to produce (e.g., cast) working objects.

FIGS. 16A-16F illustrate a disposable casting process according to some embodiments.

Figure 16A:
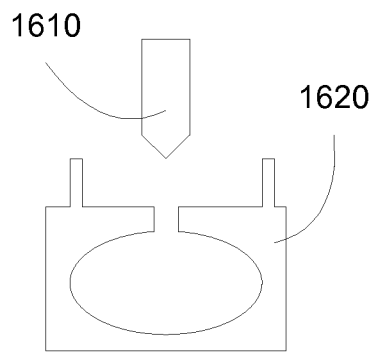
FIGS. 16A-16F illustrate a disposable casting process according to some embodiments.

In FIG. 16A, a nozzle 1610 can print an image 1620 of the object. Inlets and outlets can be added to allow pouring of casting material. The printed material can be low melting temperature materials, such as wax or low temperature plastic.

Figure 16B:
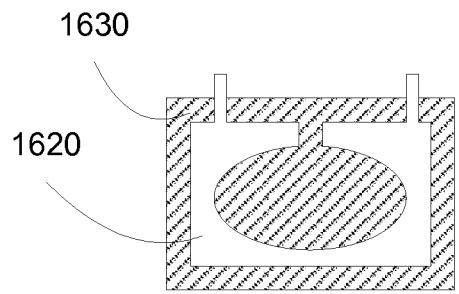
Figure 16C:
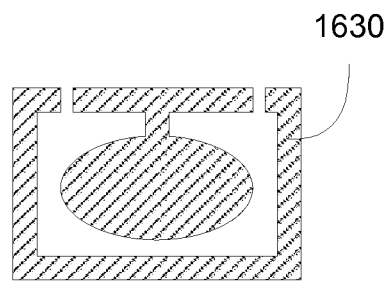

In FIG. 16B, disposable casting material 1630 can be formed enveloping the image 1620. In FIG. 16C, the image 1620 can be removed, for example, by heating the mold 1630 to a melting temperature of the material of the image 1620.

Figure 16D:
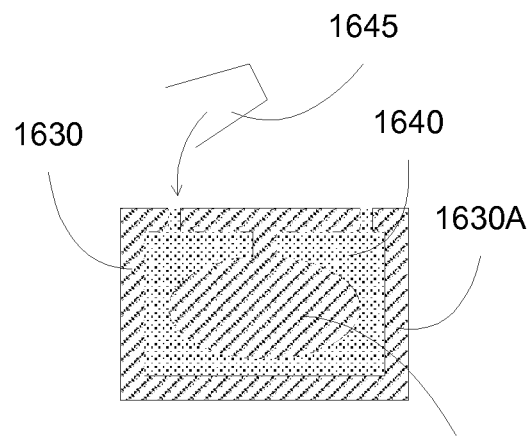
Figure 16E:
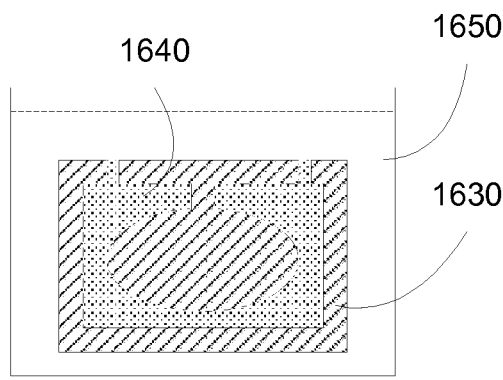
Figure 16F:
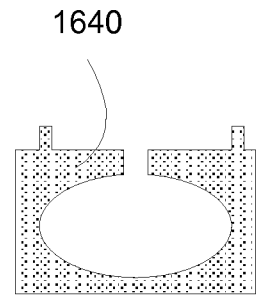

In FIG. 16D, final material 1645, such as a metal-containing material, can be poured to the mold 1630, to form image 1640. In FIG. 16F, the mold is removed, for example, by dissolving in a chemical 1650. The final object 1640 can be obtained, casted to the final material.

In some embodiments, a portion of the mold can be a dissolvable material while other portions can be non-dissolvable material. For example, an inner portion 1630B can include dissolvable material and the outer portion 1630A can include non-dissolvable material. The non-dissolvable material 1630A can be removed, e.g., after casting, by physical means, such as by breaking the mold portion. The dissolvable portion 1630B can be removed by a chemical means, since it is an inner portion and physical removal process can be difficult.

Figure 17:
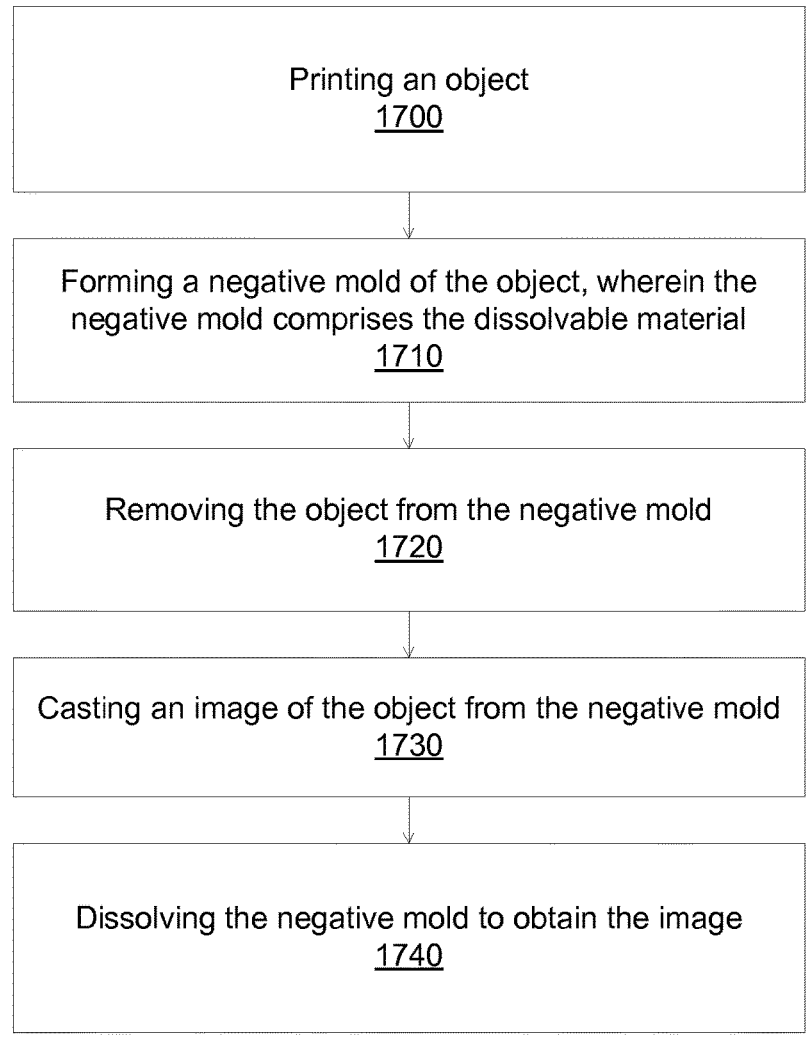
FIG. 17 illustrates a flow chart for disposable casting processes according to some embodiments.

FIG. 17 illustrates a flow chart for disposable casting processes according to some embodiments. Operation 1700 prints an object. Operation 1710 forms a negative mold of the object, wherein the negative mold comprises the dissolvable material, and optionally non-dissolvable material. For example, non-dissolvable materials can be used to form outer shell of the mold, which can be removed by a physical means, such as breaking. Dissolvable materials can be used to form inner portions of the mold, such as filling cavities, which can be difficult to remove by physical means. Operation 1720 removes the object from the negative mold. Operation 1730 casts an image of the object from the negative mold. Operation 1740 dissolves the negative portion of the mold to obtain the image. Non-dissolvable portion can be removed by breaking.

In some embodiments, the present invention discloses methods, and products fabricated from the methods, to print porous objects with high thermal insulating property, light weight, and high mechanical strength compared with object having similar weight. The printed porous object can include interconnecting pathways between void spaces, forming a porous structure. The pores can be repeated at regular intervals, and can be optimized for different purposes, for example, optimized for compressive stress, for tensile stress, for shear stress, for twist stress, or for a general stress. The void ratio can be high, to reduce the weight and to increase the thermal insulation property. The outside surfaces of the porous structure can be open, e.g., leaving the pores exposed to the outside ambient, or can be closed, e.g., having solid walls in one or more surrounding surface. The porous structure can be sealed, e.g., closed in all external wall, for example, to prevent capturing unwanted materials, or to hold special materials. For example, the air inside the sealed porous structure can be pumped out, leaving a porous structure with inside vacuum, which can improve the thermal insulation property. The pore space can be filled with gases, liquid or solid for different purposes. For example, helium can be used for filling to lighten the weight of the porous structure. Water can be used for filling to increase specific heat, e.g., the ability to retain thermal energy, either to keep cold or keep warm. Solid can be used to increase the strength of the porous structure. For example, light weight plastic can be used for filling metal porous structure, increasing the structure strength while adding much less weight as compared to a solid metal structure.

The porous structures can be produced by a 3-D printing process. For example, a plastic porous structure can be printed using a plastic material. A metal porous structure can be printed using metal material with metal-printable 3-D printers.

The porous structures can be casted using samples printed from a 3-D printer. The casting process can include a disposable casting process, to allow the fabrication of the porous elements in the porous structures. For example, a metal porous structure can be casted from a printed plastic image, using a disposable casting process with plaster or salt based materials.

Figure 18A:
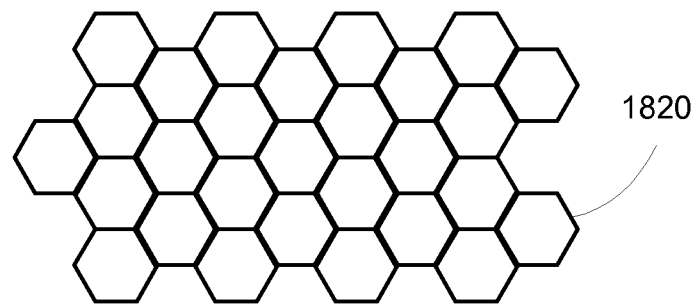
FIGS. 18A-18C illustrate different configurations of porous structures according to some embodiments.
Figure 18B:
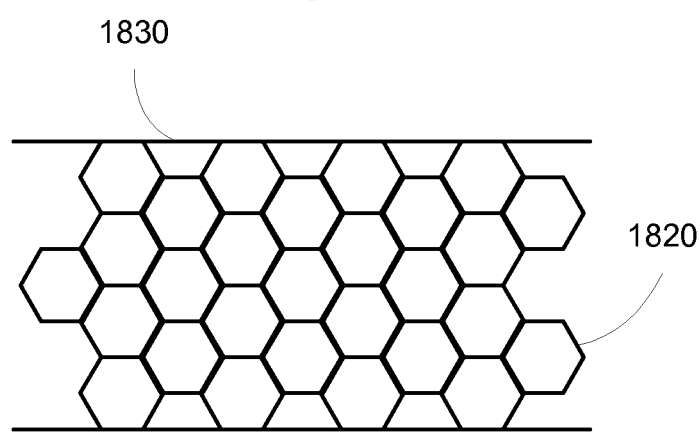
Figure 18C:
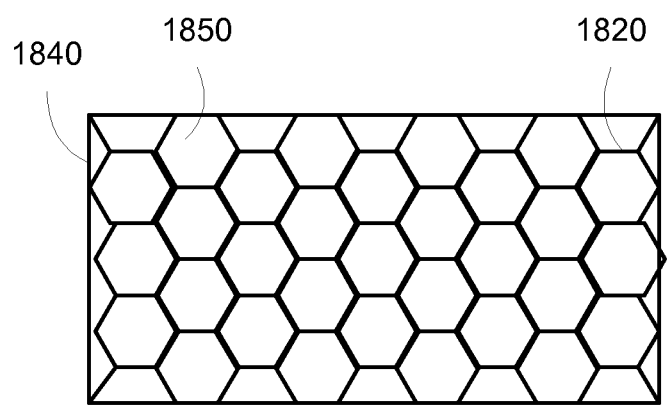

FIGS. 18A-18C illustrate different configurations of porous structures according to some embodiments. FIG. 18A shows a printed porous structure having interconnects 1820 connecting together to form e.g., a stick structure. FIG. 18B shows a printed porous structure having interconnects 1820 enclosed in two opposite walls 1830. FIG. 18C shows a printed porous structure having interconnects 1820 enclosed in surrounding walls 1840. The hollow space 1850, e.g., the void created by the interconnects 1820 $n$ any porous structures, can be filled with air, a gas, a liquid, or a solid. The hollow space 1850 can also be filled with a vacuum, e.g., air is evacuated out from the voids.

Figure 19A:
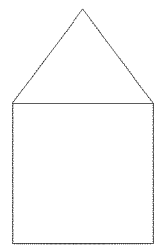
FIGS. 19A-19I illustrate different pores structures according to some embodiments.
Figure 19B:
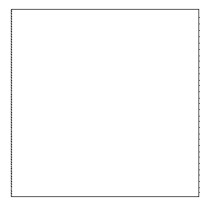
Figure 19C:
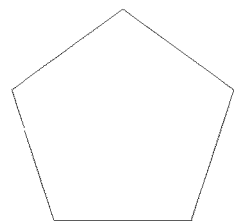
Figure 19D:
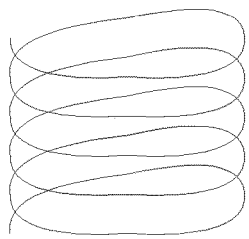
Figure 19E:
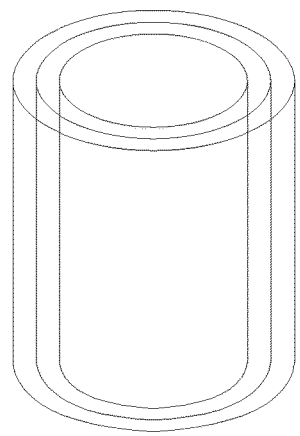
Figure 19F:
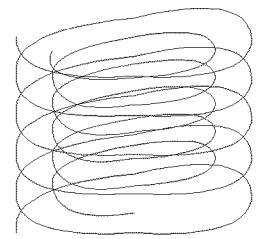
Figure 19G:
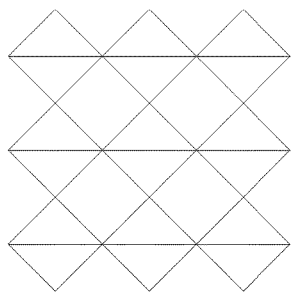
Figure 19H:
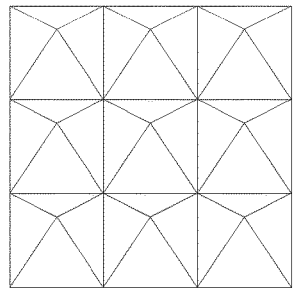
Figure 19I:
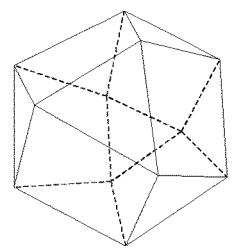

FIGS. 19A-19I illustrate different pores structures according to some embodiments. FIG. 19A shows a cuboctahedron structure. FIG. 19B shows a cubic structure. FIG. 19C shows a pentagon structure. FIG. 19D shows a spiral structure. FIG. 19E shows a concentric cylinder structure, such as a carbon nanotube structure. FIG. 19F shows a concentric spiral structure. FIG. 19G and FIG. 19H show other structures. FIG. 19I shows a cuboct perspective view.

In some embodiments, the porous structures can include sheets, rods, and bars of porous materials. The porous structures can include containers, with or without lids, and with or without structural support. The porous structures can include other components, devices, tools, or equipment. For example, a pot or pan can have a porous layer to prevent heat loss, or a porous handle to prevent heat conduction to the operator. The porous structure can be made of plastic, metal, organic material, inorganic material, or any other materials.

The porous structures can be optimized for thermal properties, such as filling in the voids with vacuum (e.g., removing the air inside the pores), or filling the voids with high heat capacity materials such as water. The porous structures can be optimized for weight, such as having large pores with small size interconnect bars. The porous structures can be optimized for mechanical strength, such as having different pore structures such as cuboctahedron, cube, face center cube, body center cube, hexagonal close packed, rings, spiral, layer, carbon nanotube.

The porous sheets can be used for insulation, such as in building walls, ceilings, roofs, or any other structures. The porous rods or bars can be used for structural support, such as beams, columns, connection structures, or any other components, in building construction, vehicles, airplanes, or equipment or tools.

Figure 20A:
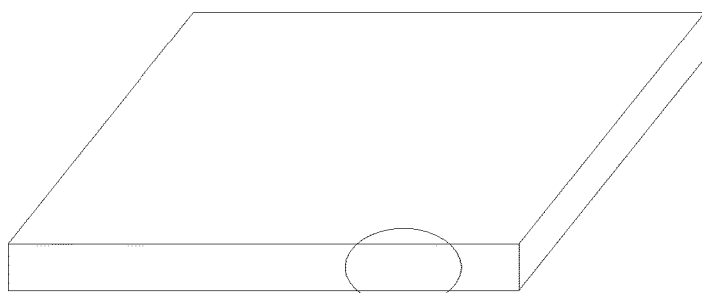
FIGS. 20A-20C illustrate different porous structures according to some embodiments.
Figure 20B:
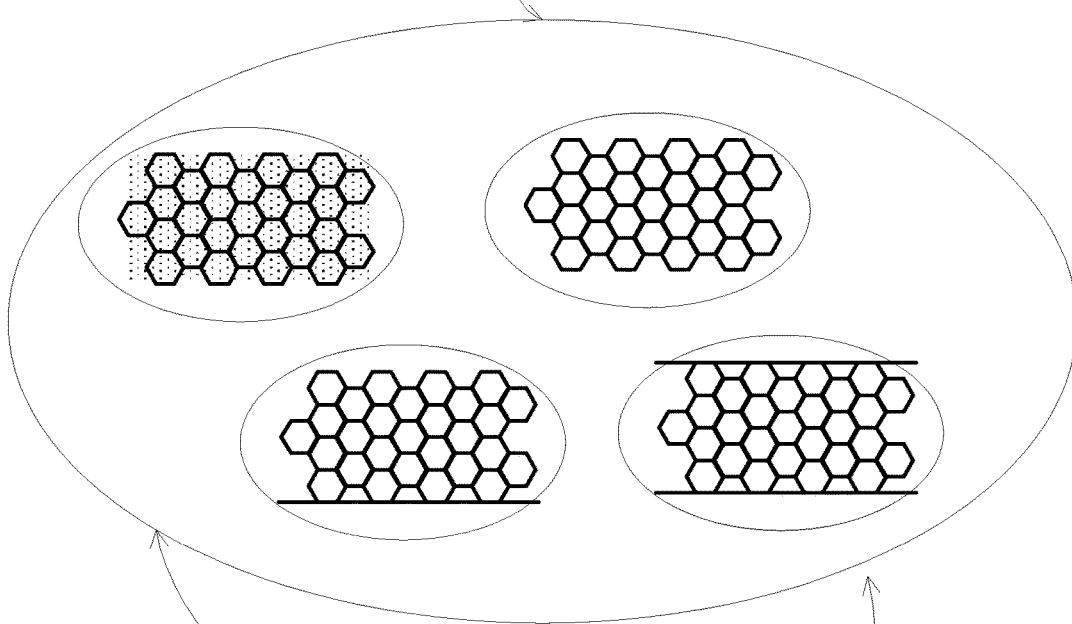
Figure 20C:
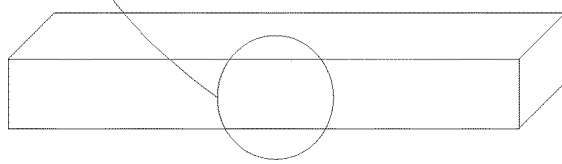

FIGS. 20A-20C illustrate different porous structures according to some embodiments. FIG. 20A shows a porous sheet. FIG. 20B shows a porous bar. FIG. 20C shows a porous rod or tube. The porous structure can have open pores with exposed surfaces, or with a surface wall or multiple walls. The pores can be filled with materials, such as a gas (such as helium), a liquid (such as water), or a solid (such as plastic, or ceramic). The pores can be evacuated with vacuum.

The porous containers can be used for insulation. For example, a cup or a container for cup can be used to insulate the content of the cup. For example, a porous can container can be used for keeping the drink cold. A porous cup can be used for keeping the liquid warm or cool. The porous container can have a lid. For example, an ice chest or a cooler can be made of porous layer. The porous containers can include freezers, refrigerators, pizza boxes, food carts, food containers in airplane, or any containers that require to be light weight and/or high thermal insulated. For example, a porous container can be used to transport frozen food or cooled vegetable, such as a freezer truck or a refrigerated truck. The porous structures can include keep warm or keep cold containers, having a high heat capacity component or an inner wall for keeping the content warm or cold. For example, a porous structure can have two porous layers. An outer porous layer has vacuum void for high insulation property. An inner porous layer has high heat capacity filling, such as water filling the voids, for providing the thermal energy to the content of the container. Alternatively, a heat pad or a cold pad can be placed in the porous container for supply the thermal energy.

The walls of the containers can be solid, in one or more surfaces. For example, solid walls can be surrounding the porous structures to seal in the pores. Further, the walls can have different thicknesses. For example, thin walls can provide light weight, while thick walls can provide support and heat retaining capability. The outer walls and the inner walls can be thick for support, such as preventing abrasion. The outer walls and the inner walls can be thin for light weight, or for adding external cover. The inner walls and the outer walls can have different thicknesses. For example, the outer walls can be thick for support while the inner walls of a same porous structure can be thin for light weight. Alternatively, the porous structure can be open, e.g., without any solid walls. Further, filling materials can be added to the porous structures.

The printed structure can be formed in one piece, e.g., without any connection, thus can have improved thermal insulation property. Further, seal features can be printed to the connection surface, thus allowing improved connection with seal surfaces. Separate seals can be incorporated to the seal features printed on the porous container.

Figure 21A:
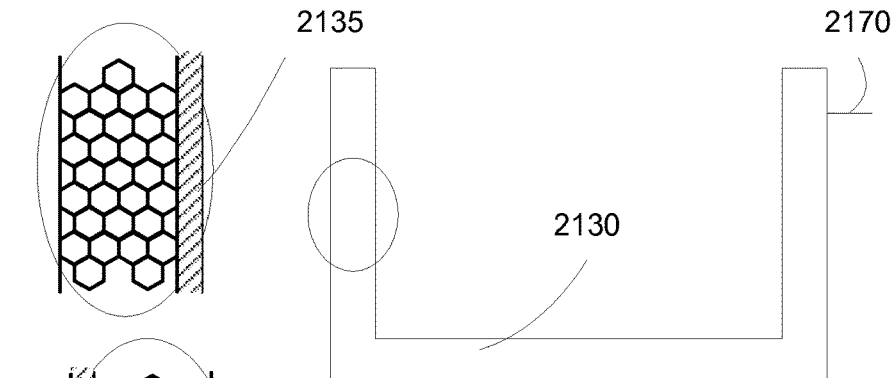
FIGS. 21A-21C illustrate different porous container structures according to some embodiments.
Figure 21B:
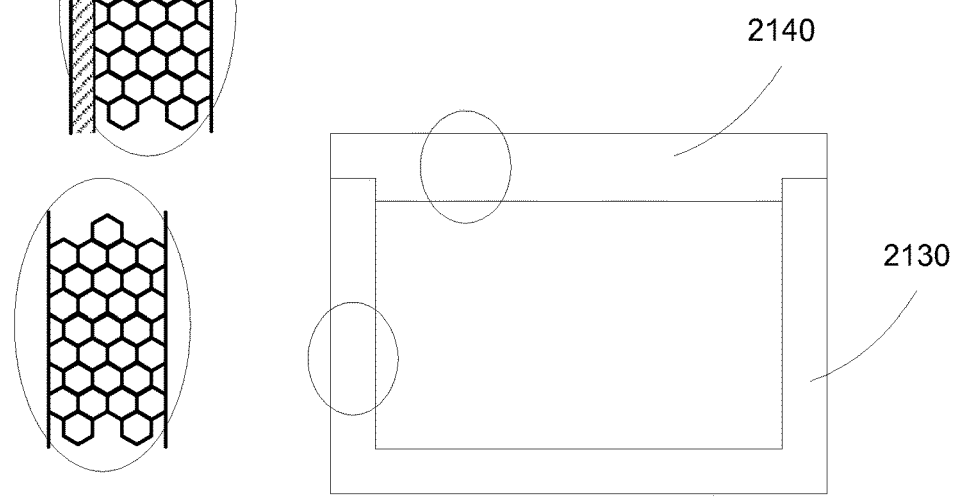
Figure 21C:
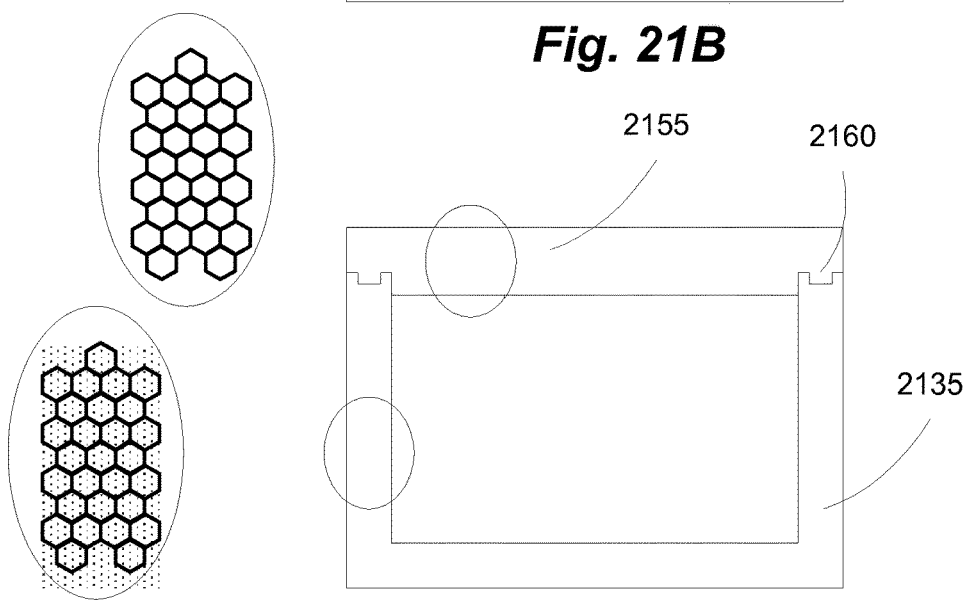

FIGS. 21A-21C illustrate different porous container structures according to some embodiments. FIG. 21A shows an open container 2130, e.g., a container without a lid. The pores of the porous container can be evacuated with a vacuum pump, for example, through an outlet 2170. The outlet 2170 can be sealed after the air is evacuated. FIG. 21B shows a container 2130 with a lid 2140. FIG. 21C shows a container 2135 with a lid 2155, together with integrated seal or lock feature 2160.

The porous walls of the container can have different configurations. For example, inner surface 2135 can be thicker than the outer surface. The outer surface can be thicker than the inner surface. Both surfaces can have the same thickness, of thick layer or of thin layer. There can be no surface, e.g., the pores are open to outside ambient. The pores can be filled with air, or can be filled with any materials, such as a gas, a liquid, or a solid.

FIGS. 22A-22D illustrate flow charts for 3-D printing porous structures according to some embodiments. In FIG. 22A, operation 2200 prints a porous structure, wherein the porous structure comprises interconnect branches. In FIG. 22B, operation 2210 prints a porous structure, wherein the porous structure has one or more outer solid walls, wherein the porous structure comprises interconnect branches. In FIG. 22C, operation 2220 prints a porous structure, wherein the porous structure is surrounded by all sides by outer solid wall, wherein the porous structure comprises interconnect branches. In FIG. 22D, operation 2230 prints a porous structure, wherein the porous structure is surrounded by all sides by outer solid wall, wherein the porous structure comprises interconnect branches. Operation 2240 pumps gas from the porous structure to create vacuum in the porous structure. Operation 2250 seals the pump port to create a porous structure having inside vacuum.

Figure 23A:
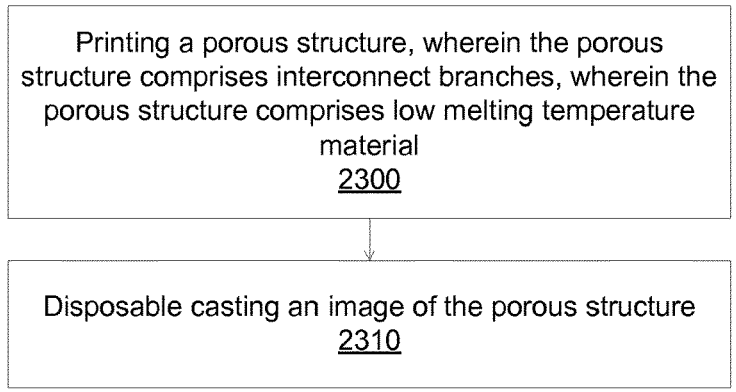
FIGS. 23A-23B illustrate other flow charts for 3-D printing porous structures according to some embodiments.
Figure 23B:
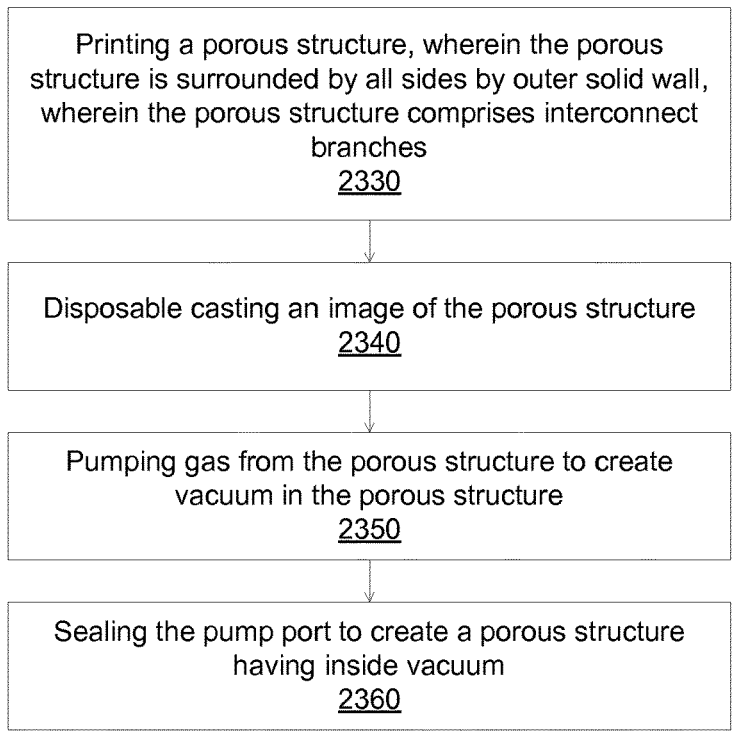

FIGS. 23A-23B illustrate other flow charts for 3-D printing porous structures according to some embodiments. In FIG. 23A, operation 2300 prints a porous structure, wherein the porous structure comprises interconnect branches, wherein the porous structure comprises low melting temperature material. Operation 2310 disposably casts an image of the porous structure.

In FIG. 23B, operation 2330 prints a porous structure, wherein the porous structure is surrounded by all sides by outer solid wall, wherein the porous structure comprises interconnect branches. Operation 2340 disposably casts casting an image of the porous structure. Operation 2350 pumps gas from the porous structure to create vacuum in the porous structure. Operation 2360 seals the pump port to create a porous structure having inside vacuum.

In some embodiments, the porous structures can include a porous pot or pan. The porous layer can be used for provide insulation, e.g., keeping the outer walls of the pot or pan cool to the touch. An inner wall of the pot or pan can be formed of a ferrous material, or any material that can absorb electromagnetic radiation. An inductive heating can be used to heat the pot or pan. The inner wall can absorb the radiation to get hot, while the porous layer preventing heat loss.

Figure 24A:
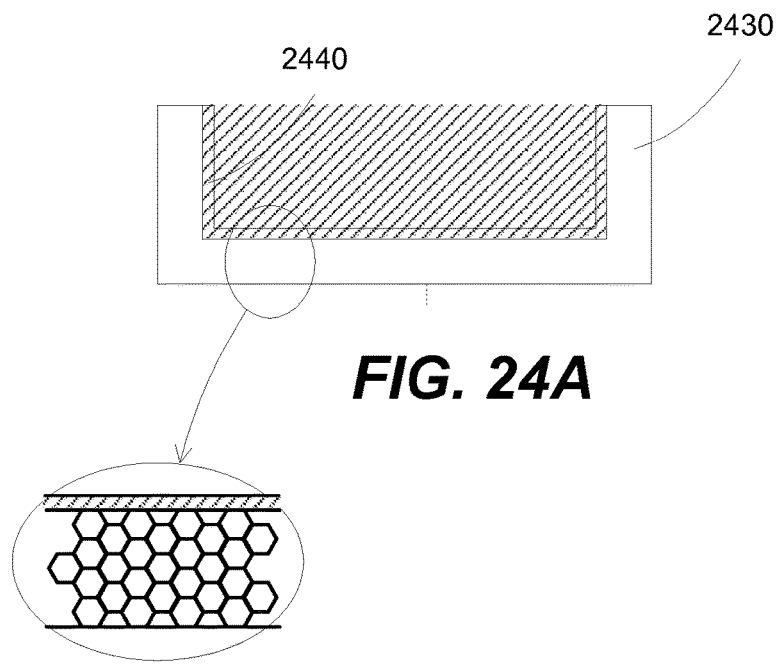
FIGS. 24A-24B illustrate another porous structure according to some embodiments.
Figure 24B:
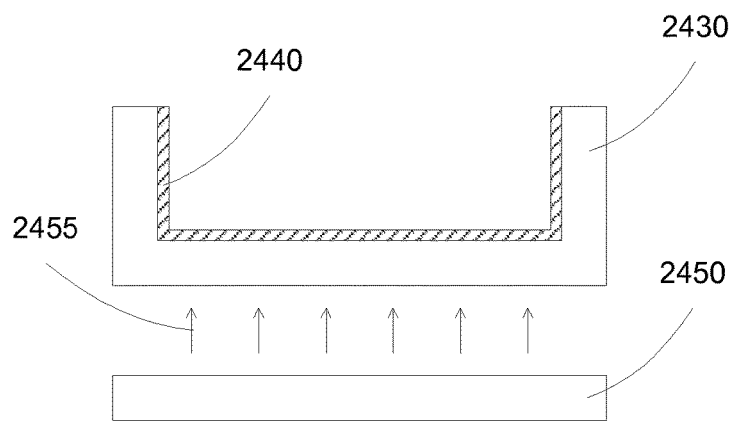

FIGS. 24A-24B illustrate another porous structure according to some embodiments. FIG. 24A shows a porous structure having a thick inner wall 2440, together with porous walls 2430. In some embodiments, the thick wall 2440 is made from materials that can absorb electromagnetic field, such as aluminum and ferrous materials.

In FIG. 24B, under the exposure of an electromagnetic field 2455, for example, generated from an inductive heating system 2450, the thick wall 2440 can be heated. The outer wall 2430 can be porous, thus providing good insulation against heat loss from the thick wall 2440. The heating can be used for cooking, for heating material in a container, or for storing heated material. For example, the structure can be an open structure (e.g., without lid) for a pot and pan use for cooking. The structure can have a lid, for storing hot material. The thick wall can be heated, for example, by an inductive heater, to keep the material warm.

In some embodiments, components for mobile devices, such as cars, or motorcycles, airplanes, can employ the porous printed structures for light weight. For example, printed porous structures can include car structures, seat structures for cars or air planes, frames for cars or air planes, steering wheel for cars or air planes.

In some embodiments, the present invention discloses methods and systems for a casting process using 3D printing systems. A mold of an object can be printed using a 3D printing system, and then the mold can be used for casting the object, for example, by a lost wax or sand casting process. The mold can be destroyed during the casting process. A positive mold can produce a cast object. A negative mold can produce a mold for the object, which can be used to generate a cast object, e.g., by another cast process.

In general, 3D printers can produce low temperature objects, such as plastic or polymer based objects, due to the molten filament requirements. The low temperature printed objects can then be used for casting using high melting temperature materials to produce high temperature objects, such as metal or alloy objects. Multiple cast objects can be produced by using the printed object to form a metal mold.

FIGS. 25A-25G illustrate an investment casting process using a 3D printed mold according to some embodiments. In FIG. 25A, a positive mold 2510 of an object is printed, for example, by a 3D printer. The printed material can be a low melting temperature material, e.g., less than about 200 C, such as plastic or polymer (polylactic acid (PLA) or Acrylonitrile Butadiene Styrene (ABS)). In general, the mold 2510 is a few percent larger than the object to accommodate for the thermal expansion of the cast material. For example, for aluminum casting, the mold can be about 6% larger. The difference between the size of the cast object and the size of the mold is called a shrinkage allowance. The shrinkage allowance for metal casting can vary for different metals.

Thus, it can require experience in metal casting to be able to accurately judge the proper shrinkage allowance. Further, the actual size and shape of the cast object actually determines the actual shrinkage allowance. Also, different parts of a cast object can require different shrinkage allowances, for example, the top portion of the mold can have different shrinkage allowance as compared to the bottom portion, due to the presence of impurities and air bubbles at the top portion when the molten metal is poured.

In FIG. 25B, sprue and riser 2520 can be added to the mold 2510. The sprue and riser 2520 can be made of the same material as the mold 2510, or can be made of a low melting temperature material such as wax. The sprue and riser 2520 can be bonded to the mold 2510 by glue. In FIG. 25C, a coating 2530 can be formed outside the mold 2510. For example, the mold 2510 can be dipped in a ceramic paste and let dried to form the coating 2530.

In FIG. 25D, the mold 2510 (and the sprue and riser 2520) and the coating 2530 can be subjected to a high temperature anneal process. During the high temperature process, the mold material can be melted and evaporated, leaving a cavity 2522 in the shape and size of the mold (after accounted for the shrinkage allowance).

In FIG. 25E, a cast material 2540, such as a molten metal, can be poured in the cavity 2522, to form the cast object. The cast material is then allowed to cool down. In FIG. 25F, the coating 2530 can be broken into pieces 2532, leaving the cast material. The cast material is smaller than the mold 2510, due to the thermal expansion. In FIG. 25G, the sprue and riser 2520 is removed from the cast material, leaving the cast object 2542. The cast object 2542 can be identical to the mold 2510, if the shrinkage allowance is properly accounted for in the mold design. Otherwise, the cast object can be larger, smaller, or can be distorted in shape due to uneven thermal shrinkage.

Other variations can be used. For example, the mold 2510 can be placed in a container containing the ceramic paste. After the ceramic paste is dried and solidified, it can form a coating surrounding the mold 2510. The mold can also be made of wax.

Figure 26:
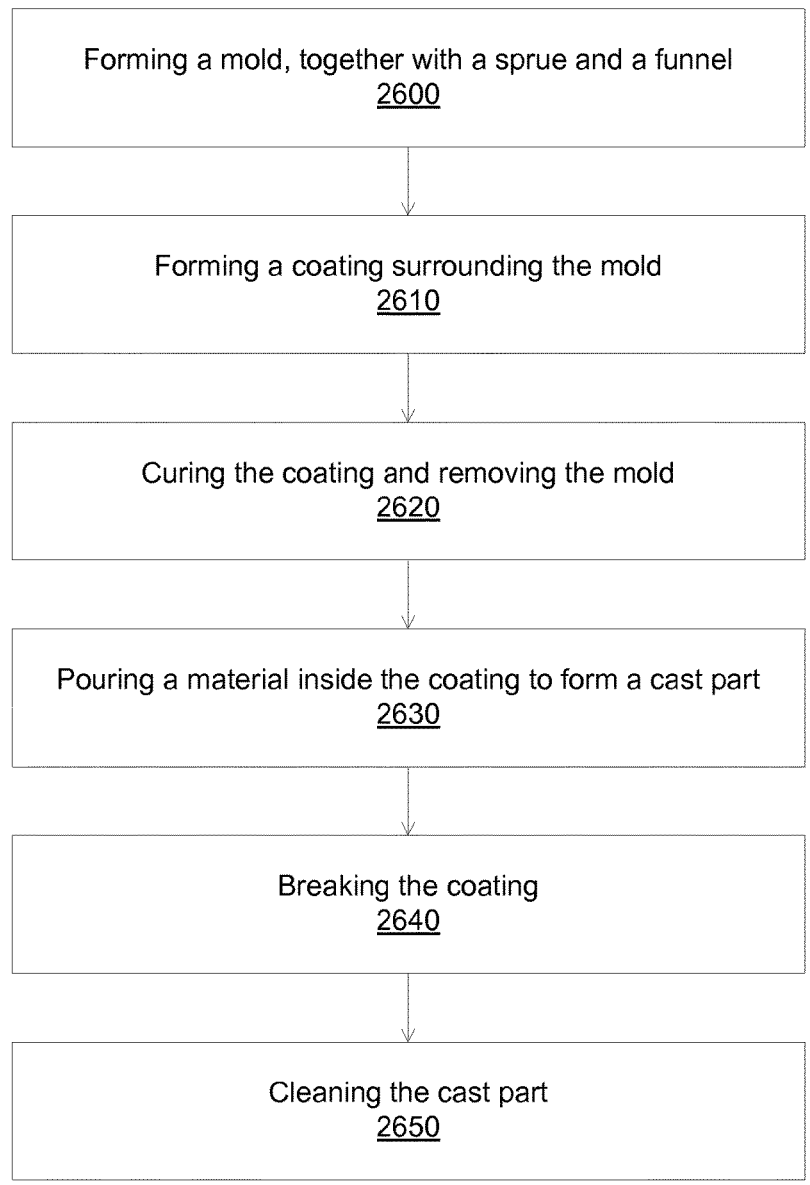
FIG. 26 illustrates a flow chart for a casting process according to some embodiments.

FIG. 26 illustrates a flow chart for a casting process according to some embodiments. Operation 2600 forms a mold, together with a sprue and a funnel. Operation 2610 forms a coating surrounding the mold. Operation 2620 cures the coating and removing the mold. For example, the mold can be made of low melting temperature materials, and the curing process at high temperature can melt and evaporate the mold material. Operation 2630 pours a material inside the coating to form a cast part. Operation 2640 breaks the coating. Operation 2650 cleans the cast part, such as removing the sprue and the funnel.

In some embodiments, the present invention discloses methods and systems for generating models of objects that can be used for printing molds. The models can allow more efficient printing, such as higher throughput and lower consumable materials. The models can include shell models, multiple component models, multiple shell models, multiple shell models with thicker wall thickness at connection points, and multiple models with mating structures for component alignment. In some embodiments, the multiple component models can include available components, e.g., components that are not 3D printed, or components that are mass produced such as by injection molding. In some embodiments, the models can be generated by a software.

In some embodiments, the present invention discloses methods and systems for casting objects using molds fabricated from the models of the objects. For example, a mold of the object can be printed using a shell model of the object. A mold of the object can be assembled from multiple components, which can be printed using a multiple component model of the object. A mold of the object can be assembled from a multiple component model, in which some components are printed and some components are not printed, e.g., readily available such as by a mass production process.

In some embodiments, the present invention discloses shell representations of the object, which include shell models and shell molds, e.g., molds with hollow interior. Since the mold can be destroyed during the casting process, a shell mold can be equally effective in the casting process. The shell mold can allow saving of materials and time, e.g., by printing only thin external shell walls of the object to form a shell mold. Optional internal support structures can be included for printing non-directly-printable overhang structures, e.g., structures that cannot be directly printed due to the overhang characteristic.

The term "model" refers to a software representation of the object, such as a 3D drawing or model. Thus a shell model can be constructed as a software representation, which can be inputted to a 3D printer to produce a shell mold. The term "mold" refers to a hardware representation of the object, e.g., having similar shape and size as the object, with different materials. The mold can be used for casting the object of desired characteristics. In the present description, the term "representation", "model", and "mold" sometimes can be used interchangeably, with proper meaning based on the context, e.g., a model is a software representation while a mold is a hardware representation of an object.

FIGS. 27A-27D illustrate shell representations according to some embodiments. A square object can be converted to a shell model (and shell mold) 2710, having only external wall with a hollow interior. The thickness of the wall can be 1 mm, or can be less than 5 mm, less than 2 mm, or less than 1 mm. The shell model or mold can have close wall structures, meaning the walls are interconnected so that the hollow interior is not in fluid communication with the external ambient.

Internal support structures 2720 can be included, for example, to support the non-printable overhang features, such as the top portion 2712 of the shell model or mold 2710.

The shell mold, e.g., a printed object from a shell model, can be equally effective in the casting process, since the hollow interior is sealed from the outside ambient, thus the investment coating, e.g., the ceramic coating that can be used as a mold for casting the object, only coat the external surfaces of the model.

FIG. 27C shows a flow chart for generating a shell model, e.g., a software representation of an object. In operation 2780, the shell model can have a hollow close interior, e.g., a cavity that is not communicated with the external ambient. In some embodiments, the shell model can have a uniform thickness. The shell model can include shell walls that are interconnected, e.g., the shell walls have two facing surfaces, one surface facing the external ambient and one surface facing the hollow interior. The shell model can have support structures, for example, to allow printing of walls that cannot be directly printed, such as horizontal walls or slanted walls that form an acute angle with the horizontal surface.

FIG. 27D shows a flow chart for casting an object using a shell model. A shell model can be provided, for example, by a software program. A software program can convert a solid model, e.g., a model without a hollow interior, to a shell model, e.g., a model with a hollow close interior. Alternatively, a user can design a shell model using a software program.

In operation 2790, a user can 27D prints a shell mold using the shell model. The shell mold can include shell walls. The shell mold can include close cavities. The shell mold can optionally include support structures. In operation 2791, a part can be cast using the shell mold.

Figure 28A:
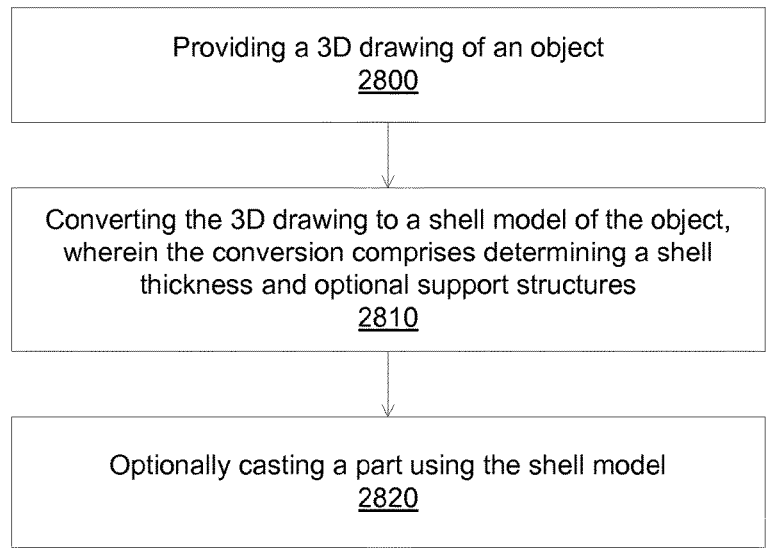
FIGS. 28A-28B illustrate flow charts for shell casting processes according to some embodiments.
Figure 28B:
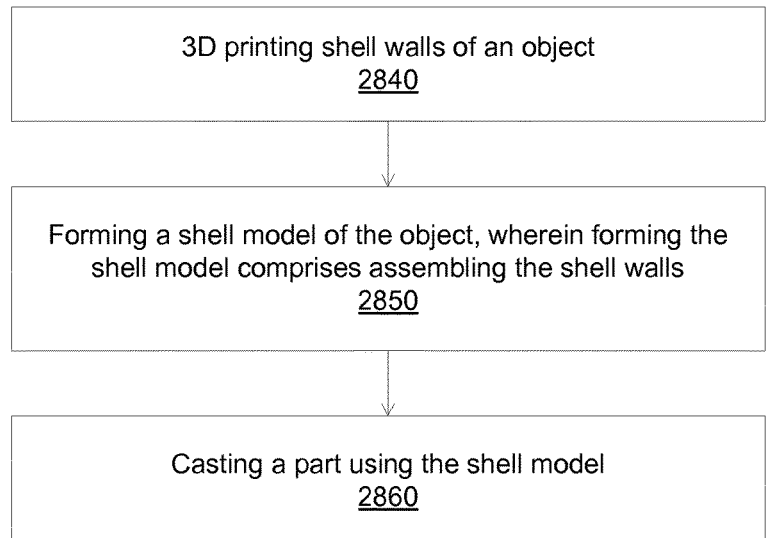

FIG. 28A-28B illustrate flow charts for shell casting processes according to some embodiments. A shell model can be generated, either converted from a solid model or designed by a software program. For example, a solid model can be designed by a CAD software program such as SolidWorks. The solid model is solid, e.g., there is no close cavities, e.g., cavities that are fluidly connected to the outside ambient. The solid model can be converted, for example, by a conversion software, to form a shell model, e.g., there are close cavities in the model. The shell model can have similar wall thicknesses, or can have variable wall thicknesses so that the shell model can be printed or so that the shell model can be free standing. The shell model can also be designed directly from the CAD software program, e.g., having shell walls coupled to each other to form external surfaces of the shell model.

In FIG. 28A, operation 2800 provides a 3D drawing of an object. Operation 2810 converts the 3D drawing to a shell model of the object. In some embodiments, the conversion can include determining a shell thickness and optional support structures for 3D printing. Operation 2820 optionally casts a part using the shell model, for example, by a lost wax casting or a sand casting process described above.

In FIG. 28B, operation 2840 prints shell walls of an object. For example, an object can be designed as a collection of shell walls, such as a shell model having multiple shell walls. Operation 2850 forms a shell model of the object. The information includes assembling the shell walls, such as gluing the shell walls, or mating the shell walls together. Operation 2860 casts a part using the shell model, for example, by a lost wax casting or a sand casting process described above.

In some embodiments, the present invention discloses modular models and molds, e.g., models and molds formed by multiple components. A model of the object can be separated into multiple components with each component allowing direct 3D printing. Since a typical object can require support structures, e.g., additional elements are needed to allow 3D printing such as support element for overhang features, an object mold directly printed can require extra elements, which can lead to additional processing steps to remove the extra elements.

It can be difficult to print a protrusion that forms an angle less than 45 degrees with the horizontal surface. Thus, in some embodiments, the present invention discloses splitting the object into multiple portions, with each portion not having difficult-to-print protrusions. For a horizontal protrusion, the object is split along a bottom surface of the protrusion (e.g., horizontal surface), to form a bottom portion and a top portion. The top portion and the bottom portion are then printed separated, before assembled together. For a slant protrusion, the object is first split along a bottom surface of the protrusion (e.g., horizontal surface) to form a bottom portion and a top portion. The bottom surface is chosen close to the slant surface of the protrusion, to prevent another slant surface when the object is rotated about 90 degrees. The bottom portion can be printed normally. The top portion can be rotated so that the slant surface becomes non-slanted, e.g., rotate about 90 degrees. If the top portion has no new slant protrusion, e.g., slant protrusion generated by rotating the top portion, then the top portion can be printed normally. If the top portion has new slant protrusion, a slant split can be performed (e.g., horizontal split), to form a bottom-top portion and a top-top portion. The slant split can be at a middle of the protrusion, thus the top-top portion can be printed normally since the protrusion is formed with a larger base than a top tip. The bottom-top portion can be rotated so that the split becomes a horizontal surface. The new slant protrusion becomes printable, since the base is larger than the tip. The process can be repeated until all portions of the object are printable.

In some embodiments, there can be two basic splits. A horizontal split to separate slant surface at 45 degrees: low slant surface is printable, high slant surface will undergo next split. A vertical split at large cross section surface for high slant surface. The vertical surface can be used as base to print In some embodiments, the present invention discloses separating the object into multiple components for 3D printing, with each components allowing direct 3D printing without support structures. The multiple component concept can simply the mold formation process and the casting process, for example, by eliminating the support structures, minimizing consumable materials and removing the steps of removing the support structures.

In some embodiments, the separation process can include separating into components having no non-printable overhang features, e.g., components that can be directly printed without support structures or components having printable overhang structures, and components having non-printable overhang features.

In general, a 3D printer can print overhang structures if the overhang structures have directions close to the vertical direction. For example, a 3D printer can print a tilted column if the tilted column makes an angle less than about 45 degrees with the vertical plane. Thus the overhang structures that can be directly printed by a 3D printer is called "printable overhang" in this specification. The overhang structures that cannot be directly printed by a 3D printer, for example, a structure that forms an angle larger than 45 degrees, such as a horizontal plate, is called "non-printable overhang" in this specification.

After the printable component is separated, the non printable component can also be printed, for example, because it can now be printed, or because it can be printed after a rotation process to make the large angle (the non-printable angle) becoming a small angle (the printable angle). For example, the components having non-printable overhang features can be rotated, such as 90 degree rotation, thus converting the non-printable overhang features into a printable overhang structures. The rotated components can then be directly printed.

In some embodiments, the multiple component separation process can include separating into 3D printing components and non-3D printing components, e.g., components readily available such as be a mass production process of injection molding.

FIGS. 29A-29C illustrate model separation processes according to some embodiments. In FIG. 29A, an object 2910 can have a non-printable overhang structure 2914, e.g., a horizontal component that cannot be easily printed by a 3D printer without support elements. The object 2910 can be separated along a separation line 2920. The separation line 2920 can be designed to separate the printable overhang structures from the non-printable overhang structures. The separation line 2920 can be designed to separate the object into multiple components that can be printable, e.g., there are no non-printable overhang structures. For example, the separation line 2920 can separate the object 2910 into a vertical component 2922, which can be printable from the perspective of the complete object. The separation line 2920 can separate the object 2910 into a horizontal component 2924, which cannot be printable from the perspective of the complete object, but which can be printable by itself. By separating the object 2910 into multiple components that can be directly printed, the object 2910 can be created by a 3D printer without support elements, by printing the components and then assembling the components together.

FIG. 29B shows a process to generate a modular model for an object. The modular model can include multiple components that can be printed and that can be assembled to form the object. Operation 2980 generates a model of an object. The model can include multiple components. The multiple components are configured to be 3D printed without support structures.

FIG. 29C shows a process to cast a part using a modular model. After separating the object into multiple components, the components can be printed and then assembled. The assembled and printed object can serve as a mold for casting a part.

Operation 2990 splits or separates an object into multiple components. The separation can be performed on a model of an object, e.g., a software representation of the object can be separated into multiple software representations, with each of the multiple software representations representing a component of the object. The multiple components can be configured to be 3D printed without support structures, such as without non-printable overhang structures. The multiple components can be configured so that the multiple components do not have protrusions having slant angles that prevent 3D printing without support structures. Operation 2991 3D prints the multiple components. Operation 2992 assembles the multiple components into a mold of the object. Operation 2993 casts a part using the assembled mold.

In some embodiments, the present invention discloses methods and systems to make an object to be printable without support components. An object can be rotated to eliminate or minimize non-printable overhang structures. An object can be separated into multiple components, with a separation process designed so that the components can be printed, for example, by rotating or by further separating into more components. In some embodiments, after separating into multiple components, each component can be printed without any addition process.

In some embodiments, non-printable overhang structures can be eliminated or minimized by rotating the object. For example, a non-printable overhang structure of an object in one direction can become a printable overhang structure in a different direction, since a structure can be a non-printable overhang structure because it forms a large angle, e.g., an angle that makes printing unpractical or impossible without support structures. By rotating the object, for example, at an angle and direction to make the large angle becoming small angle, e.g. an angle that makes printing possible, the object can become printable.

FIGS. 30A-30C illustrate examples of object rotations according to some embodiments. In FIG. 30A, an object 3010 can have a non-printable overhang structure 3020, e.g., a horizontal component that can make printing impossible without a support structure. By rotating the object 3010 an angle of 90 degrees counterclockwise, the overhang structure can be eliminated, resulting in an object without non-printable overhang structures. Other angles can be used, such as 180 degrees counterclockwise or clockwise.

In FIG. 30B, an object 3012 can have non-printable overhang structures 3022 and 3024. By rotating the object 3012 an angle of 180 degrees counterclockwise, the overhang structure can be eliminated, resulting in an object without non-printable overhang structures. Other angles can be used, such as 180 degrees clockwise.

FIG. 30C shows a flow chart for object rotation to allow printing. Operation 3090 rotates a model, e.g., a software representation of an object, to reduce or to minimize non-printable overhang structures.

In some embodiments, a rotation can eliminate non-printable overhang structures. However, the rotation process can render an object without a flat base, e.g., a horizontal bottom plane for used in many 3D printer. Thus a separation along a horizontal plane can be performed, separating the object into two components that can be printed on a printer with a flat base.

Figures 31A, 31B:
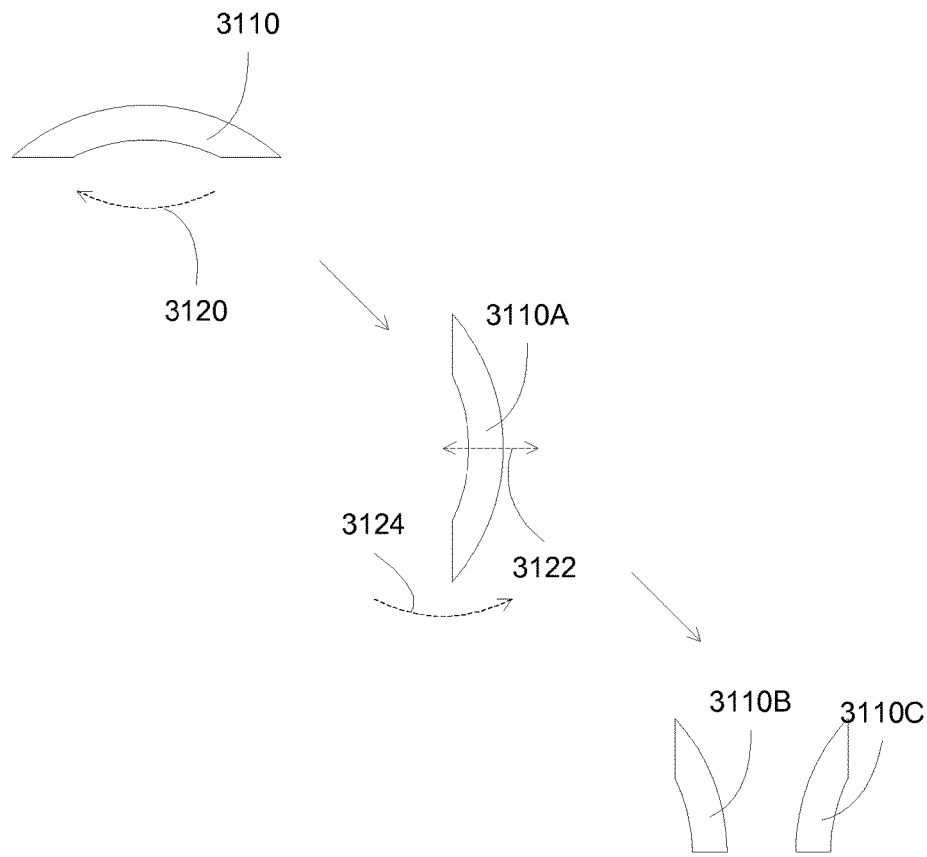
FIGS. 31A-31B illustrate examples of object rotations according to some embodiments.

FIGS. 31A-31B illustrate examples of object rotations according to some embodiments. In FIG. 31A, an object 3110 can have a non-printable overhang structure. By rotating the object 3110 an angle 3120 of 90 degrees clockwise, the overhang structure can be eliminated, resulting in an object without non-printable overhang structures. However, the rotated object 3110A does not have a flat horizontal surface, which makes printing on a flat platform impractical or impossible. Thus a separation 3122 can be used, separating the rotated object 3110A into two components. A first component 3110B can be directly printed. A second component 3110C can be rotated 3124 with a 180 degrees counterclockwise for printing. Other rotation angles and other separation cuts can be used, such as 90 degrees counterclockwise.

FIG. 31B shows a flow chart for object rotation to allow printing. Operation 3190 rotates a model, e.g., a software representation of an object, to reduce or to minimize non-printable overhang structures. Operation 3191 is optionally separation the rotated model along a horizontal plane. A top portion can be printed. A bottom portion can be rotated 180 degrees clockwise or counterclockwise so that it can be printed.

In some embodiments, a separation process, such as a separation along a horizontal plane, can eliminate all non-printable overhang structures. Thus by separating an object along one or more horizontal planes, all components of the object can be printed, e.g., the separation process can eliminate the non-printable overhang structures.

FIGS. 32A-32C illustrate examples of object separations according to some embodiments. In FIG. 32A, an object 3210 can have multiple non-printable overhang structures. By separating the object 3210, for example, along horizontal planes 3220 and 3222, the object 3210 can be separated into multiple components 3210A, 3210B, 3210C. The components 3210A, 3210B, 3210C can be directly printed, e.g., there is no longer any non-printable overhang structures in these components. An object can have multiple ways to convert the non-printable overhang structures into printable overhang structures. For example, object 3210 can be rotated, such as 90 degrees counterclockwise, instead of being separated.

In FIG. 32B, an object 3230 can have multiple non-printable overhang structures. By separating the object 3230, for example, along horizontal planes 3240 and 3242, the object 3230 can be separated into multiple components 3230A, 3230B, 3230C. The components 3230A, 3230B, 3230C can be directly printed, e.g., there is no longer any non-printable overhang structures in these components.

FIG. 32C shows a flow chart for object separation to allow printing. Operation 3290 separates the model into multiple components, so that at least a first component has no non-printable overhang structures.

In some embodiments, a separation process, such as a separation along a horizontal plane, can eliminate some non-printable overhang structures. Thus by separating an object along one or more horizontal planes, at least some components of the object can be printed, e.g., the separation process can eliminate the non-printable overhang structures.

FIGS. 33A-33C illustrate examples of object separations according to some embodiments. In FIG. 33A, an object 3310 can have a mixture of printable overhang structures and non-printable overhang structures. The object 3310 can be separated so that at least a printable overhang structure is separated from the object. By separating the object 3310, for example, along a horizontal plane 3320, the object 3310 can be separated into multiple components 3310A, 3310B. The component 3310A having only printable over hang structures can be directly printed. The component 3310B still has a non-printable overhang structure, which will need to be further processed before direct printing. The separation process has turned the object 3310 having non-printable overhang structures and printable overhang structures into components with non-printable overhang structures (and optional printable overhang structures) and components with only printable overhang structures.

In FIG. 33B, an object 3330 can have multiple non-printable overhang structures. By separating the object 3330, for example, along a horizontal plane 3340, the object 3330 can be separated into multiple components 3330A, 3330B. The component 3330A has only printable overhang structures, and can be directly printed. The component 3330B still has non-printable overhang structures, which will need to be further processed before direct printing. For example, component 3330B can be rotated 90 degrees counterclockwise to eliminate the non-printable overhang structures.

FIG. 33C shows a flow chart for object separation to allow printing. Operation 3390 separates the model into multiple components, so that some components have no non-printable overhang structures, and some components have non-printable overhang structures For example, the model can be separated into at least a first component having no non-printable overhang structures, and a second component having a non-printable overhang structure.

Figures 34A, 34B:
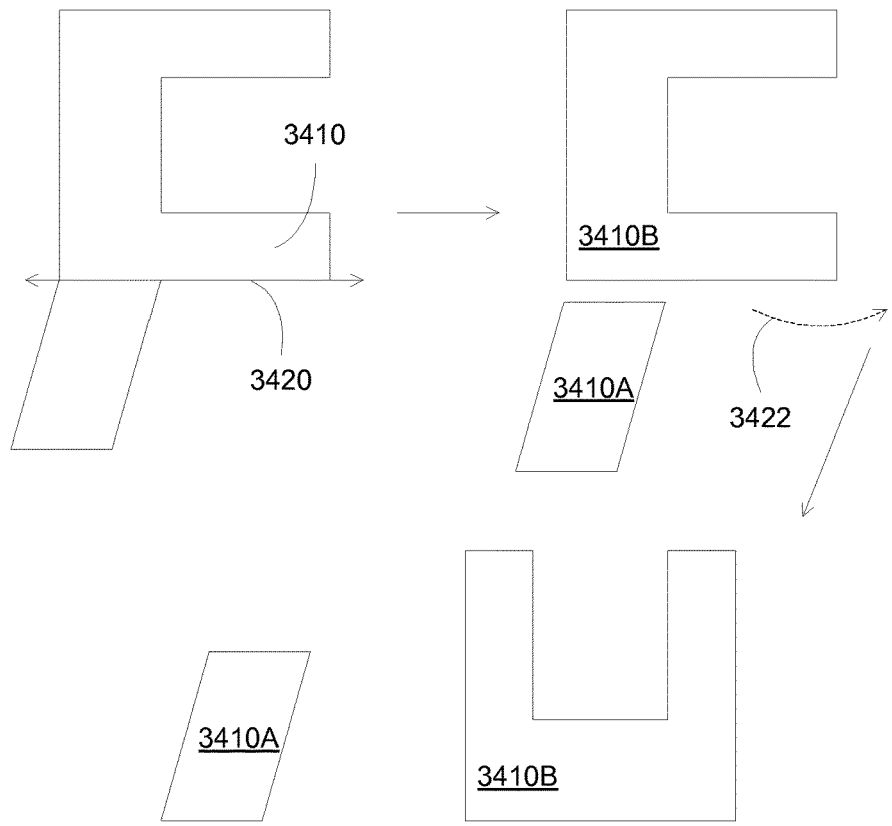
FIGS. 34A-34B illustrate examples of object separations according to some embodiments.

FIGS. 34A-34B illustrate examples of object separations according to some embodiments. In FIG. 34A, an object 3410 can have at least a non-printable overhang structure. The object 3410 can be separated to eliminate at least a non-printable overhang structure. By separating the object 3410, for example, along a horizontal plane 3420, the object 3410 can be separated into multiple components 3410A, 3410B. The component 3410A having only printable overhang structures can be directly printed. The component 3410B still has a non-printable overhang structure, which will need to be further processed before direct printing. Component 3410B can be rotated 3422, for example, 90 degrees counterclockwise, to eliminate the non-printable overhang structure.

FIG. 34B shows a flow chart for object separation to allow printing. Operation 3490 separates the model into multiple components, so that some components have no non-printable overhang structures, and some components have non-printable overhang structures For example, the model can be separated into at least a first component having no non-printable overhang structures, and a second component having a non-printable overhang structure. Operation 3491 rotates a component having non-printable overhang structures to eliminate or reduce the non-printable overhang structures.

Figures 35A, 35B:
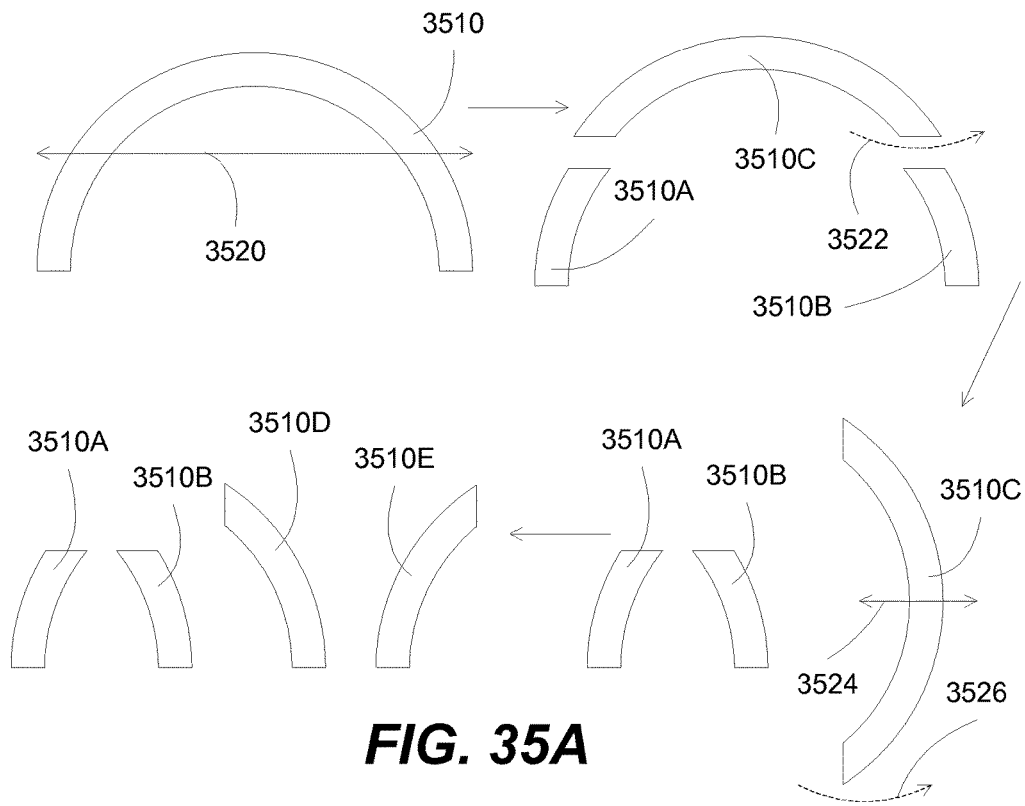
FIGS. 35A-35B illustrate examples of object separations according to some embodiments.

FIGS. 35A-35B illustrate examples of object separations according to some embodiments. In FIG. 35A, an object 3510 can have at least a non-printable overhang structure. By separating the object 3510, for example, along a horizontal plane 3520, the object 3510 can be separated into multiple components 3510A, 3510B, 3510C. The component 3510A and 3510B having only printable overhang structures, can be directly printed. The component 3510C still has a non-printable overhang structure, which will need to be further processed before direct printing. Component 3510C can be rotated 3522, for example, 90 degrees counterclockwise, to eliminate the non-printable overhang structure. A separation 3524 can be used, separating the rotated object 3510C into two components. A first component 3510D can be directly printed. A second component 3510E can be rotated 3526 with a 180 degrees counterclockwise for printing.

FIG. 35B shows a flow chart for object separation to allow printing. Operation 3590 separates the model into multiple components, so that some components have no non-printable overhang structures, and some components have non-printable overhang structures For example, the model can be separated into at least a first component having no non-printable overhang structures, and a second component having a non-printable overhang structure. Operation 3591 rotates a component having non-printable overhang structures to eliminate or reduce the non-printable overhang structures. Operation 3592 is optionally separating the rotated component having non-printable overhang structures along a horizontal plane.

In some embodiments, a separation process can be provided for a range of angles. Then a specific angle can be selected to reduce or minimizing a non-printable overhang structure.

Figures 36A, 36B:
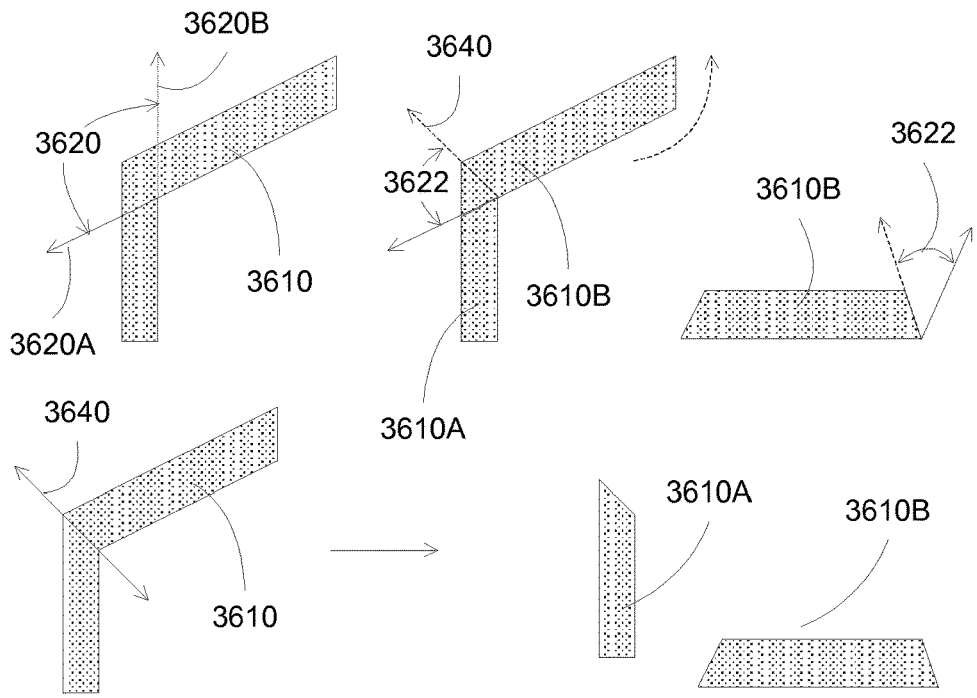
FIGS. 36A-36B illustrate examples of object separations according to some embodiments.

FIGS. 36A-36B illustrate examples of object separations according to some embodiments. In FIG. 36A, an object 3610 can have at least a non-printable overhang structure. The object 3610 can be separated along different directions, for example, from direction 3620A to direction 3620B. The different directions can be characterized by an angle 3620, made with a certain direction, such as direction 1120A.

The different separation directions can form different components 3610A and 3610B. By rotating component 3610B, the separation can generate printable component 3610A, and a component 3610B that may or may not be directly printed, depending on the direction of separation.

By separating the object 3610 along a direction 3640 which forms an angle 3622, for example, the component 3610B can be directed printed. Other directions can also be used, but some directions should be avoided, such as direction 3620A, since it can leave component 3610B with an overhang.

FIG. 36B shows a flow chart for object separation to allow printing. Operation 3690 separates the model into multiple components, so that some components have no non-printable overhang structures, and some components have non-printable overhang structures. The separation can be performed on a range of cut angles. The separation can be performed on different directions or planes or surfaces. Thus the separation can provide a set of different multiple components, which is a function of the separation characteristic.

Operation 3691 rotates a component of the multiple components to eliminate or reduce the non-printable overhang structures. For example, each component of the set of different multiple components can be rotated. Operation 3692 optionally selects a separation among the different separations, such as selecting a cut angle in the range of the cut angles, or a direction in the range of separation directions. The selection is designed to minimize o eliminate or reduce the non-printable overhang structures.

Figure 37:
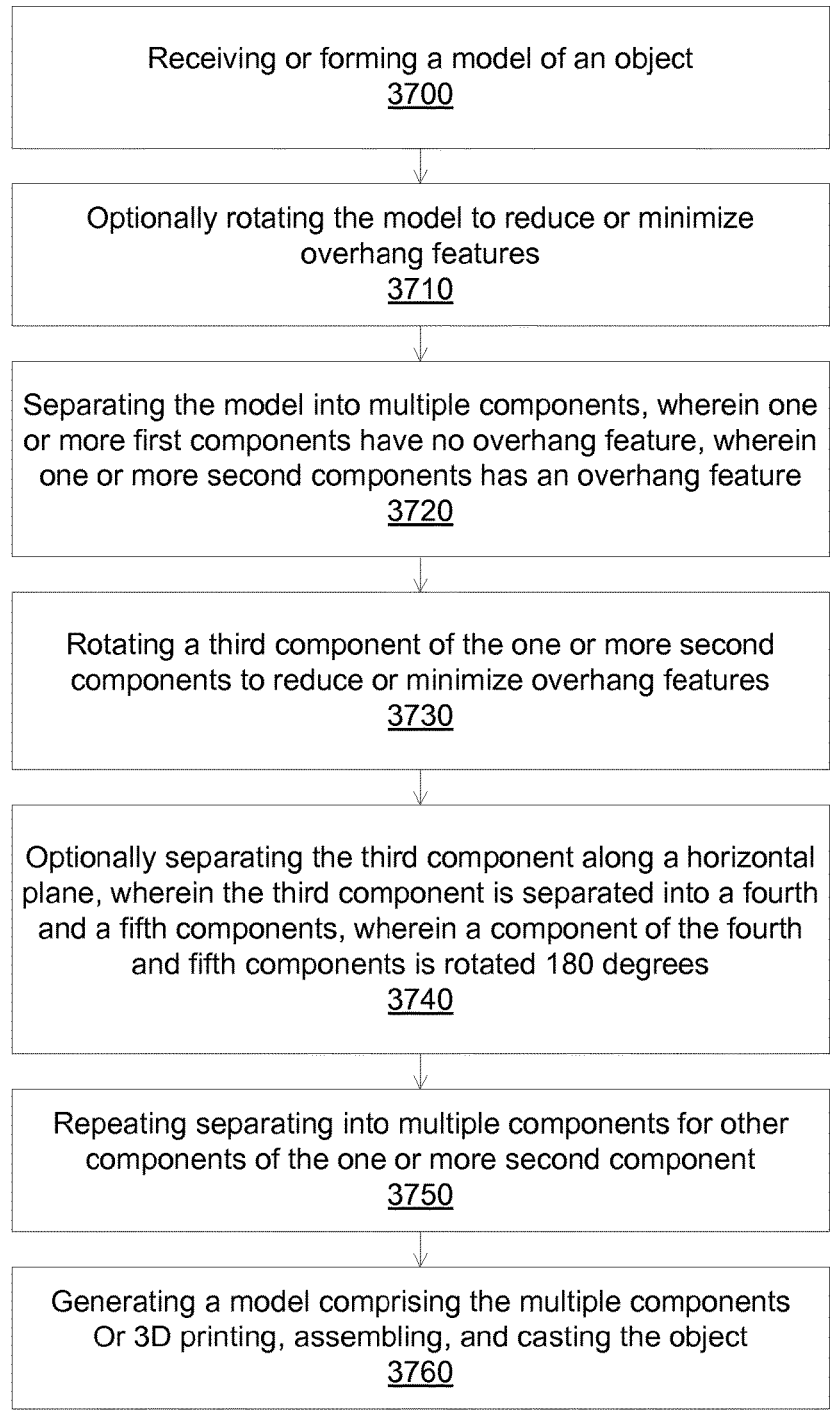
FIG. 37 illustrates a flow chart for generating a model having multiple components according to some embodiments.

FIG. 37 illustrates a flow chart for generating a model having multiple components according to some embodiments. Operation 3700 receives or forms a model of an object. For example, a model can be received from an external source. Alternatively, the model can be generated. Operation 3710 optionally rotates the model to reduce or minimize overhang features. Operation 3720 separates the model into multiple components, wherein one, some, or all components have no overhang feature. Optionally, one or more components has an overhang feature. Operation 3730 rotates another component of the one or more second components to reduce or minimize overhang features. Operation 3740 optionally separates the another component along a horizontal plane, wherein the third component is separated into a fourth and a fifth components, wherein a component of the fourth and fifth components is rotated 180 degrees. Operation 3750 repeats separating into multiple components for other components of the one or more second component. Operation 3760 generates a model comprising the multiple components, or 3D prints, assembles, and casts the object.

Figure 38:
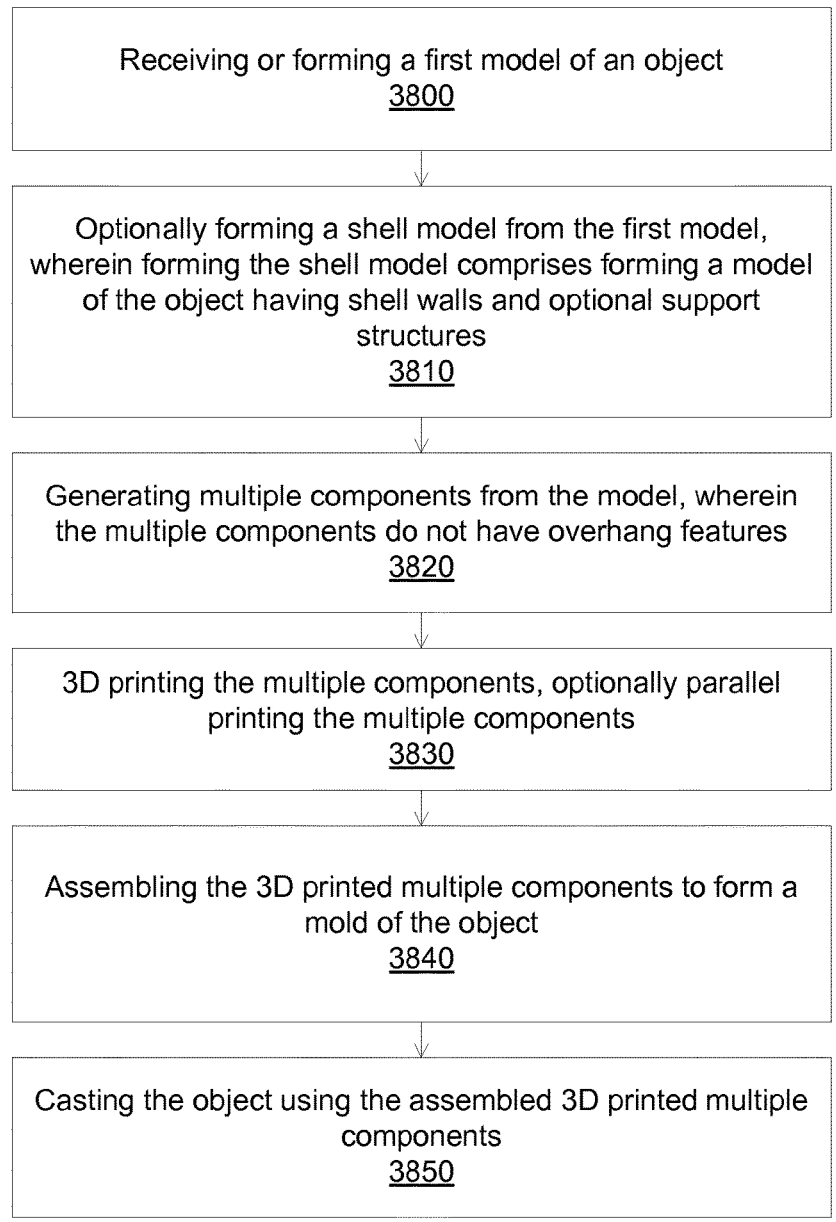
FIG. 38 illustrates a flow chart for casting multiple component model according to some embodiments.

FIG. 38 illustrates a flow chart for casting multiple component model according to some embodiments. Operation 3800 receives or forms a first model of an object. Operation 3810 optionally forms a shell model from the first model, wherein forming the shell model comprises forming a model of the object having shell walls and optional support structures. Operation 3820 generates multiple components from the model, wherein the multiple components do not have overhang features. Operation 3830 3D prints the multiple components. The printing process can include serially or parallelly printing the multiple components. For example, all components can be printed at a same time, e.g., on multiple different printers for faster throughput. Operation 3840 assembles the 3D printed multiple components to form a mold of the object. Operation 3850 casts the object using the assembled 3D printed multiple components.

In some embodiments, the present invention discloses methods and systems for parallel printing the multiple components. 3D printing can be time consuming, thus by parallel printing the components, faster object printing can be achieved. After the model or object is separated into multiple components, the components can be printed in parallel, meaning multiple printing machines can be used to print the components at a same time. A same number of printers can be used, thus every component can be printed at a same time. Less number of printers can be used, thus two components having short print times (e.g., simple parts or small parts) can be printed in series in one printer, while a component having a long print time (e.g., complicate parts or large parts) can be printed on one printer, for example, at a same time when the two components are printed in series in the other printer.

In some embodiments, the present invention discloses methods and systems for hybrid forming models or objects. After the model or object is separated into multiple components, some components can be printed and some components can be mass produced, such as by injection molding. In some embodiments, the printable components can be parallel printed.

FIGS. 39A-39C illustrate models and casting processes for multiple components according to some embodiments. To facilitate and/or simplify the printing process, an object can be separated into components that can be obtained by a non-printing process, such as a mass production process of injection molding. The object can be separated into components so that all components can be obtained by non-printing processes. The object can be separated into components so that some components can be obtained by non-printing processes, and some components need to be printed.

FIG. 39A shows an object 3900 that can be separated into two components 3910 and 3920. Component 3910 can be printed be a 3D printer. Component 3920 can be obtained from a non-printing source, such as by an injection molding process. For example, component 3920 can be a flat planar plate, thus can be made by cutting a plate stock, by punching a plate stock, or by injection molding from a mold. Component 3910 can be a special part, thus can be made by a 3D printing process.

FIG. 39B shows a flow chart for a model separation process according to some embodiments. Operation 3980 separates the model into multiple components, including a first component which can be made by 3D printing, and a second component which can be obtained from a non-3D printing source or process.

FIG. 39C shows a flow chart for a casting process according to some embodiments. Operation 3990 prints a first component of an object. Operation 3991 assembles the first component with a second component. The second component can be not 3D printed. The second component can be obtained from an available source. For example, the second component can be obtained by a non-printing process. Alternatively, the second component can also be printed, but at an earlier time so that when the first component is being printed, the second component is readily available. Operation 3992 casts an object using the assembled components as a mold.

In some embodiments, the present invention discloses methods and systems for assembling the multiple components. The components can have mating components, such as pins, ridges, or dowels, thus allowing alignments of the adjacent components. For shell components, the thickness of the shell can be increased toward the interior portion, e.g., toward the hollow cavity in order to not affecting the size and shape of the mold. The shell thickness increase can also allow the inclusion of mating components, which can facilitate the alignment of the components during assembly.

Figure 40A:
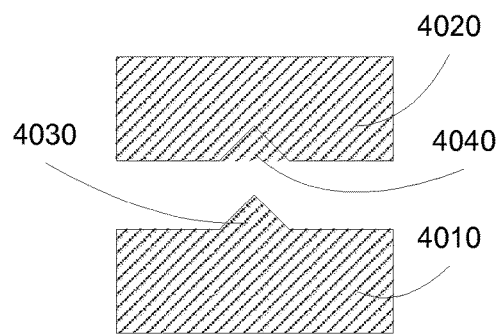
FIG. 40A-40D illustrate mating components for multiple component models or objects according to some embodiments.

FIG. 40A-40D illustrate mating components for multiple component models or objects according to some embodiments. In FIG. 40A, a mating component 4030 and 4040 can be put on mating surfaces of a component 4010 and 4020, respectively. The mating components can include a male and a female portions, which can be mated together. The mating components 4030 and 4040 can be formed on a small area of the mating surfaces. The mating components 4030 and 4040 can be mated together, meaning one can be the complimentary image of the other, so that they can fit together. For example, mating component 4030 can have a pin shape, such as a pyramid pin, while mating component 4040 can have a hollow pin shape, e.g., a pyramid hole or a negative or complimentary image of the pin, so that the two mating components can fit together. The mating components can have the shape of a ridge, e.g., long trapezoid or triangle cross section trapezoid. The mating components can be designed so that the two components 4010 and 4020, after being separated from the object for ease of printing, can be assembled together in a proper way.

Figure 40B:
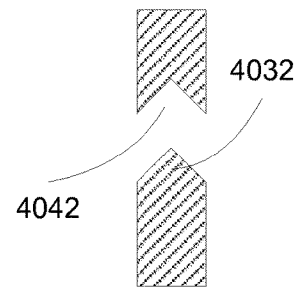

In FIG. 40B, the mating components 4032 and 4042 can be cover the mating surfaces, such as forming a ridge on a shell wall.

Figure 40C:
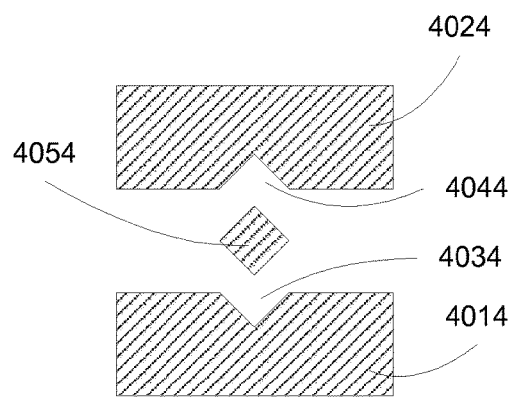
Figure 40D:
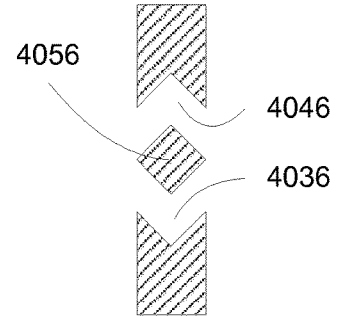

In FIGS. 40C-40D, the mating components 4034/4036 and 4044/4046 can be put on components 4014 and 4024, respectively. The mating components 4034/4036 and 4044/4046 can have female portions, mating together by male portions 4054/4056. The mating components 4034/4036 and 4044/4046 can be formed on a small area of the mating surfaces (FIG. 40C), or can cover the mating surfaces (FIG. 40D). The mating components can have a dowel configuration, e.g., forming two cavities 4034/4036 and 4044/4046 in the components 4014/4024, and the component 4014/4024 can be mated with the help of dowels 4054/4056.

In some embodiments, the mating components are configured to facilitate 3D printing, e.g., avoiding non-printable overhang structures. Thus slanted angles can be used, such as triangle shape, trapezoid, or rhombus shapes. Cylindrical shapes can be used with printing consideration, such as orientation, since a bottom flat surface of the cylinder can be easily printed, while a top flat surface of the cylinder might need support structures to allow printing.

FIGS. 41A-41B illustrate flow charts for mating processes of multiple component models or objects according to some embodiments. In FIG. 41A, operation 4100 forms mating structures on two components, wherein the mating structures are configured to provide alignment for the two components when assembled together. The mating components can include a male portion and a female portion, such as a pin and a cavity having pin shape, or a ridge and a cavity having ridge shape, disposed on two opposite surfaces of the components to be mated together. The mating components can include two female portions, such as two cavities, disposed on two opposite surfaces of the components to be mated together. An external male portion, such as a dowel that fit into the two cavities, can be used for connecting the two components.

The model, e.g., a software representation of the object, can be formed with the mating structures, for example, on the multiple separated components. The mold, e.g., an object used for casting the desired part, can be printed with the mating structures, for example, on the multiple separated components. The part, e.g., the desired object, can be cast using the mold with the components assembled together, using the mating structures as alignment guides.

In FIG. 41B, operation 4120 provides two components of a model, wherein the two components are configured to be assembled together, wherein the two components each comprises a surface facing each other when assembled. Operation 4130 forms mating structures on the two components, wherein the mating structures are disposed on the surface, wherein the mating structures are configured to provide alignment for the two components. Operation 4140 3D prints the two components with the mating structures.

In some embodiments, the wall of the object can be enlarged, for example, to facilitate the assembling of the separated components, especially for the shell models. The thickness increase for component walls can be toward the interior cavity of the model, so that the increase does not interfere with the size and shape of the object.

Figure 42A:
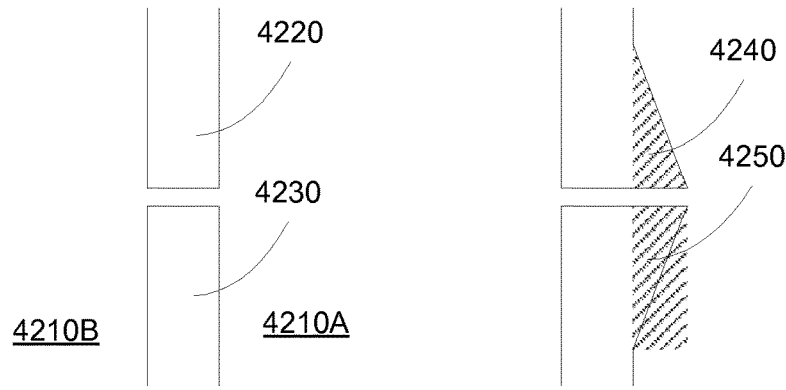
FIG. 42A-42C illustrate wall thickness increases for shell models or objects according to some embodiments.
Figure 42B:
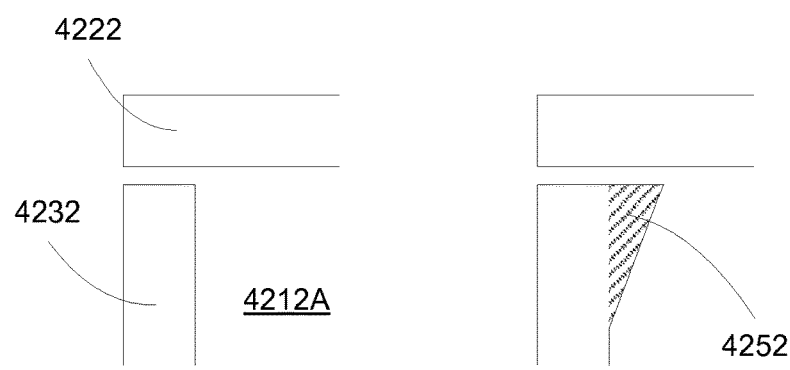
Figure 42C:
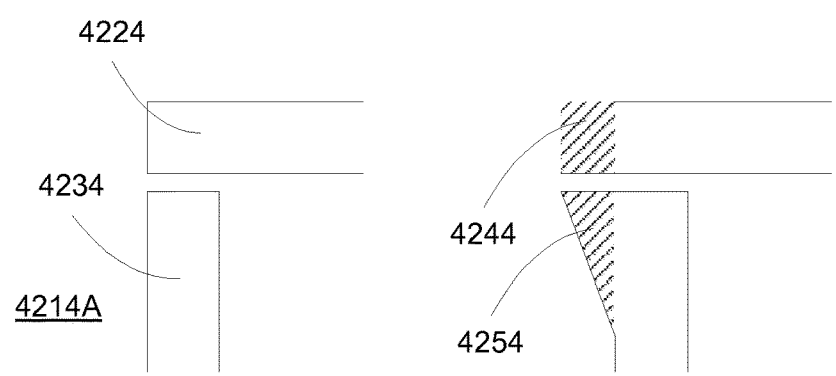

FIG. 42A-42C illustrate wall thickness increases for shell models or objects according to some embodiments. In FIG. 42A, two walls 4220 and 4230, from two separated components of an object, are positioned to be assembled together. As shown, the walls 4220 and 4230 can have two sides, an interior side facing the interior cavity 4210A, and an external side facing the outside ambient 4210B. The walls 4220 and 4230 can have materials 4240 and 4250 added to the interior side, e.g., the side facing the interior cavity. The added materials can be used to facilitate the assembling of the walls 4220 and 4230, for example, by increase the mating surfaces between the two walls. The added materials can be added in a slanted angle, e.g., forming a printable overhang structures coupled to the wall surfaces.

FIGS. 42B and 42C show variations of the added materials, such as added material 4252, adding to a wall 4232 at an interior side facing the interior cavity 4212A. The added material 4252 can be added only to wall 4232. There can be no materials added to the other wall 4222, since there can be enough mating surface at wall 4222. The added materials 4244/4254 can be added to walls 4224/4234, at the interior side facing the interior cavity 4214A, to increase the mating surfaces between two walls, and also to not interfere with the size and shape of the object after the walls are assembled together.

Figure 43A:
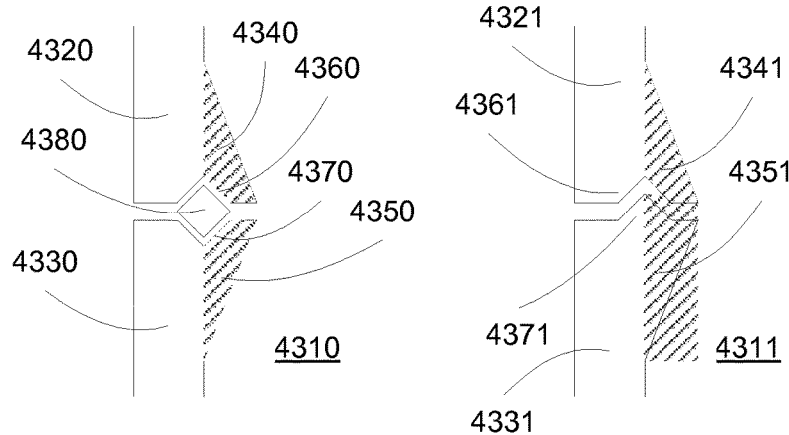
FIG. 43A-43C illustrate mating components at increased wall thickness for shell models or objects according to some embodiments.
Figure 43B:
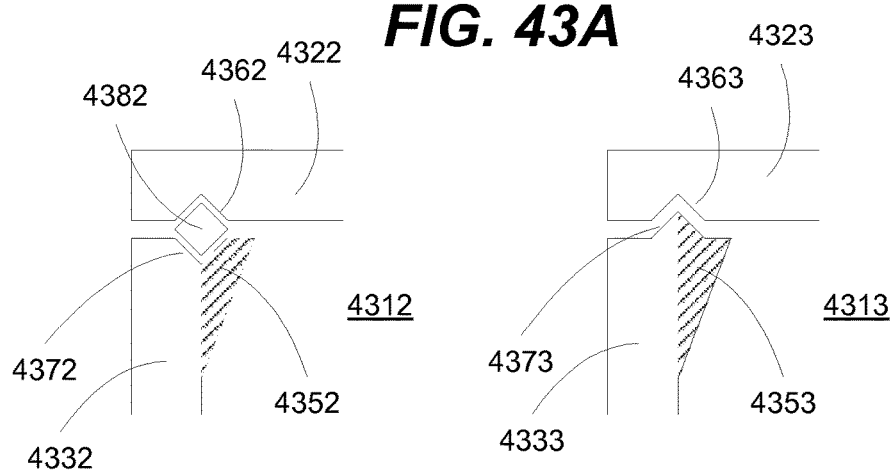
Figure 43C:
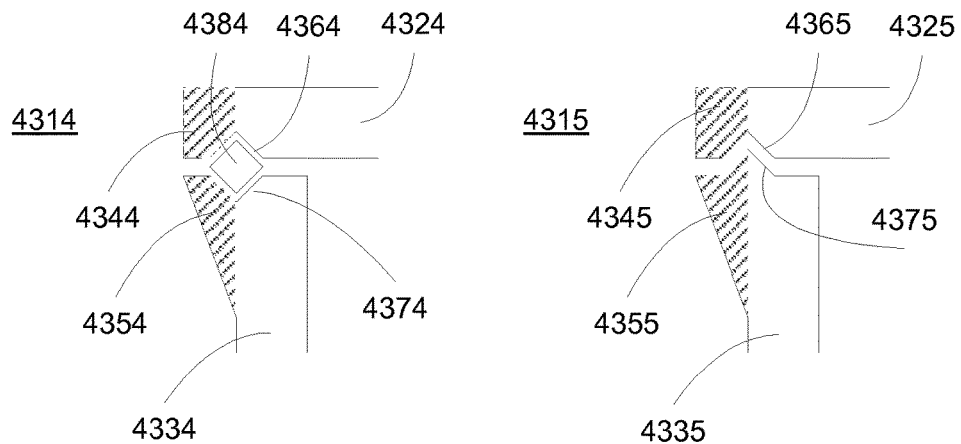

FIG. 43A-43C illustrate mating components at increased wall thickness for shell models or objects according to some embodiments. In FIG. 43A, two walls 4320 and 4330, from two separated components of an object, are positioned to be assembled together. As shown, the walls 4320 and 4330 can have two sides, an interior side facing the interior cavity 4310, and an external side facing the outside ambient. The walls 4320 and 4330 can have materials 4340 and 4350 added to the interior side, e.g., the side facing the interior cavity.

The mating structures 4360, 4370, and 4380 can be added to the mating surfaces of the thickened walls 4320 and 4330. The added materials 4340 and 4350 can facilitate the making of the mating structures 4360 and 4370. The mating structures 4360, 4370, and 4380 can be in the formed on connecting dowel, e.g., dowel 4380 is used to connect two cavities 4360 and 4370 on walls 4320 and 4330.

The mating structures 4361 and 4371 can be added to the mating surfaces of the thickened walls 4321 and 4331, having added materials 4341 and 4351. The mating structures 4361 and 4371 can be in the formed of connecting pin or ridge, e.g., pin 4371 can be mated with cavity 4311.

FIG. 43B shows a variation of the mating structures on added materials, such as dowel mating structure 4362, 4372, and 4382 on wall 4322 and on wall 4332 having added material 4352 at an interior side facing the interior cavity 4312. The mating structure can be in the form of pin mating structure 4363 and 4373 on wall 4323 and on wall 4333 having added material 4353 at an interior side facing the interior cavity 4313.

FIG. 43C shows a variation of the mating structures on added materials, such as dowel mating structure 4364, 4374, and 4384 on wall 4324 having added material 4344 and on wall 4334 having added material 4354 at an interior side facing the interior cavity 4314. The mating structure can be in the form of pin mating structure 4365 and 4375 on wall 4325 having added material 4345 and on wall 4335 having added material 4355 at an interior side facing the interior cavity 4315.

FIGS. 44A-44C illustrate flow charts for assembling multiple components according to some embodiments. In FIG. 44A, operation 4400 adds materials to end portions of two adjacent components to increase a contact surface between the two adjacent components.

In FIG. 44B, operation 4420 adds materials to end portions of two adjacent components to increase a contact surface between the two adjacent components. Operation 4430 forms mating structures on the contact surface of the two adjacent components.

In FIG. 44C, operation 4450 provides two components of a model, wherein the two components are configured to be assembled together, wherein the two components each comprises a surface facing each other when assembled. Operation 4460 adds materials to end portions of the two adjacent components to increase a contact surface between the two adjacent components for allowing forming mating structures. Operation 4470 3D prints the two components with the increase contact surface and the mating structures.

In some embodiments, the present invention discloses methods and systems for surface treatment of the 3D printed molds. The 3D printed object can have lines, for example, caused by the movements of the filament. Thus the surface of the 3D printed object can be rough, e.g., not smooth enough, and thus can require post surface finishing of the cast parts.

In some embodiments, the surface of the 3D printed object, e.g., the object that can be used as mold for casting a metal part, can be smoothened, for example, by solvent vapor (such as acetone for plastic), by sanding, or by a smooth coating, such as a spray coating or a dip coating or a wax coating.

Figure 45A:
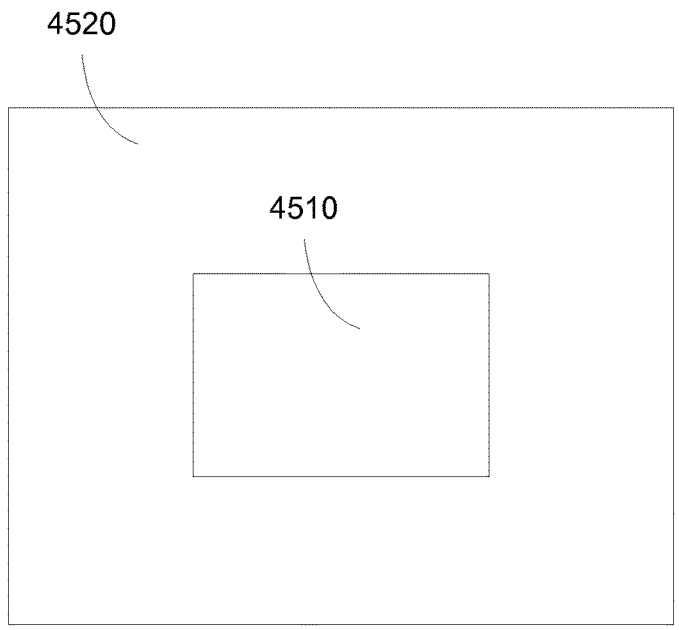
FIGS. 45A-45B illustrate surface treatments for 3D printed objects according to some embodiments.
Figure 45B:
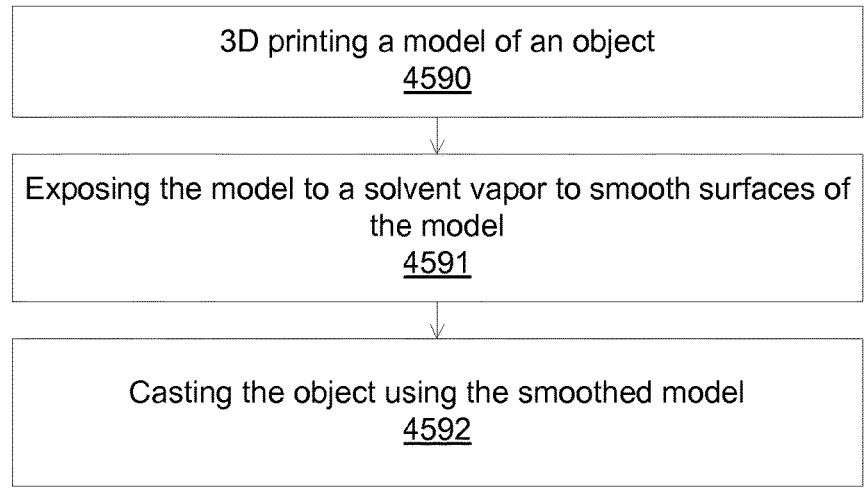

FIGS. 45A-45B illustrate surface treatments for 3D printed objects according to some embodiments. In FIG. 45A, a plastic object 4510 can be placed in a chamber, and a solvent vapor 4520, such as acetone vapor or hot acetone vapor, can be introduced to the chamber. The solvent vapor can be smoothens the surface of the object. In general, the solvent vapor can be chosen so that it reacts with the material of the object, to smooth out the surface. Other methods can be used, such as a dip coating of a liquid coating, which can harden into a solid coating that is smooth. A wax coating can be used, using hands or equipment to spread the wax over the outer surfaces of the object, providing a smooth surface. Sanding methods can be used.

In FIG. 45B, operation 4590 3D prints a model of an object. Operation 4591 smoothen the surfaces of the object, for example, by exposing the object to a solvent vapor to smoothen surfaces of the object. Operation 4592 cast a part using the smooth object.

In some embodiments, the present invention discloses methods and systems for a combinatorial casting of objects. Multiple processing conditions can interfere with the precision of the cast objects, such as the thermal expansion of the material being cast, which requires that the mold to be a few percents larger to accommodate for the thermal expansion at high temperature, or the surface treatment process to achieve a smooth surface while maintaining the desired precision. In some embodiments, multiple molds can be prepared for casting, with different molds having different size or process conditions. The different molds can be prepared in series, using data from the previous molds in the preparation of the current molds. The different molds can be prepared together, using a combinatorial process to cover the process variables to allow at least a cast object with the desired characteristics.

For a casting process, the material, especially metal, can shrink. In theory, the shrink factor is the thermal expansion coefficient. But in practice, there can be slight variations, based on multiple factors, such as geometry (small areas v. large areas), material purity, nano porous portions, etc. 3D printing molds can be repeated to address the issue. 3D printing can be fast, thus a new mold can be prepared in a few hours. In addition, corrections for casting precision can be made by software before printing. The multiple molds can be made at a same time for saving time. Further, molds with different surface treatment processes, e.g., different time exposure of acetone vapor) can be used to assess different tolerance variations.

Figure 46A:
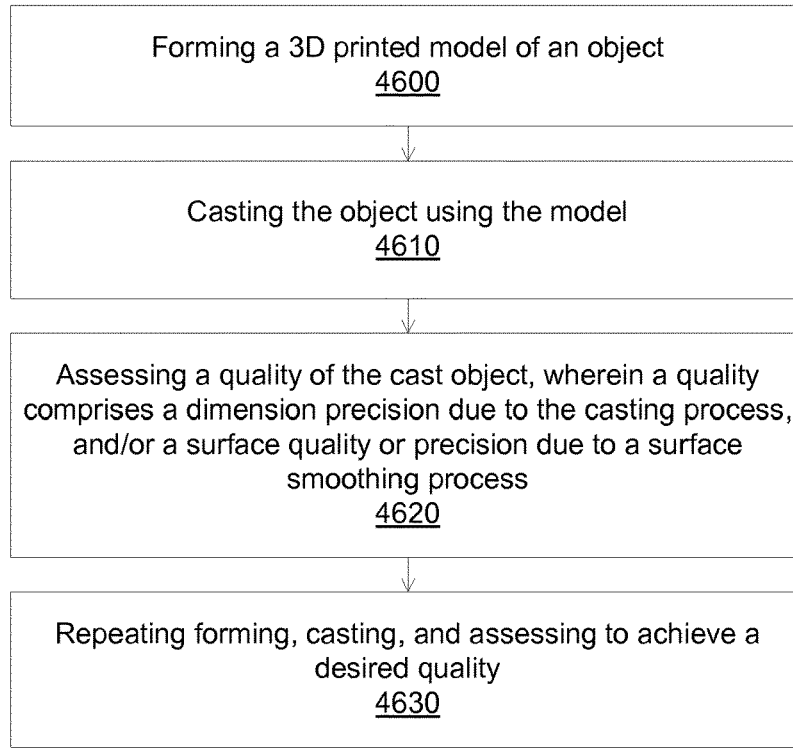
FIGS. 46A-46B illustrate flow charts for combinatorial casting of objects according to some embodiments.
Figure 46B:
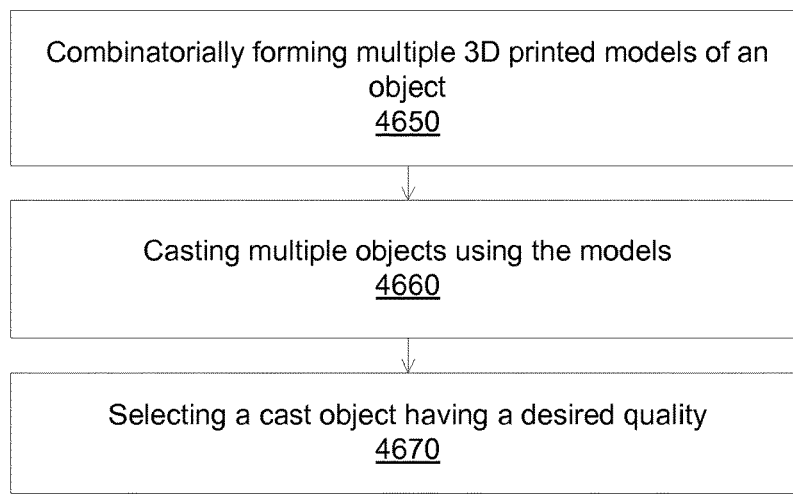

FIGS. 46A-46B illustrate flow charts for combinatorial casting of objects according to some embodiments. In FIG. 46A, operation 4600 forms a 3D printed model of an object. Operation 4610 casts the object using the model. Operation 4620 assesses a quality of the cast object, wherein a quality comprises a dimension precision due to the casting process, and/or a surface quality or precision due to a surface smoothing process. The quality can include a size accuracy, a resolution or dimension accuracy, and a surface treatment parameter to achieve the desired quality. Operation 4630 repeats forming, casting, and assessing to achieve a desired quality.

In FIG. 46B, operation 4650 combinatorially forms multiple 3D printed models of an object. Operation 4660 casts multiple objects using the models. Operation 4670 selects a cast object having a desired quality.

In some embodiments, the present invention discloses methods and systems for casting objects from 3D printed objects, together with having vent channels for evacuating air during the pouring of cast materials. The vent channels can be small enough to prevent the cast material from entering the vent channels, and large enough to allow air to pass through. For example, the vent channel can have a width of between 30 and 200 microns, such as between 50 and 150 micron, or about 100 microns. Vacuum suction can also be applied to the vent channel to assist in evacuating the air.

In some embodiments, after the 3D object is formed, for example, by being printed, or by assembling from 3D printed portions (with optional non-3D printed portions), a stripe can be attached to the 3D object. The stripe can be attached to an external surface of the 3D object, and a portion of the stripe can penetrate into the object interior. The stripe can have a width between 30 and 500 microns, such as between 50 and 300 microns, or between 100 and 200 microns. The stripe can have a length of greater than 1 mm, such as between 5 and 50 mm. The stripe can be coupled to a protruded portion of the 3D object, e.g., a portion that does not allow an easy flow of cast material from the sprue line, for example, due to trapped air in the cavity (of the mold) corresponded to the protrusion (of the 3D object).

A ceramic coating can be formed surrounding the 3D object, and also surrounding the stripe. The ceramic coating and the 3D object can be annealed, for example, to sinter the ceramic material. The 3D object can be removed during the annealing process, for example, by being evaporated or melted during the annealing process (even at temperature below the highest annealing temperature). The stripe can be removed, leaving a vent channel that can allow air to escape the mold, while preventing the cast material from leaving the mold.

A cast material can be poured into the mold, e.g. the space left by the removal of the 3D object. A vacuum pump can be coupled to the vent channel to assist in the evacuation of air.

FIGS. 47A-47G illustrate an investment casting process using a 3D printed mold according to some embodiments. In FIG. 47A, a positive mold 4710 of an object is printed, for example, by a 3D printer. The printed material can be a low melting temperature material, e.g., less than about 200 C, such as plastic or polymer (polylactic acid (PLA) or Acrylonitrile Butadiene Styrene (ABS)).

In FIG. 47B, sprue and riser 4720 can be added to the mold 4710. The sprue and riser 4720 can be made of the same material as the mold 4710, or can be made of a low melting temperature material such as wax. The sprue and riser 4720 can be bonded to the mold 4710 by glue. A stripe 4725 can be attached to the mold 4710, for example, by pressing against an external surface of the mold 4710 so that a portion of the stripe is embedded in the mold 4710. The stripe can be attached to an protrusion portion of the mold 4710, e.g., a cavity portion of a coating 4730 which will form surrounding the mold 4710. The stripe can assist in venting air in the cavity portion, prevent air bubbles.

In FIG. 47C, a coating 4730 can be formed outside the mold 4710. For example, the mold 4710 can be dipped in a ceramic paste and let dried to form the coating 4730.

In FIG. 47D, the mold 4710 (and the sprue and riser 4720) and the coating 4730 can be subjected to a high temperature anneal process. During the high temperature process, the mold material can be melted and evaporated, leaving a cavity 4722 in the shape and size of the mold (after accounted for the shrinkage allowance). The stripe 4725 can be removed 4727 from the coating 4730, leaving a vent channel 4729.

In FIG. 47E, a cast material 4740, such as a molten metal, can be poured in the cavity 4722, to form the cast object. Air in the cavity of the coating 4730 can be evacuated by the vent channel 4729, while cast material is blocked. Optionally, a vacuum mechanism can be used to assist in evacuating the air inside the coating 4730. The cast material is then allowed to cool down. In FIG. 47F, the coating 4730 can be broken into pieces 4732, leaving the cast material. The cast material is smaller than the mold 4710, due to the thermal expansion. In FIG. 47G, the sprue and riser 4720 is removed from the cast material, leaving the cast object 4742. The cast object 4742 can be identical to the mold 4710, if the shrinkage allowance is properly accounted for in the mold design. Otherwise, the cast object can be larger, smaller, or can be distorted in shape due to uneven thermal shrinkage.

Figure 48:
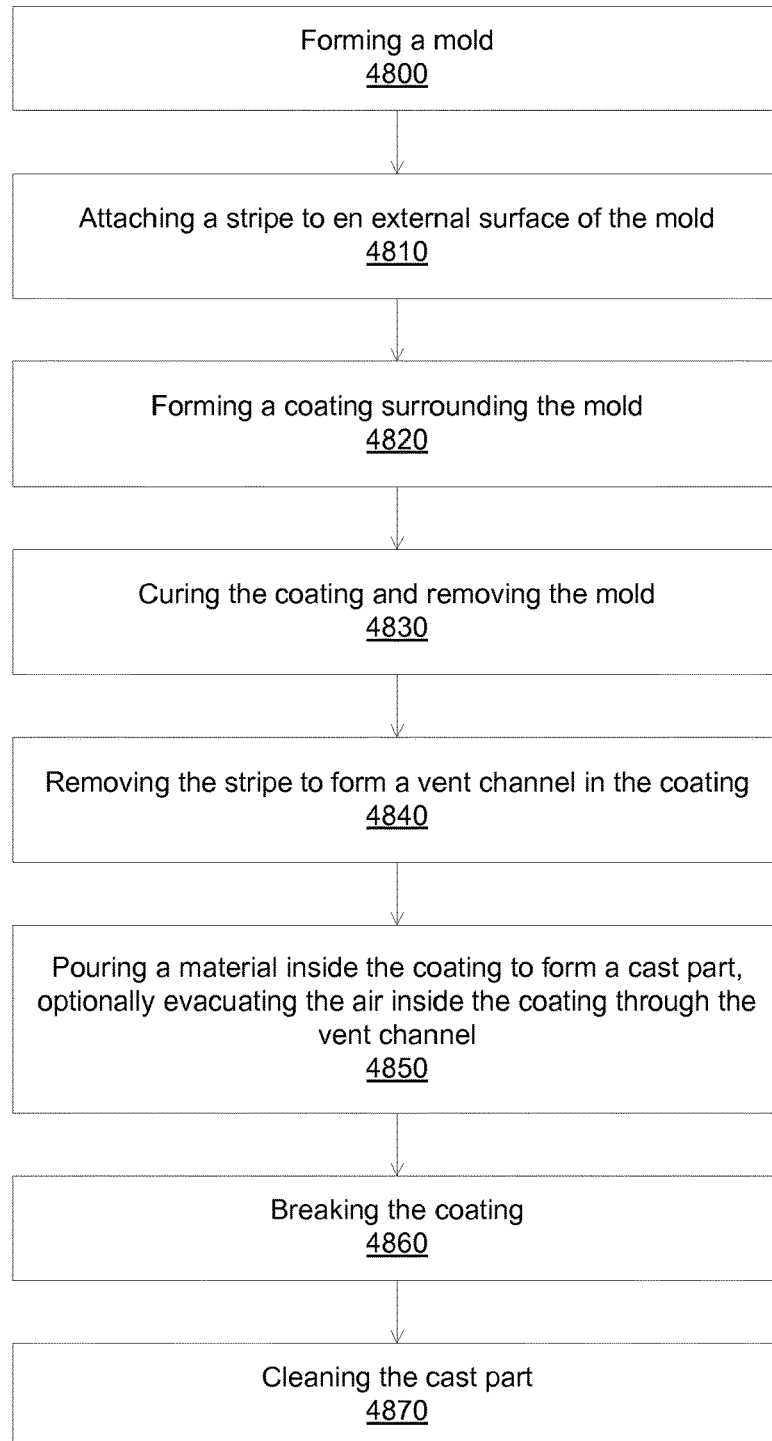
FIG. 48 illustrates a flow chart for a casting process according to some embodiments.

FIG. 48 illustrates a flow chart for a casting process according to some embodiments. Operation 4800 forms a mold, together with a sprue and a funnel. Operation 4810 attaches one or more stripes to the mold. The stripes can be attached to protrusion portions of the mold, e.g., portions of the mold that air is likely to be trapped to form bubbles when casting. For example, a thin stripe made of metal can be pressed against an external surface of the mold. The stripe can be embedded inside the mold, with a portion protruded from the external surface. The stripe can be a straight piece of material, or can be a wavy piece of material. Operation 4820 forms a coating surrounding the mold. Operation 4830 cures the coating and removing the mold. For example, the mold can be made of low melting temperature materials, and the curing process at high temperature can melt and evaporate the mold material. Operation 4840 removes the stripes to form vent channels in the coating. Operation 4850 pours a material inside the coating to form a cast part. The vent channels can assist in evacuating air while preventing the cast material from leaving. Operation 4860 breaks the coating. Operation 4870 cleans the cast part, such as removing the sprue and the funnel.

In some embodiments, the present invention discloses methods for casting an object using a 3D printed mold. The mold can have features that are not printable, such as an overhang structure that extends beyond the capability of the 3D printer. Thus the mold is first partitioned into multiple portions, with each portion printable. For example, each of the partitioned multiple portions does not have a non-printable overhang structure to allow it to be printed without any support structure. Each of the partitioned multiple portions can be configured to be printed without a support structure coupled to an external surface. The support structure is typically sacrificial structure that is printed, for example, to provide support and thus allowing printing the non-printable overhang structure. The support structure is then removed after the printing is complete. Thus, by partitioning the mold into multiple portions so that the support structure can be avoided, the object can be 3D printed without any support structure.

The portions can be assembled to form a complete mold, and a final object can be cast from the assembled complete mold. Since the 3D printed object is to used as a mold, the seams between the multiple portions when assembled does not have a significant effect on the cast object.

In some embodiments, the multiple portions can include solid components to assemble the printed object having a solid interior. Alternatively, the multiple portions can include shell components to assemble the printed object having a hollow interior. The multiple portions can include both solid and shell components.

In case of shell components, the materials at connection portions can be thicker, for example, materials can be added to the shell components to achieve a thicker wall at a connection portion with other shell components. The thicker wall can be configured to improve or to add matching mating components between two adjacent shell components.

In case of shell components, materials can be added to the shell components, for example, to increase structural integrity. The materials can be selected to not interfere with the subsequent casting process. For example, the materials can be selected to have low melting temperatures, for example, so that the material can be vaporized during an annealing process of the casting process. The materials can include wax, or low temperature plastic, such as PLA or ABS. The materials can be added, e.g., filing the hollow interior of a shell component of the multiple portions. The materials can include a paste and/or liquid material, which can be solidified at a low temperature.

Two adjacent portions of the multiple portions can each include a mating component, for example, to allow proper alignment between the two adjacent portions using the matching mating components. The mating components can include a ridge or a pin/hole component. For example, one portion can have a pin and another portion can have a matched hole, so that during assembling the two portions, the pin can be mated with the hole, allowing proper alignment of these portions. Similarly, one portion can have a recess ridge and another portion can have a protruded ridge, that can be mated together.

In some embodiments, the methods can include preparing a model so that the model can be printed without support structure. For example, the model can be rotated to allow printing without non-printable overhang structures. The model can be partitioned into multiple portions to reduce or eliminate a non-printable overhang structure. For example, the model can have a non-printable overhang structure. The model is then partitioned into a first portion and a second portion. The partition is selected so that the first portion does not have a non-printable overhang structure. In some cases, the second portion also does not have a non-printable overhang structure. Thus, the two portions can be printed without any support structures, and then can be assembled to form the model for casting.

In some cases, the second portion have a non-printable overhang structure, however, the partition is also selected so that the non-printable overhang structure of the second portion can be eliminated. For example, the second portion can be rotated so that the non-printable overhang structure is eliminated. Alternatively, a second partition can be performed on the second portion. The second portion can be partitioned to form a third portion and a fourth portion. The second partition can be selected so that the third portion does not have a non-printable overhang structure. The second partition can also be selected so that the non-printable overhang structure of the fourth portion can be eliminated, either by a rotating or translating process, or by another partition. The partition process can be continued until the non-printable overhang structure is eliminated.

In some embodiments, the partition process can be optimized. For example, there can be multiple ways to partitioning a model or a portion. The partition process, e.g., the cut to separating the model into more than one portions, can be selected so minimize the number of portions.

In some embodiments, the partition process can be performed to utilize existing components. For example, the model can be partitioned into multiple portions. One portion of the multiple portions can be a portion that has been available by a non-printing process, such as by a plastic injection molding process. Thus the printing process can be reduced, e.g., the available portion does not have to be printed.

In some embodiments, the surface of the 3D printed object can be treated, for example, to achieve a desired finish. For example, the surface can be smoothed, such as by exposing the surface to an acetone vapor, applying talc powder to the surface, or applying a coating to the surface.

In some embodiments, stripe structures can be provided to the printed object, for example, to form vent lines in a mold formed by the printed object. A dimension of the vent line can be less than 0.3 mm, such as between 0.02 and 0.3 mm, to allow air to escape while preventing the cast material to escape. The vent lines can assist in eliminating trapped air during the casting process.

In some embodiments, an iterative casting process can be performed. The cast object can be measured, for example, at a critical dimension. If the dimension does not meet a specification, a parameter can be changed in the model, and then the process can be repeated. For example, if the cast object is smaller than a desired size, for example, due to the shrinkage of materials from the high temperature casting process, the model can be enlarged, and a new object is printed with the new size. The new object can then be used as a mold for casting a new object.

In some embodiments, the present invention discloses methods to cast an object, including printing a portion of the object on an existing portion. The composite object can be used as a mold in the casting process. The existing portion can be formed by a previous printing process, by an injection molding process, or by a milling process, or by any other process.

In some embodiments, the present invention discloses methods to cast multiple objects, with each object having a parameter differed from other objects. The multiple objects can be combinatorially designed, for example, with different sizes, including different overall sizes, and different sizes for different portions of the object, together with different surface treatment process. A cast object can be selected from the multiple cast objects that meets a desired objective.

What is claimed is:

1. A method comprising partitioning a model of a first object into multiple discrete portions, wherein the first object comprises a feature that a 3D printing process uses a support structure for printing the feature, wherein the support structure is configured to be coupled to an external surface of the first object, wherein the multiple discrete portions, when assembled, forms the object having the feature; wherein the multiple discrete portions are configured to be printed without needing the support structure; wherein the feature comprises an overhang structure that is not printable without the support structure; changing an orientation of at least one of the multiple discrete portions to a print position that allows printing the feature without the support structure; 3D printing the multiple discrete portions of the first object separately; assembling the 3D printed multiple discrete portions into the first object; casting a second object using the assembled first object as a mold.

2. A method as in claim 1
wherein the multiple portions comprise shell components to assemble the first object having a hollow interior.

3. A method as in claim 1
wherein the multiple portions comprise shell components, wherein the method further comprises
adding materials to connection portions of two adjacent shell components, before assembling the multiple portions, to achieve a thicker wall at the connection portions, wherein the thicker wall is configured to increase a contact surface of the two adjacent shell components.

4. A method as in claim 1
wherein the multiple portions comprise shell components, wherein the method further comprises
filling at least one shell component of the multiple portions with a material, wherein the filling is configured to increase a contact surface with an adjacent shell component.

5. A method as in claim 1
wherein at least two of the multiple portions each comprises a mating component for alignment of the at least two of the multiple portions.

6. A method as in claim 1 further comprising
partitioning the first object into a first portion and a second portion of the multiple portions,
wherein the first portion does not comprise the feature,
wherein the second portion comprise the feature.

7. A method as in claim 6 further comprising
continuing partitioning the second portion to obtain a third portion, wherein the third portion does not comprise the feature,
wherein the remaining portion of the second portion comprise the feature.

8. A method as in claim 6 further comprising
rotating the second portion to a print position that allows printing the feature without the support structure.

9. A method as in claim 1 further comprising
smoothing a surface of the assembled first object,
wherein smoothing the surface comprises exposing the surface to an acetone vapor, applying talc powder to the surface, or applying a coating to the surface.

10. A method as in claim 1 further comprising
adding a stripe to a surface of the assembled first object, wherein the stripe protrudes from the surface, wherein the stripe having at least a dimension less than 0.3 mm for forming a vent structure when casting.

11. A method as in claim 1 further comprising
measuring a dimension of the second object;
changing a parameter of the multiple portions;
repeating 3D printing, assembling, and casting with the changed parameter.

12. A method comprising partitioning a model of a first object into multiple discrete portions, wherein the first object comprises a feature that a 3D printing process uses a support structure for printing the feature, wherein the support structure is configured to be coupled to an external surface of the first object, wherein the multiple discrete portions, when assembled, forms the object having the feature; wherein the multiple discrete portions are configured to be printed without needing the support structure; obtaining a portion of the multiple discrete portions comprising the feature from a non-printing process; bringing the portion of the multiple discrete portions comprising the feature to a 3D printer system; aligning the portion of the multiple discrete portions comprising the feature in the 3D printer system; 3D printing a remainder of the multiple discrete portions onto the portion of the multiple discrete portions comprising the feature to form a composite object; casting a second object using the composite object as a mold.

13. A method as in claim 12
wherein the second object is configured to be printed without a support structure.

14. A method comprising partitioning a model of a first object into multiple portions, wherein the first object comprises a feature that a 3D printing process uses a support structure for printing the feature, wherein the support structure is coupled to an external surface of the first object, wherein the multiple portions, when assembled, forms the first object having the feature, wherein the multiple portions are configured to be printed without printing the support structure; wherein the feature comprises an overhang structure that is not printable without the support structure; changing an orientation of at least one of the multiple portions to a print position that allows printing the feature without the support structure; 3D printing multiple instances of each portion of the multiple portions, wherein at least an instance of at least a portion has a parameter differed from another instance of the at least a portion; assembling the multiple portions of each instance to form multiple first objects, wherein each first object of the multiple first objects has at least a portion different from the corresponding portion of another first object of the multiple first objects; casting multiple second objects using the multiple first objects as molds.

15. A method as in claim 14
wherein the parameter comprises at least one of a size of the first object, and a surface treatment of the first object.

16. A method as in claim 14 further comprising
selecting the parameter so that a third object of the multiple third objects meets a design specification.

* * * * *